US012099385B2

(12) United States Patent
Tsai et al.

(10) Patent No.: US 12,099,385 B2
(45) Date of Patent: Sep. 24, 2024

(54) COOLING APPARATUS

(71) Applicant: COOLER MASTER CO., LTD., Taipei (TW)

(72) Inventors: Shui Fa Tsai, Taipei (TW); Tsung Wei Lin, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 259 days.

(21) Appl. No.: 17/728,639

(22) Filed: Apr. 25, 2022

(65) Prior Publication Data

US 2022/0291727 A1 Sep. 15, 2022

Related U.S. Application Data

(63) Continuation-in-part of application No. 16/530,665, filed on Aug. 2, 2019, now Pat. No. 11,320,874,
(Continued)

(51) Int. Cl.
*H01L 23/473* (2006.01)
*G06F 1/20* (2006.01)

(52) U.S. Cl.
CPC .............. *G06F 1/20* (2013.01); *H01L 23/473* (2013.01); *G06F 2200/201* (2013.01)

(58) Field of Classification Search
CPC .............. H01L 23/473; H05K 7/20272; H05K 7/20254; G06F 1/20; G06F 2200/201
See application file for complete search history.

(56) References Cited

U.S. PATENT DOCUMENTS 4,500,821 A    2/1985   Bitting et al.
5,005,640 A    4/1991   Lapinski et al.
(Continued)

FOREIGN PATENT DOCUMENTS

CN    201165989 Y    12/2008
CN    202914337 A    5/2013
(Continued)

OTHER PUBLICATIONS

Yang et al., Development of a Mini Liquid Cooling System for High-Heat Flux Electronic Devices, Heat Transfer Devices, Heat Transfer Engineering, 2011.
(Continued)

*Primary Examiner* — Eric S Ruppert
(74) *Attorney, Agent, or Firm* — Merchant & Gould P.C.

(57) ABSTRACT

A cooling apparatus includes a base plate configured to dissipate heat, a top plate coupled to the base plate, the top plate includes a second opening positioned above the heat exchange chamber, a cover coupled to the base plate, the cover and the base plate defining a heat exchange chamber, the cover is over the second opening, the cover includes a first opening and a third opening defined adjacent to the first opening, the first opening and the third opening positioned above the heat exchange chamber, the first opening in fluid communication with the heat exchange chamber through the second opening, and a pumping unit disposed on the base plate, the pumping unit is over the first opening and the third opening, the pumping unit configured to circulate fluid into and out of the heat exchange chamber.

20 Claims, 35 Drawing Sheets

Related U.S. Application Data which is a continuation of application No. 15/433,073, filed on Feb. 15, 2017, now Pat. No. 10,409,341.

(60) Provisional application No. 62/295,149, filed on Feb. 15, 2016.

(56) References Cited

U.S. PATENT DOCUMENTS

| | | |
|---|---|---|
| 5,052,472 A | 10/1991 | Takahashi et al. |
| 5,738,496 A | 4/1998 | Mehta |
| 6,054,676 A | 4/2000 | Wall et al. |
| 6,120,262 A | 9/2000 | McDonough et al. |
| 6,167,952 B1 | 1/2001 | Downing |
| 6,213,617 B1 | 4/2001 | Barker |
| 6,966,359 B1 | 11/2005 | Liu |
| 7,007,506 B2 | 3/2006 | Kubo et al. |
| 7,055,581 B1 | 6/2006 | Roy |
| 7,183,939 B1 | 2/2007 | Lo et al. |
| 7,240,722 B2 | 7/2007 | Lai et al. |
| 7,249,625 B2 | 7/2007 | Duan |
| 7,325,591 B2 | 2/2008 | Duan et al. |
| 7,522,422 B2 | 4/2009 | Chiba et al. |
| 8,051,898 B2 | 11/2011 | Chiang |
| 8,240,362 B2 | 8/2012 | Eriksen |
| 8,245,764 B2 | 8/2012 | Eriksen |
| 8,261,813 B2 | 9/2012 | Oikawa |
| 8,746,330 B2 | 6/2014 | Lyon |
| 9,345,169 B1 | 5/2016 | Campbell et al. |
| 9,441,640 B2 | 9/2016 | Park et al. |
| 9,795,058 B2 | 10/2017 | Tsai |
| 2003/0049124 A1 | 3/2003 | Liu |
| 2004/0130874 A1 | 7/2004 | Maveety et al. |
| 2005/0128702 A1 | 6/2005 | Mongia et al. |
| 2005/0241806 A1 | 11/2005 | Liu |
| 2006/0133920 A1 | 6/2006 | Chen |
| 2006/0171801 A1 | 8/2006 | Manabe et al. |
| 2006/0185378 A1 | 8/2006 | Duan et al. |
| 2006/0225867 A1 | 10/2006 | Park et al. |
| 2006/0262502 A1 | 11/2006 | Chang et al. |
| 2007/0076374 A1 | 4/2007 | Mongia et al. |
| 2007/0258216 A1 | 11/2007 | McBain et al. |
| 2008/0029260 A1 | 2/2008 | Hu et al. |
| 2009/0101316 A1 | 4/2009 | Han et al. |
| 2009/0122572 A1 | 5/2009 | Page et al. |
| 2009/0159244 A1 | 6/2009 | Mounioloux |
| 2009/0284921 A1 | 11/2009 | Colgan et al. |
| 2011/0100585 A1 | 5/2011 | Hohenstein et al. |
| 2012/0152495 A1 | 6/2012 | Tan |
| 2012/0152498 A1 | 6/2012 | Lyon |
| 2012/0175094 A1 | 7/2012 | Rice |
| 2013/0008628 A1 | 1/2013 | Tiengtum et al. |
| 2013/0051108 A1 | 2/2013 | Nagao et al. |
| 2013/0206375 A1 | 8/2013 | Yoshida |
| 2014/0190665 A1 | 7/2014 | Joshi et al. |
| 2014/0262177 A1 | 9/2014 | Tang et al. |
| 2014/0334921 A1 | 11/2014 | Park et al. |
| 2015/0021756 A1 | 1/2015 | Adachi |
| 2016/0234967 A1 | 8/2016 | Choi et al. |
| 2016/0309618 A1 | 10/2016 | Tsai et al. |
| 2016/0338223 A1 | 11/2016 | Tsai et al. |
| 2016/0363967 A1 | 12/2016 | Tsai |
| 2017/0045300 A1 | 2/2017 | Boday et al. |
| 2017/0045306 A1 | 2/2017 | Tsai |
| 2017/0045307 A1 | 2/2017 | Tsai |
| 2017/0092565 A1 | 3/2017 | Chen et al. |
| 2017/0118870 A1 | 4/2017 | Yin et al. |
| 2017/0192471 A1 | 7/2017 | Tsai et al. |
| 2017/0235350 A1 | 8/2017 | Tsai |
| 2018/0139865 A1 | 5/2018 | Draht et al. |
| 2018/0163960 A1 | 6/2018 | Lin |
| 2018/0213677 A1 | 7/2018 | Wu et al. |
| 2018/0259267 A1 | 9/2018 | Tsai et al. |
| 2018/0332734 A1 | 11/2018 | Bandorawalla et al. |
| 2018/0340744 A1 | 11/2018 | Tsai et al. |

FOREIGN PATENT DOCUMENTS

| | | |
|---|---|---|
| CN | 103133372 A | 6/2013 |
| DE | 102011121064 A1 | 6/2013 |
| JP | S61-018159 A | 1/1986 |
| JP | 2006127445 A | 5/2006 |
| KR | 10-0529825 B1 | 11/2005 |
| TW | M278938 U | 10/2005 |
| TW | M311234 U | 5/2007 |
| TW | M325534 U | 1/2008 |
| TW | M508705 * | 9/2015 |
| TW | M522274 U | 5/2016 |

OTHER PUBLICATIONS

Chien-Yuh Yang et al., "An In-situ Performance Test of Liquid Cooling for a Server Computer System", downloaded Oct. 11, 2020 from IEEE Xplore.

Chinese Patent Application No. 201611132425.3 filed Dec. 9, 2016 with English translation.

Chinese Patent Application CN 201511023351.5 filed Dec. 30, 2015 with English translation.

* cited by examiner

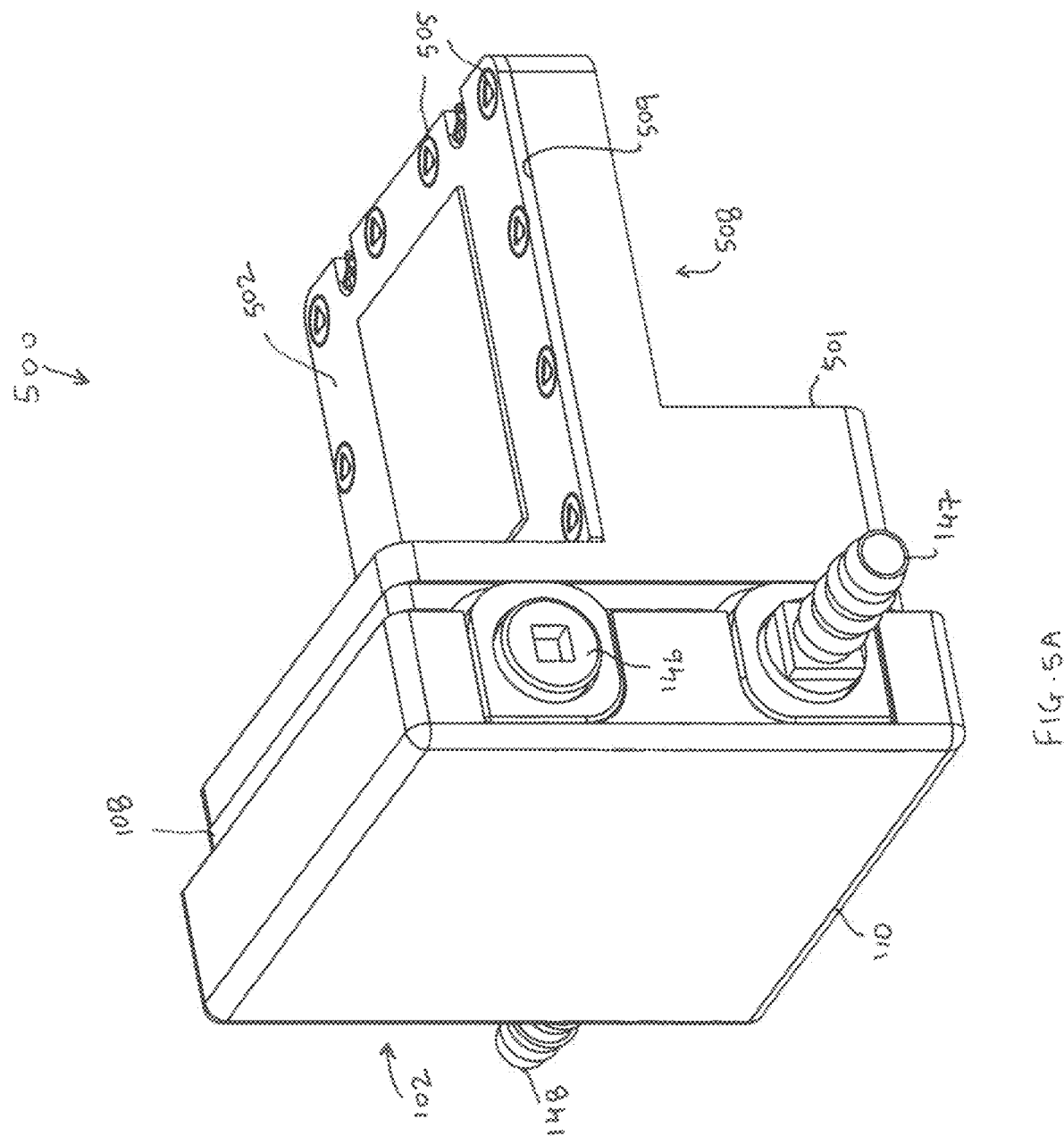

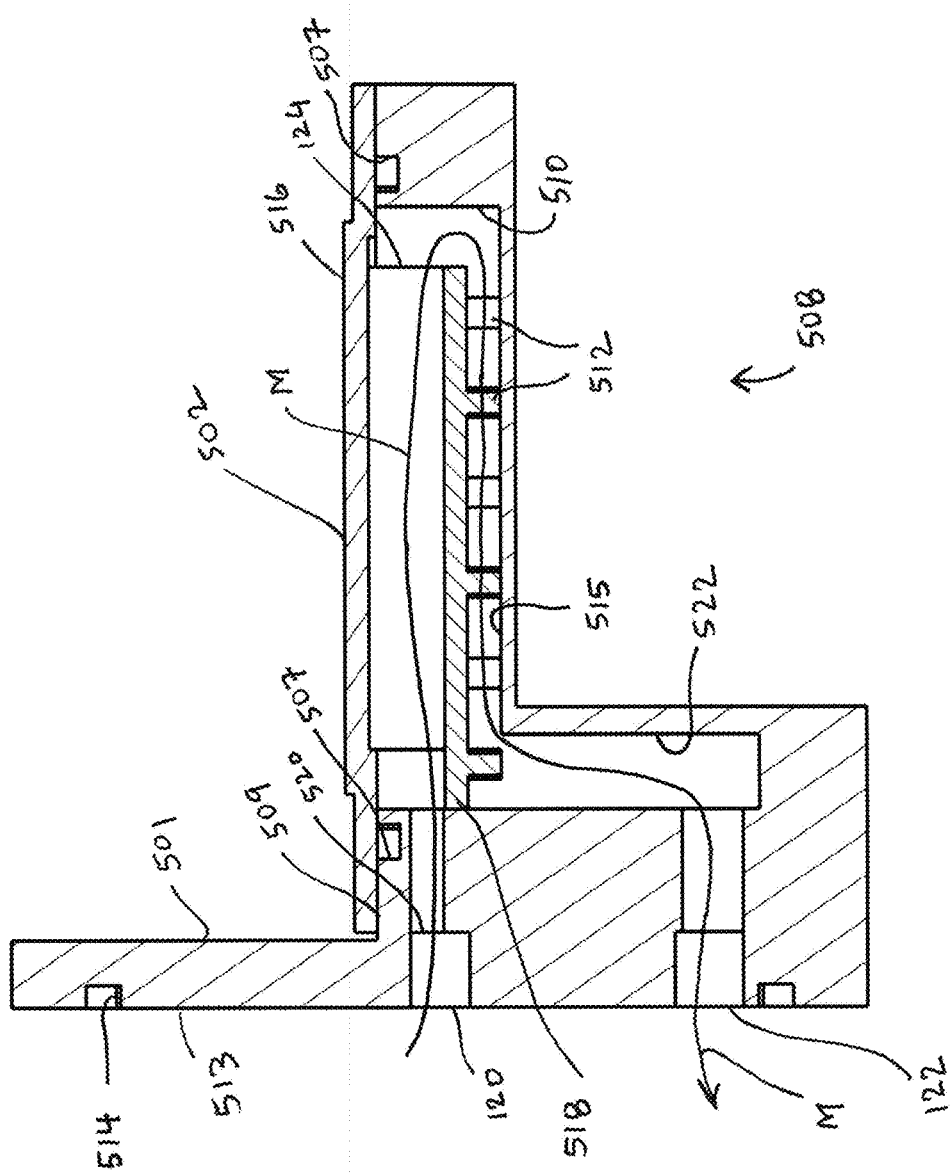

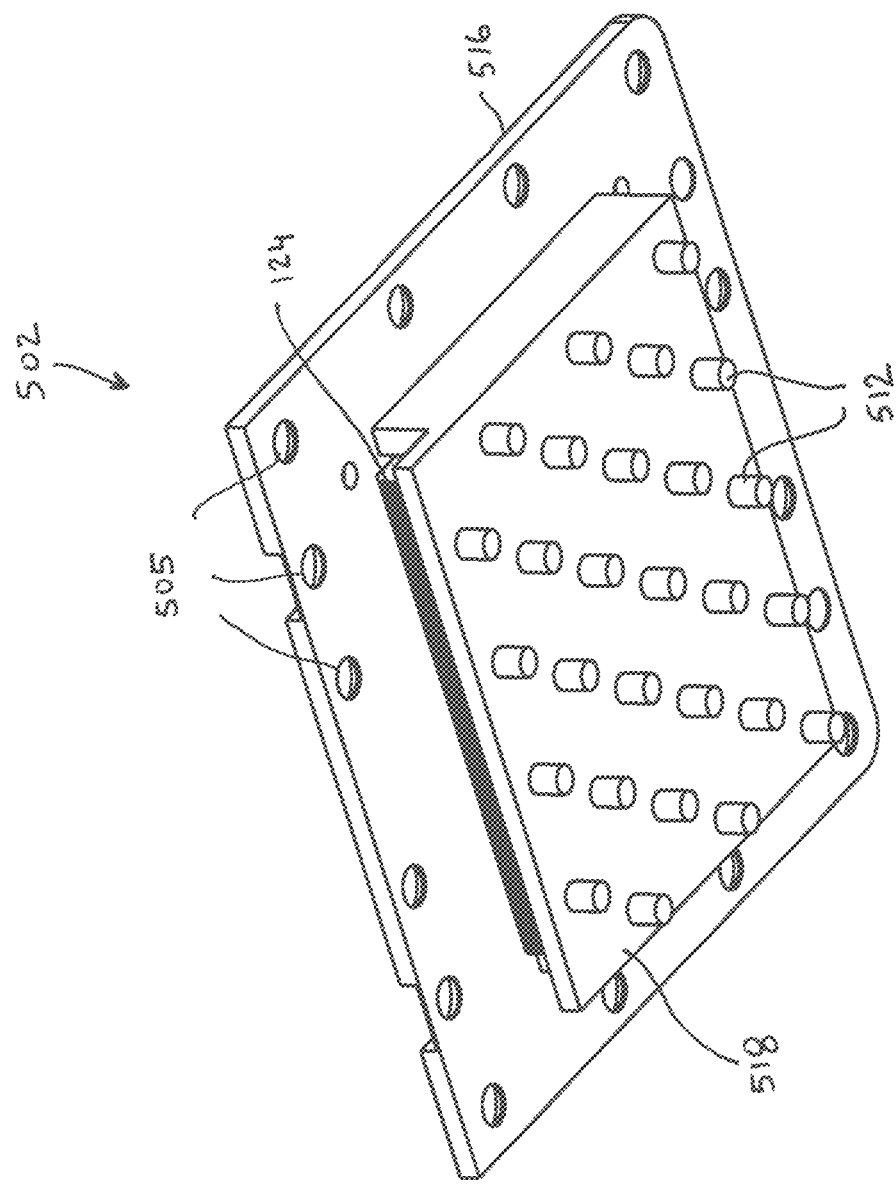

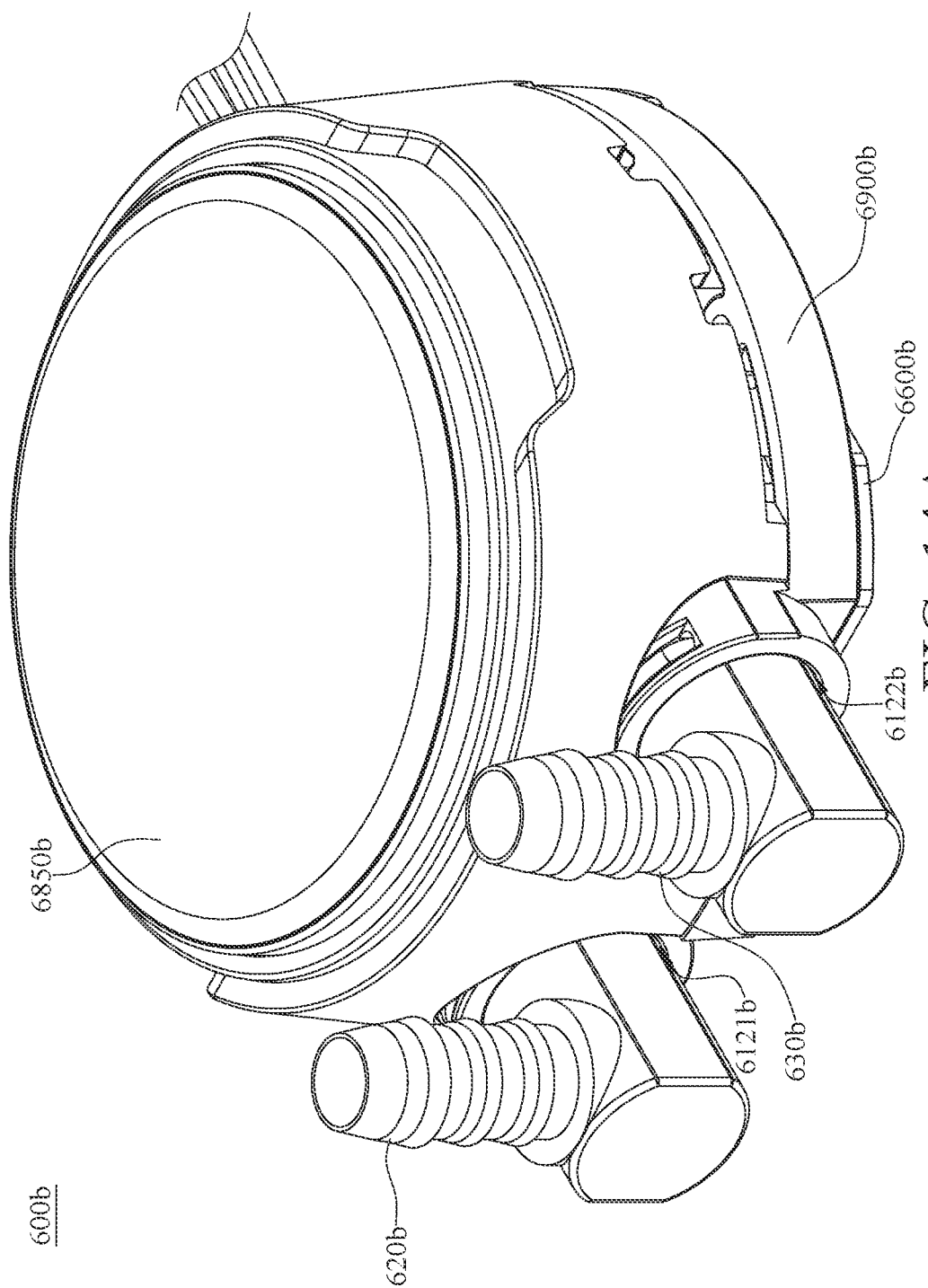

COOLING APPARATUS

CROSS-REFERENCE TO RELATED APPLICATIONS

This application is a continuation-in-part of and claims priority under 35 U.S.C. § 120 to U.S. application Ser. No. 16/530,665 (now U.S. Pat. No. 11,320,874), filed Aug. 2, 2019, which is a continuation of and claims priority under 35 U.S.C. § 120 to U.S. application Ser. No. 15/433,073 (now U.S. Pat. No. 10,409,341), filed Feb. 15, 2017, which claims the benefit of priority under 35 U.S.C. § 119 to U.S. Provisional Application No. 62/295,149, filed Feb. 15, 2016. This application also claims priority under 35 U.S.C. § 119 to Taiwanese Application 110117102 filed May 12, 2021, in the Taiwan Intellectual Property Office. The contents of all these applications are hereby incorporated by reference in their entirety.

BACKGROUND

Field

Example embodiments relate to heat dissipation using fluid and, more particularly, to cooling apparatuses using a circulating cooling fluid that dissipates heat generated by processing units (e.g., CPUs, GPUs, etc.) used in a computer.

Description of Related Art

With the increase of the processing speed and performance of electronic components, such as central processing units (CPU), the amount of heat generated during operation of the electronic component increases. The heat generation increases the temperature of the electronic component and, if the heat cannot be dissipated effectively, reliability and performance of the electronic component are reduced. To prevent overheating of an electronic component, typically, a water cooling apparatus is used for cooling the electronic component and, thereby maintaining normal operation of the electronic component.

Existing fluid cooling apparatuses typically include a base plate of a heat exchange chamber attached to a CPU, and the heat exchange chamber is fluidly connected to a fluid circulating pump. The pump circulates the fluid inside the heat exchange chamber in order to deliver the fluid at lower temperature to the heat exchange chamber. As the fluid circulates in the heat exchange chamber, thermal energy is exchanged between the base plate and the fluid and, as a result, the temperature of the base plate is reduced and the temperature of the fluid increases. However, the existing heat exchange chambers are often of complicated structures and this causes a reduction in the heat transfer efficiency.

Also, existing fluid cooling apparatuses cannot dissipate heat from more than one electronic component at a time, and they occupy a relatively large space.

SUMMARY

Various aspects of the present disclosure provide a cooling apparatus for dissipating heat generated by electronic components.

According to one aspect of the present disclosure, the cooling apparatus includes a base plate configured to dissipate heat and including two heat exchange units and a cover coupled to the base plate and enclosing the two heat exchange units. At least one recess is defined in the base plate and between the two heat exchange units. The cover and the base plate define therebetween a heat exchange chamber that includes the two heat exchange units. The cover has a first set of openings and a second set of openings, and is coupled to the base plate such that the first set of openings is above a first heat exchange unit and the second set of openings is above a second heat exchange unit. The cooling apparatus further includes a first pumping unit disposed on the cover and over the first set of openings and a second pumping unit disposed on the cover and over the second set of openings. Each of the first and second pumping units circulates fluid into and out of the heat exchange chamber.

According to another aspect of the present disclosure, the cooling apparatus includes a cooling unit including a body having a vertical surface and a horizontal surface perpendicular to the vertical surface. The vertical surface of the body has first and second openings, and the horizontal surface has a cavity in fluid communication with the first and second openings. The cooling apparatus further includes a heat sink device disposed in the cavity and a pumping unit coupled to the cooling unit via the vertical surface and configured to circulate fluid into and out of the cooling unit.

According to another aspect of the present disclosure, a method of operating a cooling apparatus includes receiving fluid into a first pumping unit and a second pumping unit via corresponding inlets of the first pumping unit and the second pumping unit. Each pumping unit is disposed on a cover coupled to a base plate, the base plate includes two heat exchange units and contains at least one recess between the two heat exchange units, the cover is coupled to the base plate, and a heat exchange chamber is defined between the cover and the base plate and includes the two heat exchange units. The cover contains a first set of openings and a second set of openings, and is coupled to the base plate such that the first set of openings is above a first heat exchange unit and the second set of openings is above a second heat exchange unit. A first pumping unit is disposed over the first set of openings and a second pumping unit is disposed over the second set of openings. The method further includes transferring the fluid into the heat exchange chamber via the first and second sets of openings, transferring the fluid into the first pumping unit and the second pumping unit, and outputting the fluid from the first pumping unit and the second pumping unit via corresponding outlets of the first pumping unit and the second pumping unit.

According to one aspect of the present disclosure, the cooling apparatus includes a cooling unit having a base plate configured to dissipate heat and including at least one heat exchange unit, and a cover coupled to the base plate and enclosing the at least one heat exchange unit. The cover has a first surface that is substantially flat and includes a first opening and a second opening. The cooling apparatus also includes a pumping unit coupled to the cooling unit and over the first and second openings. The pumping unit includes a second surface that is substantially flat and contains a third opening and a fourth opening, the pumping unit is coupled to the cooling unit via the second surface and the first surface of the cover such that the third opening is in fluid communication with the first opening and the fourth opening is in fluid communication with the second opening, and the pumping unit is configured to output a low temperature fluid to the cooling unit and receive a high temperature fluid from the cooling unit. The cooling apparatus further includes a sealing element is disposed between the cooling unit and the pumping unit, and the sealing element surrounds the first, second, third, and fourth openings.

BRIEF DESCRIPTION OF THE DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

FIG. 5A is a perspective view of still another embodiment of a cooling apparatus.

FIG. 5D is a cross-sectional view of the cooling apparatus of FIG. 5B taken along the line 5D-5D.

FIGS. 5F and 5G are top and bottom perspective views illustrating features of the heat sink device of the cooling apparatus of FIGS. 5A-5E, according to disclosed embodiments.

FIG. 14A is a perspective view of another cooling apparatus, according to disclosed embodiments.

DETAILED DESCRIPTION

Embodiments described herein are directed to a cooling apparatus that can dissipate heat generated from multiple heat generating sources and thereby increase heat transfer efficiency. Embodiments disclosed are also directed to a cooling apparatus that occupies a reduced space compared to prior art cooling apparatuses.

Figure 1A:
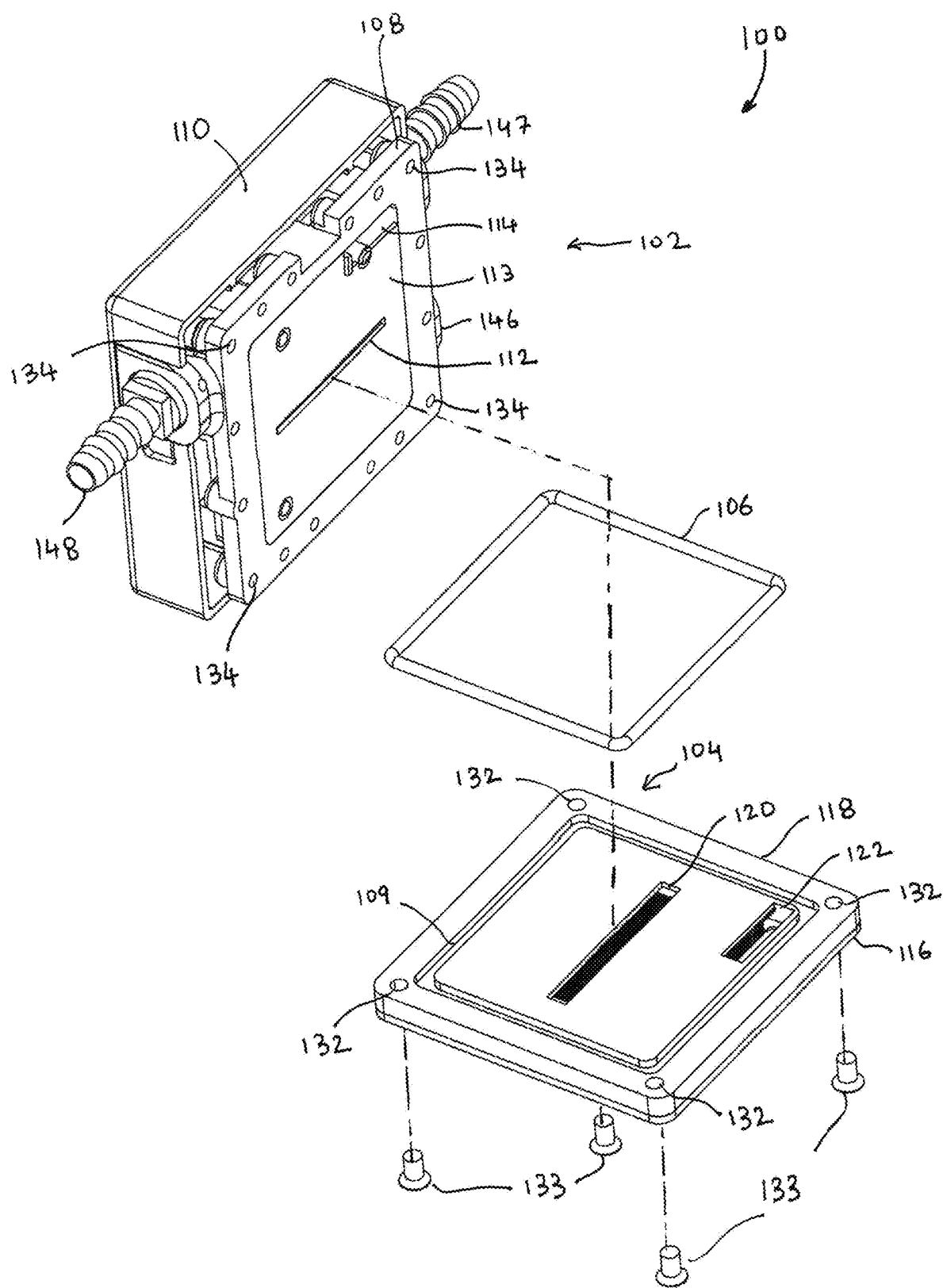
FIG. 1A illustrates an exploded view of a cooling apparatus, according to disclosed embodiments.

FIG. 1A is an exploded view of a cooling apparatus 100, according to embodiments disclosed herein. As illustrated, the cooling apparatus 100 includes a pumping unit 102 that is disposed on a cooling unit 104. The pumping unit 102 includes a pump housing 108 and a casing 110 sized or otherwise configured to receive the pump housing 108 therein. Although not explicitly illustrated, a pump for circulating fluid between the pumping unit 102 and the cooling unit 104 may be disposed in the pump housing 108. The operating speed of the pumping unit 102 may be based on or otherwise related to the rotational speed of the pump. The pump housing 108 includes inlets 146 and 148 via which the fluid enters the pumping unit 102 and an outlet 147 via which the fluid exits the pumping unit 102. In an embodiment, the inlets 146, 148 can be used selectively, and any unused inlet may be plugged. For instance, in FIG. 1A, the inlet 146 is plugged.

The fluid may be circulated between the pumping unit 102 and the cooling unit 104 via a first opening 112 and a second opening 114 defined in the pump housing 108. Briefly, during operation, fluid may enter the pumping unit 102 via the inlets 146 and/or 148 and then flow into the cooling unit 104 via the first opening 112. The fluid may then enter the pumping unit 102 via the second opening 114 and exit the pumping unit 102 via the outlet 147. The first and second openings 112 and 114 are not limited to having any particular shape, and the first and second openings 112 and 114 may be elongated slots, square, circular, polygonal, or of any desired shape, and may have any desired size, without departing from the scope of the disclosure.

The cooling unit 104 may include a base plate 116 and a cover 118 that is sized or otherwise configured to receive the base plate 116. As illustrated, the cover 118 defines a first opening 120 and a second opening 122. The first and second openings 120 and 122 may correspond to the openings 112 and 114 defined in the pump housing 108. In order to provide efficient fluid transfer between the pumping unit 102 and the cooling unit 104, the first and second openings 120 and 122 may have the same shape and size as the openings 112 and 114 defined in the pump housing 108. Further, the opening 120 and 122 may be sized and shaped such that the opening 112 coincides with the opening 120, and the opening 114 coincides with the opening 122 when the pumping unit 102 is positioned on the cooling unit 104.

Thus, as illustrated, the first and second openings 120 and 122 may be shaped as elongated slots extending parallel to each other in the top plate 11, and the first opening 120 may be longer than the second opening 122. However, the openings 120 and 122 may be square, circular, polygonal, or of any shape and size as the openings 112 and 114, without departing from the scope of the disclosure.

A sealing element 106 (e.g., a gasket, an O-ring, a washer, and the like) may be disposed at an interface between the pumping unit 102 and the cooling unit 104 to prevent fluid that flows between the pumping unit 102 and the cooling unit 104 from leaking out of the cooling apparatus 100.

Figure 1B:
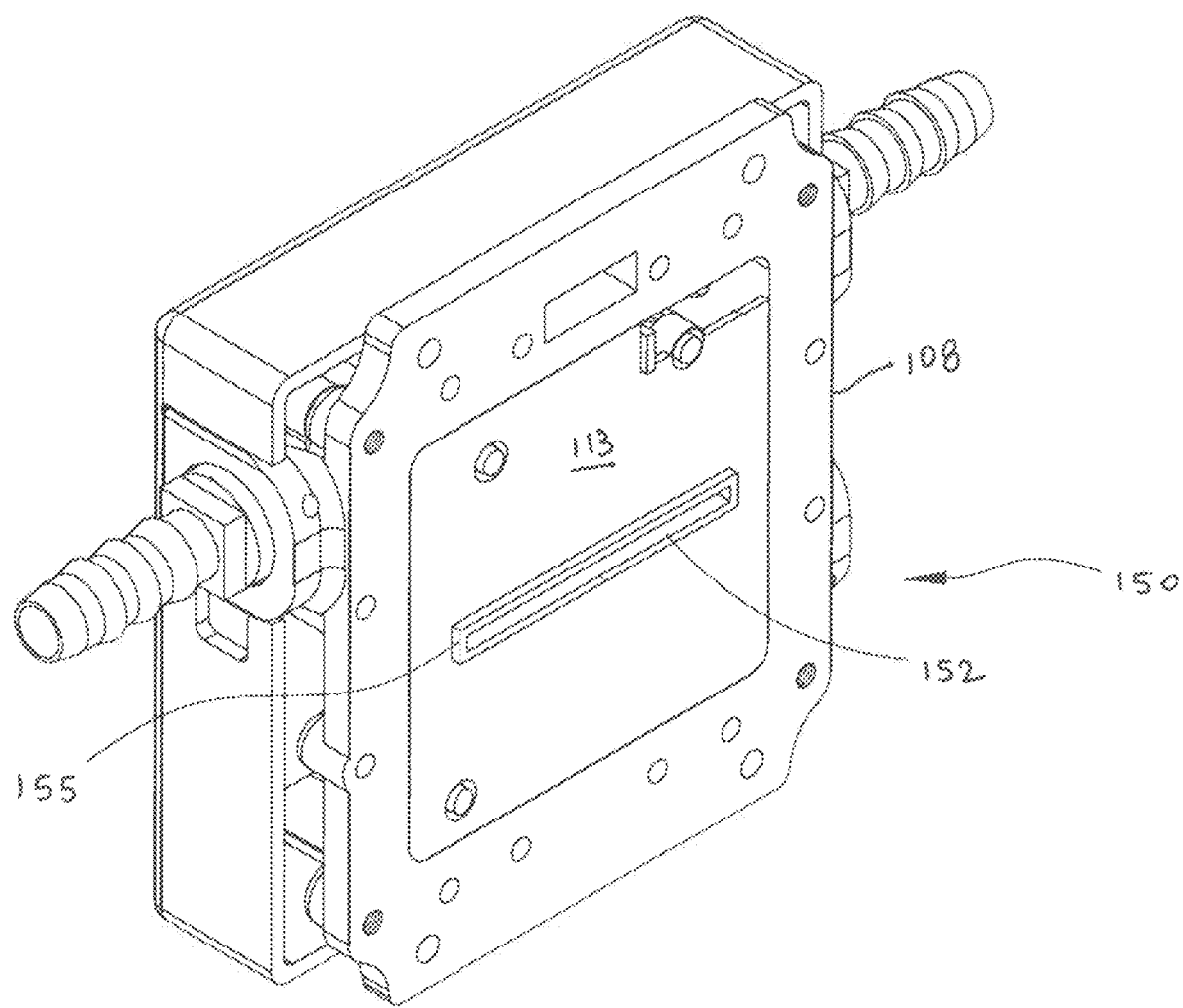
FIG. 1B illustrates a prior art pumping unit having a flange at an opening therein.

FIG. 1B illustrates a prior art pumping unit 150 having a flange 155 at the opening 152. The pumping unit 150 may be installed in the cooling unit 104 (FIG. 1A) and the flange 155 may guide the fluid from the pumping unit 150 into the cooling unit 104 via the opening 120. The flange 155 may be shaped and sized to fit into the opening 120 when the pumping unit 102 is installed on the cooling unit 104. The flange 155 may ensure a correct placement of the pumping unit 102 when installed on the cooling unit, and thereby minimize leakage. However, due to the presence of the flange 155, it is not possible to use the pumping unit 150 with other cooling units having openings that are not sized or otherwise configured to receive the flange 155. This limits the use of the pumping unit 150. The pumping unit 102, according to embodiments disclosed herein, does not include the flange and thus may be used with a variety of cooling units. Because the flange is absent, the bottom surface 113 of the pump housing 108 may be considered to be substantially flat or planar. Specifically, the bottom surface 113 may be substantially flat between the openings 112 and 114, and between the openings 112 and 114 and the peripheral edges of the housing 108.

Figure 2A:
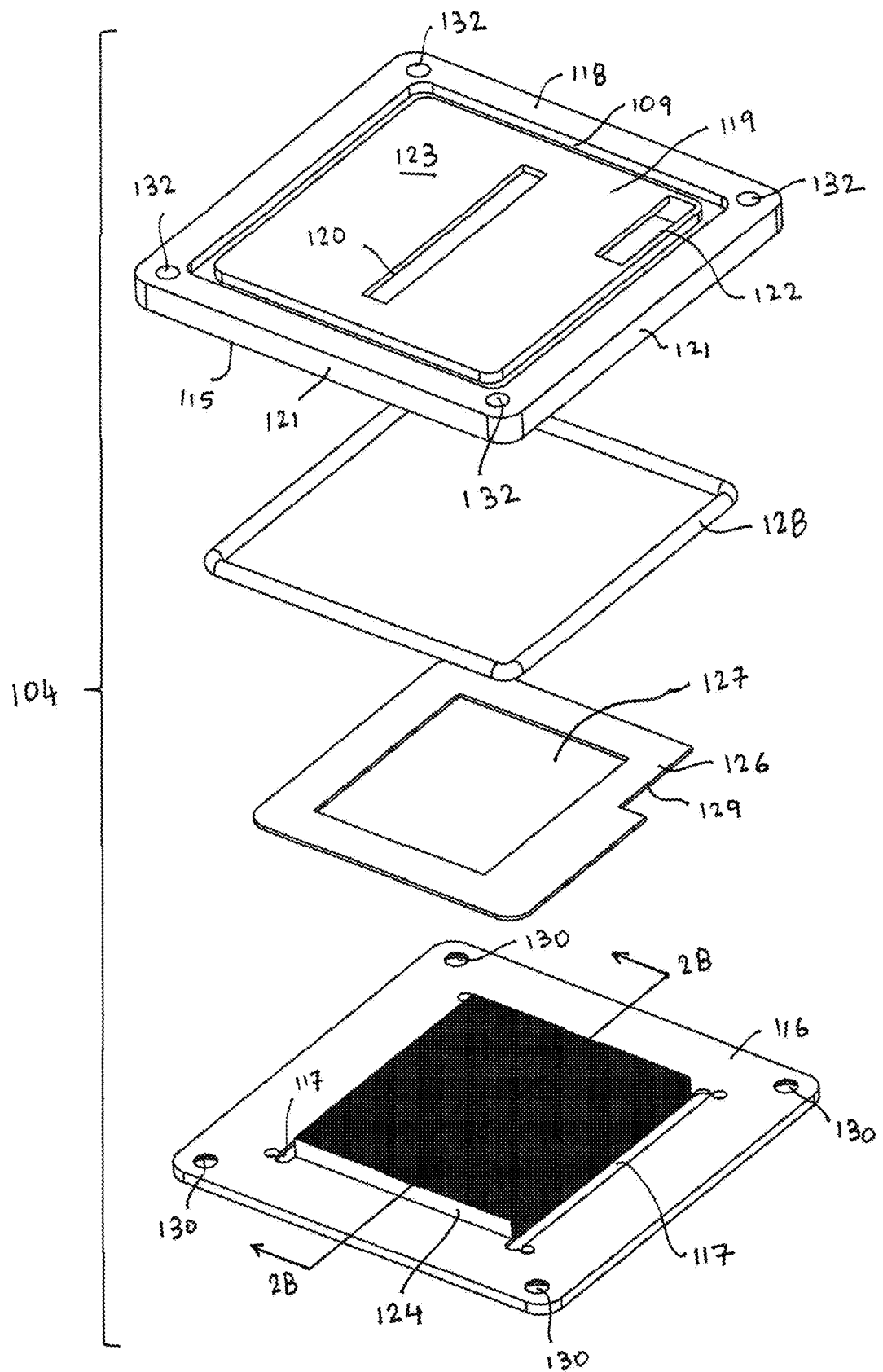
FIG. 2A illustrates an exploded view of the cooling unit of FIG. 1A, according to disclosed embodiments.

FIG. 2A illustrates an exploded view of the cooling unit 104, according to embodiments disclosed herein. As illustrated, the cover 118 includes a top plate 119 having peripheral sidewalls 121 disposed at an edge thereof. The top plate 119 may be generally rectangular or square in shape and the sidewalls 121 may be disposed along the entire periphery of the top plate 119. The top plate 119 and the sidewalls 121 together define or otherwise enclose a space 115. As illustrated, the openings 120 and 122 may be formed in a top surface 123 of the top plate 119 and the openings 120 and 122 are in fluid communication with the space 115. The top surface 123 may also be substantially flat between the openings 120 and 122, and between the openings 120 and 122 and the peripheral sidewalls 121. Referring to FIGS. 1A and 2A, the pumping unit 102 and the cooling unit 104 are coupled to each other via two substantially flat surfaces 113 and 123, and the sealing element 106 disposed therebetween and surrounding the openings 112, 114, 120, and 122. More specifically, the sealing element 106 may be disposed in a recess 109 defined in the surface 123. When the pumping unit 102 and the cooling unit 104 are coupled to each other, the openings 112 and 120 are in fluid communication with each other and the openings 114 and 122 are in fluid communication with each other. In an example, when the pumping unit 102 and the cooling unit 104 are coupled to each other, the openings 112 and 120 (or more specifically, the edges thereof) coincide with each other and the openings 114 and 122 (or more specifically, the edges thereof) coincide with each other.

The base plate 116 may include a heat exchange unit disposed on a side of the base plate 116. In an embodiment and as illustrated, the heat exchange unit may be or include an array of a plurality of fins 124. However, in other embodiments, the heat exchange unit may be or include pins, columns, or any other structure of a desired shape and size for dissipating heat, without departing from the scope of the disclosure. Although not illustrated, an electronic component from which heat is to be dissipated is coupled to a side of the base plate 116 opposite the side including the heat exchange unit. The base plate 116 (or at least a portion thereof) includes a thermally conductive material, such as a metal including copper, aluminum etc., or non-metal thermally conductive material, such as graphite etc. The fins 124 (or at least a portion thereof) may also include a thermal conductive material. In an embodiment, the fins 124 and the base plate 116 may be integrally formed as a single piece. In another embodiment, the fins 124 may be coupled to the base plate 116 using known techniques.

Figure 2B:
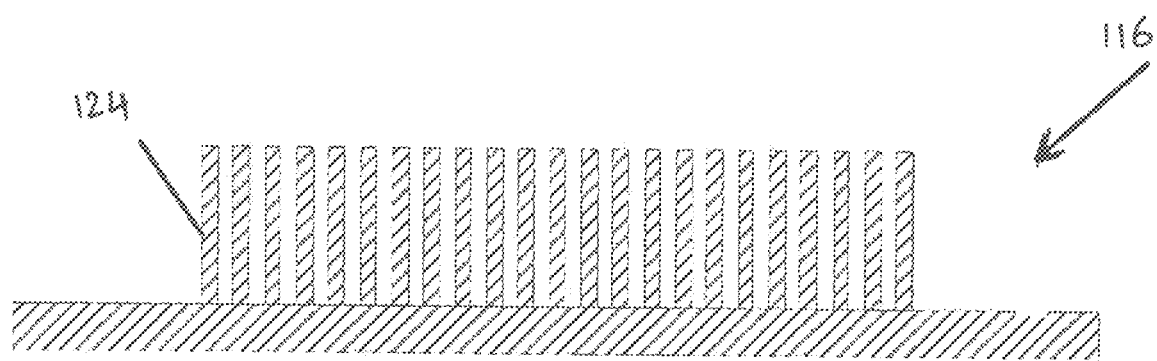
FIG. 2B illustrates a cross-sectional view of the base plate of FIG. 2A taken along the line 2B-2B, according to disclosed embodiments.

Referring briefly to FIG. 2B, illustrated is a cross-sectional view of the base plate 116 taken along the line 2B-2B, according to embodiments disclosed herein. As illustrated, the fins 124 extend transversely on the base plate 116 along the length (or width) thereof, and are arranged parallel to each other and perpendicular to the base plate 116. However, in other embodiments, some or all of the fins 124 may be non-parallel to each other and may be arranged on the base plate 116 at an angle less than 90°. The array of fins 124 may occupy a generally central portion of the base plate 116.

Returning to FIG. 2A, the base plate 116 may define recesses 117 adjacent and in fluid communication with the array of fins 124 and on opposite sides thereof. As illustrated, the recesses 117 may extend perpendicular to the fins 124. The recesses 117 may collect and/or guide the fluid along the array of fins 124.

The cooling unit 104 may also include a pad 126 that may be positioned on the base plate 116. The pad 126 may be positioned on the base plate 116 between the fins 124 and the cover 118 (or more specifically, the sidewalls 121 of the cover 118) when the cover 118 is installed on the base plate 116. The pad 126 defines a through hole 127 located centrally in the pad 126 and a notch 129 on a side of the pad 126. The through hole 127 is sized to receive the plurality of fins 124, and the notch 129 prevents the pad 126 from obstructing the second opening 122 of the cover 118 when the cover is installed on the base plate 116. The pad 126 may occupy the space between the cover 118 and the fins 124 and may prevent leakage of fluid.

The cooling unit 104 may also include a sealing element 128, such as a gasket, O-ring, washer, and the like. When the cooling unit is assembled, the sealing element 128 may be positioned around the pad 126 and between the pad 126 and the cover 118 to further prevent leakage of fluid.

When the cooling unit 104 is assembled by positioning the cover 118 on the base plate 116, the array of fins 124, the pad 126, and the sealing element 128 are received in the space 115. The top plate 119, the sidewalls 121, and the base plate 116 cooperatively define a heat exchange chamber. The cover 118 may be welded to the base plate 116 to secure the cover 118 to the base plate 116. The welding is not limited to any specific type of welding and the cover 118 may be welded to the base plate 116 using any suitable type of welding, without departing from the scope of the disclosure.

Other fastening techniques, such as riveting, screwing, press-fitting, and the like, fasteners, such as rivets, screws, nuts, bolts, etc., may be used to secure the cover 118 to the base plate 116.

The base plate 116 may be positioned on the cover 118 such that the first opening 120 is positioned over the fins 124 (or any other heat exchange unit used). Referring to FIGS. 1A and 2A, the base plate 116 may be positioned such that the fins 124 extend in a direction perpendicular to the direction in which the first opening 120 and the second opening 122 extend. Stated otherwise, the fins 124 extend in a direction from the first opening 120 to the second opening 122. The base plate 116 is attached to an electronic component (e.g., a central processing unit (CPU)) from which heat is to be dissipated. Specifically, and as mentioned above, the electronic component from which heat is to be dissipated is attached to the bottom surface (e.g., the surface of the base plate 116 opposite to the surface having the fin 124) using a thermally conductive material (e.g., thermal grease) in order to transfer the heat generated from the electronic component to the base plate 116.

The base plate 116 and the cover 118 may define installation holes 130 and 132, respectively, at the corners thereof. Referring to FIG. 1A, installation holes 134 may also be defined in the pump housing 108. The installation holes 130, 132, and 134 may receive fasteners, such as rivets, screws, nuts, bolts, etc. to secure the pumping unit 102 to the cooling unit 104. In an example, and as illustrated in FIG. 1A, screws 133 are used to secure the pumping unit 102 and the cooling unit 104 together.

Figure 3A:
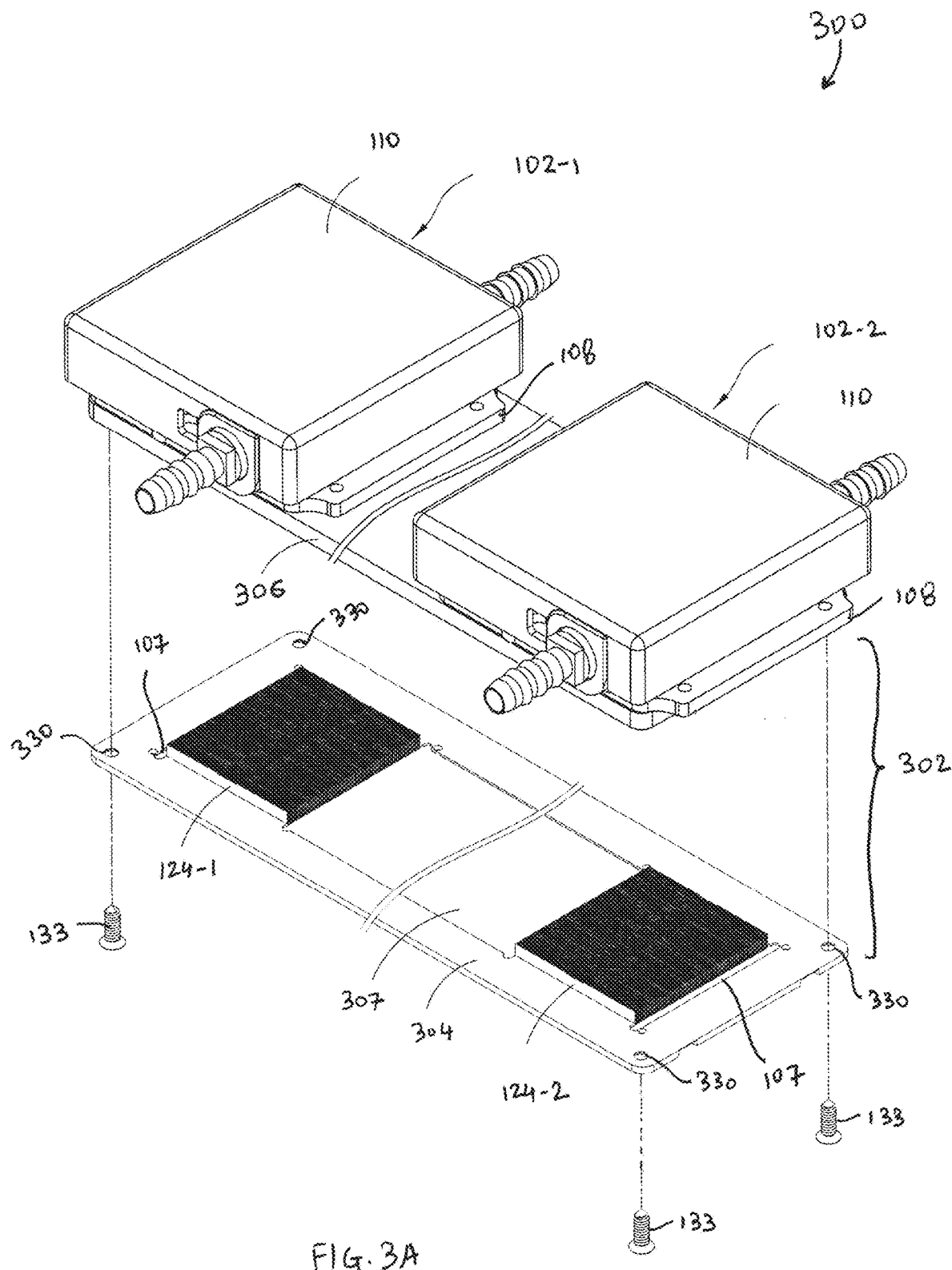
FIG. 3A illustrates a partially exploded view of another embodiment of a disclosed cooling apparatus.

FIG. 3A is a partially exploded view of a cooling apparatus 300, according to embodiments disclosed herein. As illustrated, the cooling apparatus 300 may include two pumping units 102 (labelled as 102-1 and 102-2) of FIG. 1A disposed on a cooling unit 302, shown in exploded view. Although two pumping units 102 are illustrated in FIG. 3A, greater than two pumping units 102 can be included in the cooling apparatus 300, without departing from the scope of the disclosure.

The cooling unit 302 may be similar in some respects to the cooling unit 104 in FIG. 1A, and therefore may be best understood with reference thereto where like numerals designate like components not described again in detail. Unlike the cooling unit 104, the cooling unit 302 may be a generally rectangular structure having the two pumping units 102 disposed on it. In an example, and as illustrated, two pumping unit 102 may be disposed at opposite ends of the cooling unit 302. It will be understood that the cooling unit 302 is not limited to having any particular shape and size, and the cooling unit 302 may have desired shape and size based on, for instance, the application and the number of pumping units 102 disposed on the cooling unit 302, without departing from the scope of the disclosure.

The cooling unit 302 may include a base plate 304 having two arrays of fins 124 (labelled as 124-1 and 124-2) disposed at opposite ends thereof, and a cover 306 that is sized or otherwise configured to receive the base plate 304. The cover 306 may define two sets of openings 120 and 122 (FIG. 1A), each at an end of the cover 306. One set of openings 120 and 122 may be located above the array of fins 124-1 and the other set of openings 120 and 122 may be located above the array of fins 124-2. Each pumping unit 102 may be positioned on the cover 306 and on a set of openings 120 and 122.

Recesses 107 may be at the two opposite ends of the base plate 304 with each recess 107 being in fluid communication with an adjacent array of fins 124-1 or 124-2. As illustrated, a recess 307 may also be defined in the base plate 304 between the arrays of fins 124-1 and 124-2. The recess 307 may be in fluid communication with the arrays of fins 124-1 and 124-2. A separating wall or a ridge 308 may divide the recess 307 into two flow channels 309-1 and 309-2 that are fluidly isolated from each other. As discussed below, cool fluid may be exchanged between the arrays of fins 124-1 and 124-2 via the flow channels 309-1 and 309-2 during operation of the cooling apparatus 300.

The base plate 304 may have installation holes 330 at the corners thereof. Corresponding installation holes (not illustrated) may be provided in the pump housing 108 and the cover 306, as discussed above with reference to FIG. 2A. The cooling unit 302 may be secured to each pumping unit 102 using screws 133 received in the installation holes. However, other kinds of fasteners, such as rivets, nuts, bolts, etc. may also be used to secure the pumping unit 102 and the cooling unit 104 together. In the illustrated embodiment, the sealing element 128 and pad 126 may be omitted from the cooling unit 302. However, in other embodiments the pad 126 and the sealing element 128 may be included in the cooling unit 302, and may be sized or otherwise configured to operate in the cooling unit 302 without restricting the fluid flow between the arrays of fins 124-1 and 124-2.

Figure 3B:
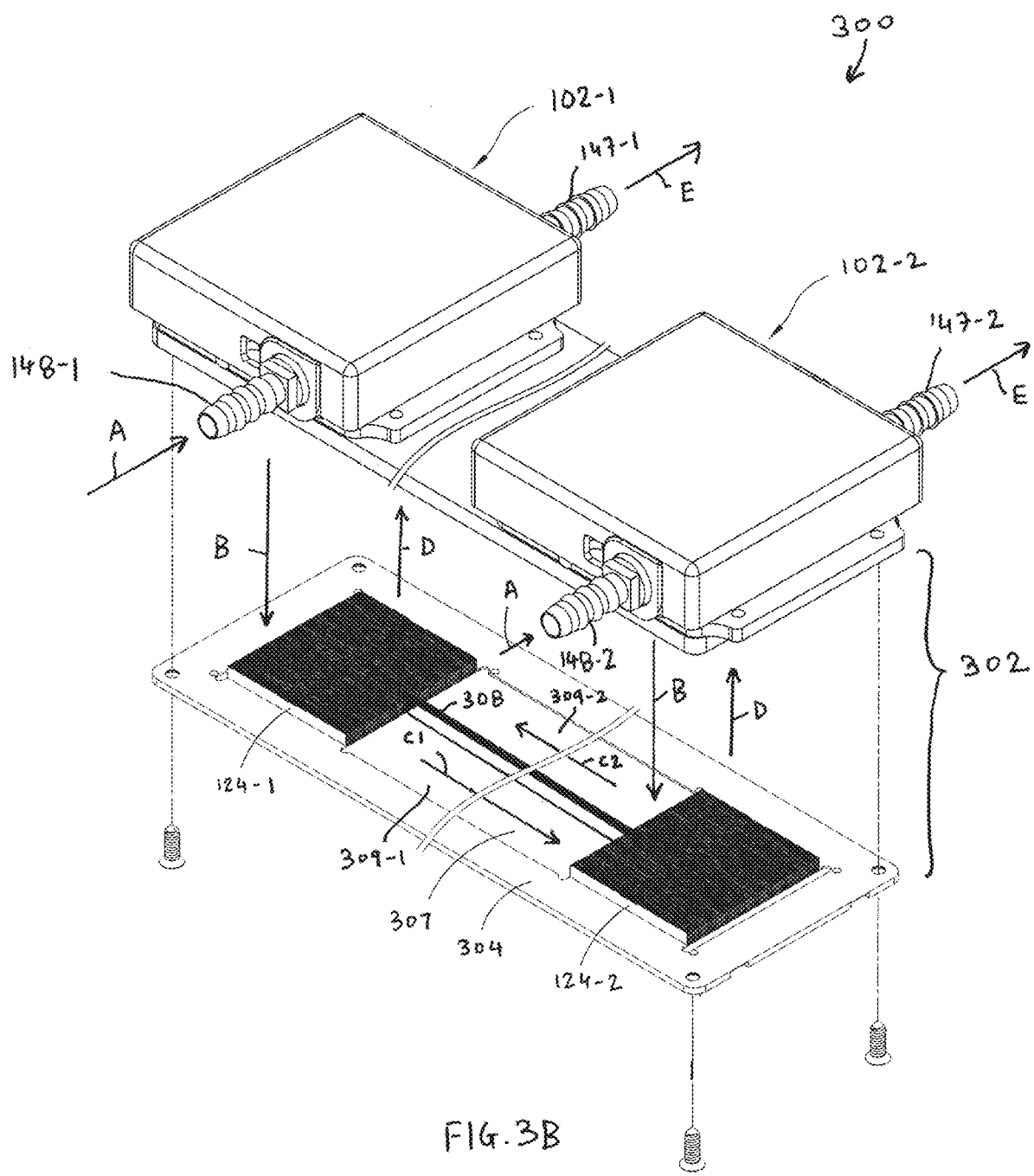
FIG. 3B illustrates a fluid flow in the cooling apparatus of FIG. 3A during operation thereof, according to disclosed embodiments.

FIG. 3B illustrates fluid flow in the cooling apparatus 300 during operation thereof, according to embodiments disclosed herein. For the sake of clarity of illustration, not all components of the cooling apparatus 300 are labelled in FIG. 3B. Each pumping unit 102 may be connected to an individual external heat dissipating device (e.g., a radiator or similar device) or the two pumping unit 102 may share a common external heat dissipating device. Fluid may be circulated between the cooling apparatus 300 and the external heat dissipating device(s). In an example, the inlets 148 (labelled as 148-1 and 148-2) of the pumping units 102 (102-1 and 102-2) may be connected to an outlet of the external heat dissipating device (not expressly illustrated), and the outlets 147 (labelled as 147-1 and 147-2) may be connected to an inlet of the external heat dissipating device.

During operation, relatively cooler fluid from the external heat dissipating device may enter the pumping units 102 via the respective inlets 148-1 and 148-2, as indicated by the arrows A. The cooler fluid may enter the cooling unit 302 and is exposed to the arrays of fins 124-1 and 124-2, as indicated by the arrows B. Inside the cooling unit 302, heat from the base plate 304 and the fins 124 is transferred to the cooler fluid and the temperature of the cooler fluid increases.

The heated fluid (or at least a portion thereof) from the array of fins 124-1 flows to the array of fins 124-2 via the channel 309-1, as indicated by the arrow C1. Similarly, the heated fluid (or at least a portion thereof) from the array of fins 124-2 flows to the array of fins 124-1 via the channel 309-2, as indicated by the arrow C2. By exchanging fluid between the fins 124 additional heat may be dissipated from the base plate 304 and the fins 124, heat transfer efficiency may be increased. The heated fluid may enter the pumping units 102, as indicted by arrows D, and may exit the corresponding pumping units 102 via the outlets 147-1 and 147-2, as indicated by the arrows E. The heated fluid then flows to the external heat dissipating device(s). The external heat dissipating device(s) uses a cooling device, such as a fan, to cool the heated fluid, and the cooler fluid is then provided to the inlets 148-1 and 148-2 for recirculation into the cooling unit 302.

In the embodiment in FIG. 3B, the pumping units 102-1 and 102-2 are referred to as operating in series. Such a configuration increases throughput and may be used for cooling relatively large size integrated circuits (ICs) or other large heat generating devices. To ensure the most efficient operation of the cooling apparatus 300, the pumping units 102-1 and 102-2 may be operated at the same operating speeds.

Figure 4A:
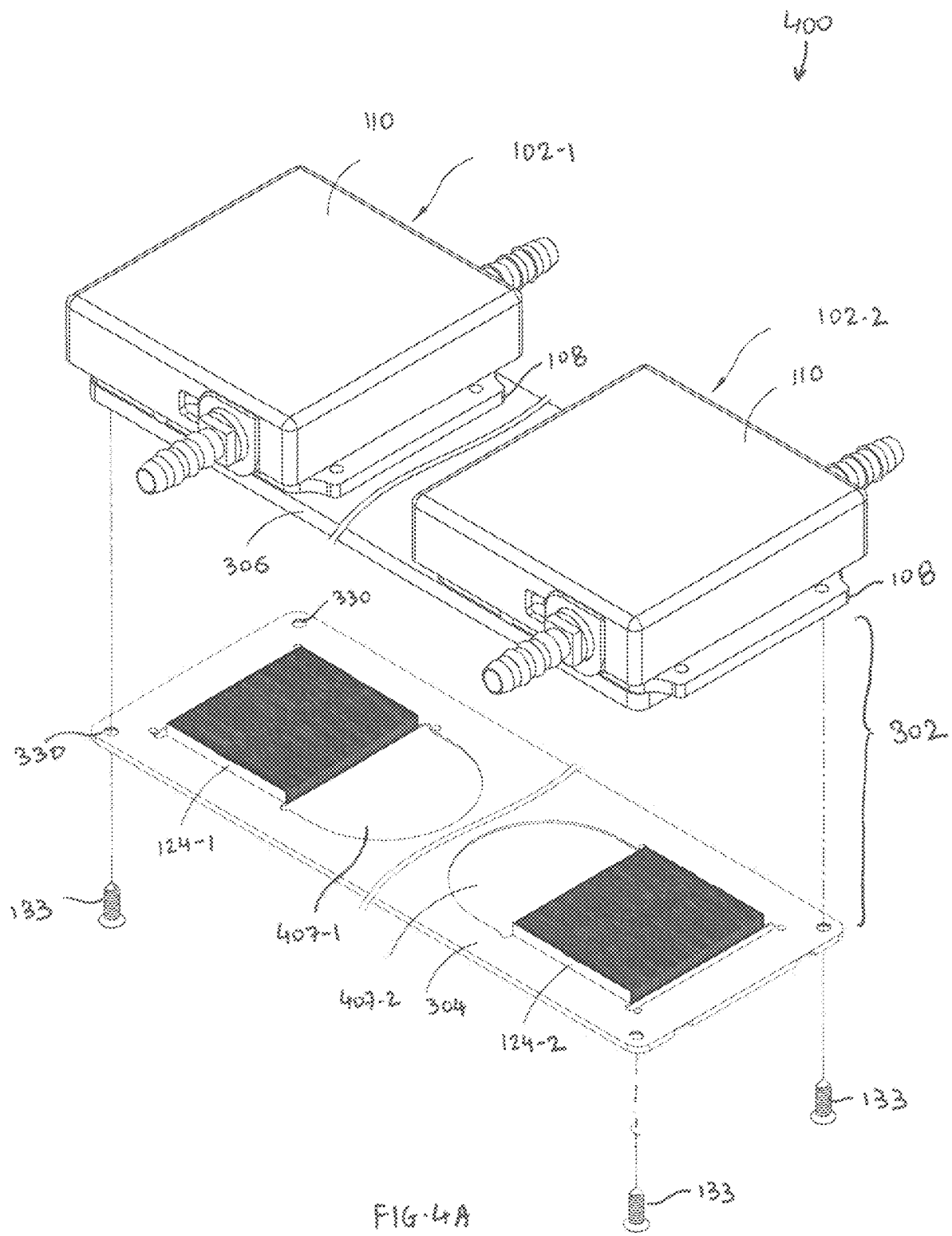
FIG. 4A illustrates a partially exploded view of yet another cooling apparatus, according to another disclosed embodiment.

FIG. 4A is a partially exploded view of a cooling apparatus 400, according to another embodiment disclosed herein. The cooling apparatus 400 may be similar in some respects to the cooling apparatus 300 in FIG. 3A, and therefore may be best understood with reference thereto where like numerals designate like components not described again in detail. In the cooling apparatus 400, the base plate 304 may not include a continuous recess between the arrays of fins 124-1 and 124-2 like the recess 307 in the cooling apparatus 300 of FIG. 3A. As illustrated, the base plate 304 may contain two recesses 407-1 and 407-2 (collectively referred to as recesses 407) that are fluidly separated from each other. In other words, fluid may not transfer between the recesses 407-1 and 407-2. The recess 407-1 may reside adjacent the array of fins 124-1 and may be in fluid communication therewith. The recess 407-2 may reside adjacent the array of fins 124-2 and may be in fluid communication therewith. In FIG. 4A, the recesses 407 are illustrated as having a semicircular shape. However, the recesses 407 are not limited to having any particular shape. Further, both recesses 407 may have the same shape or each recess 407 may have a different shape.

Figure 4B:
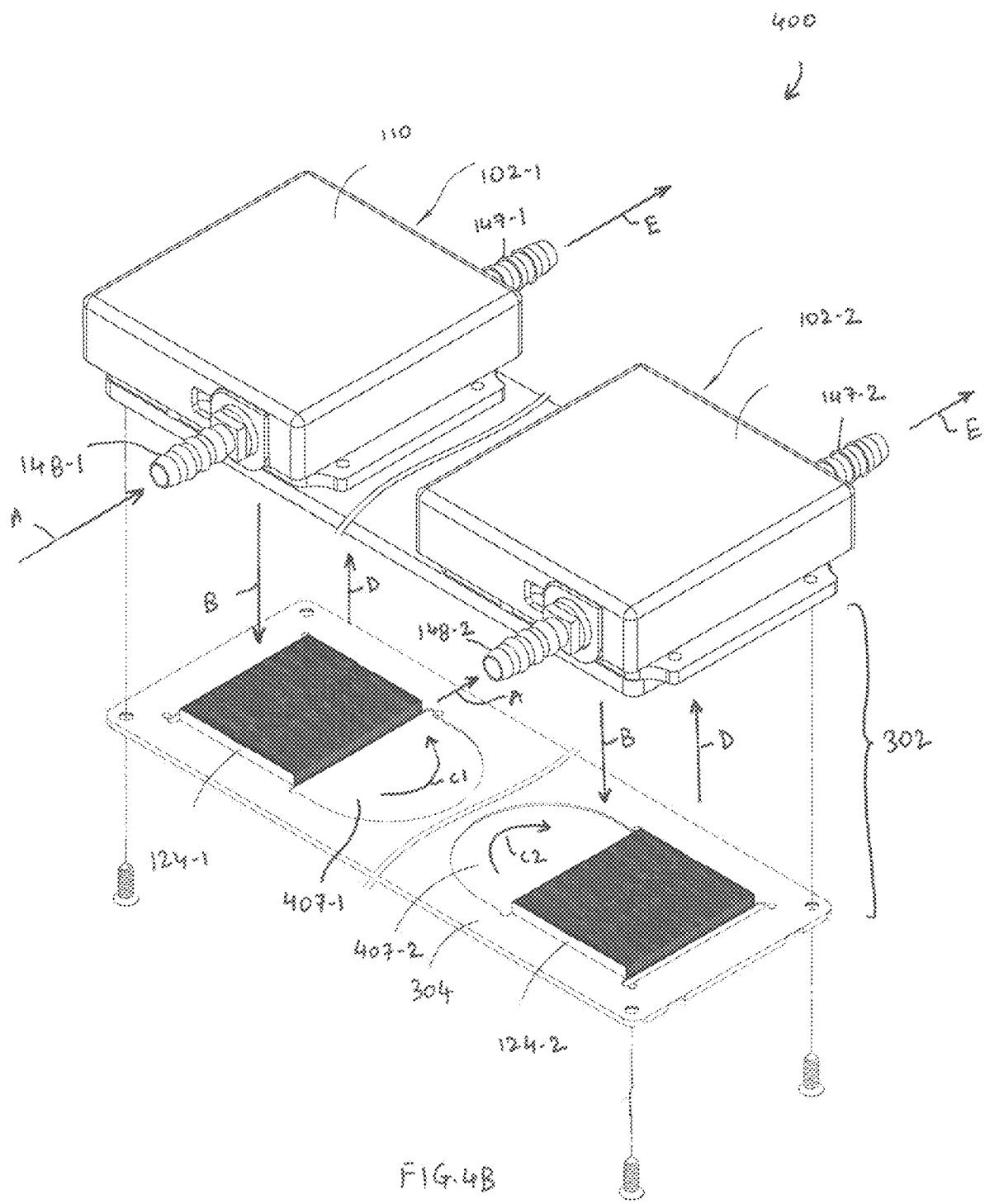
FIG. 4B illustrates a fluid flow in the cooling apparatus of FIG. 4A during operation thereof, according to disclosed embodiments.

FIG. 4B illustrates fluid flow in the cooling apparatus 400 during operation thereof, according to embodiments disclosed herein. For the sake of clarity of illustration, not all components of the cooling apparatus 400 are labelled in FIG. 4B. The operation of the cooling apparatus 400 may be similar in some respects to the operation of cooling apparatus 300 in FIG. 3B, and therefore may be best understood with reference thereto where like numerals designate like components not described again in detail.

As illustrated in FIG. 4B, relatively cooler fluid from the external heat dissipating device may enter the pumping units 102 via the respective inlets 148-1 and 148-2, as indicated by the arrows A. The cooler fluid may enter the cooling unit 302 and contacts the arrays of fins 124-1 and 124-2, as indicated by the arrows B. Inside the cooling unit 302, heat from the base plate 304 and the fins 124 is transferred to the cooler fluid and the temperature of the cooler fluid increases.

Unlike in the operation of the cooling apparatus 300, the heated fluid from the arrays of fins 124 does not mix with each other. As indicated by arrow C1, heated fluid from the array of fins 124-1 is prevented from flowing to the array of fins 124-2 due to the recess 407-1. Similarly, as indicated by arrow C2, the heated fluid from the array of fins 124-2 is prevented from flowing to the array of fins 124-1 due to the recess 407-2. The heated fluid may then enter the pumping units 102, as indicted by arrows D, and may exit the corresponding pumping units 102 via the outlets 147-1 and 147-2, as indicated by the arrows E. The heated fluid then flows to the external heat dissipating device(s) that cool the fluid using a cooling device, such as a fan. The cooler fluid is then provided to the inlets 148-1 and 148-2 for recirculation into the cooling unit 302.

Thus, in the cooling apparatus 400, fluid enters and exits from the same pumping unit 102. There is no exchange of fluid between the pumping units 102. In the embodiment in FIG. 4B, the pumping units 102-1 and 102-2 are referred to as operating in parallel. In such a configuration, each pumping unit 102 may operate at a different operating speed. Because each pumping unit 102 operates individually, the configuration (e.g., flow resistance, etc.) of the heat exchange chambers of each pumping unit 102 may be different. In an embodiment, sensors may monitor the operating conditions of each pumping unit 102 and, may communicate information regarding the operating conditions of each pumping unit 102 to a controller. Based on the information, the controller may vary the operation of the pumping units 102 so that both pumping units 102 have the same heat dissipating efficiency. For instance, the controller may vary the operating speed of one or more pumping units 102. The cooling apparatus 400 also may be used for cooling relatively large size integrated circuits (ICs) or other large heat generating devices.

Figure 5B:
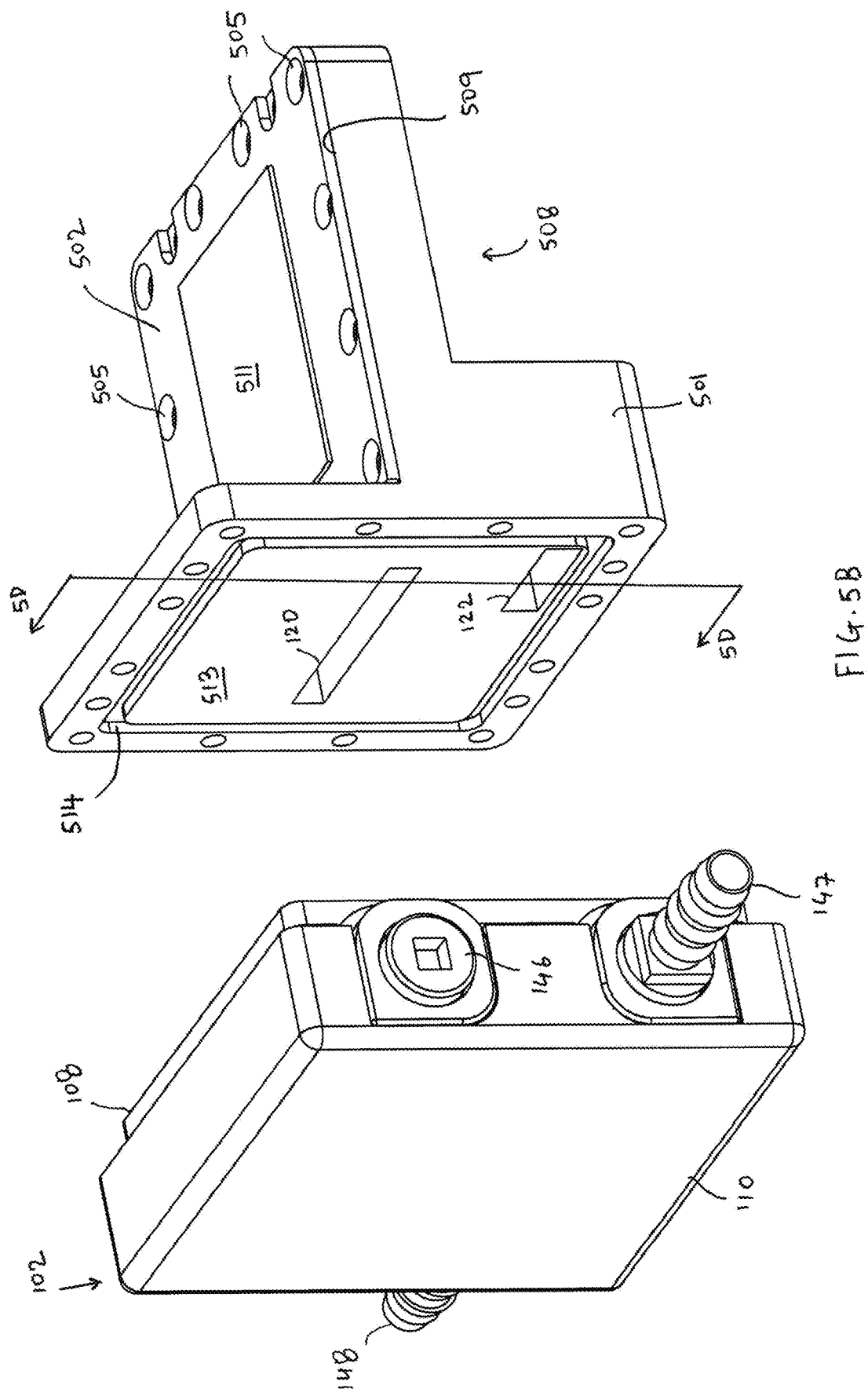
FIGS. 5B and 5C are different perspective views of the cooling apparatus of FIG. 5A in a disassembled state.
Figure 5C:
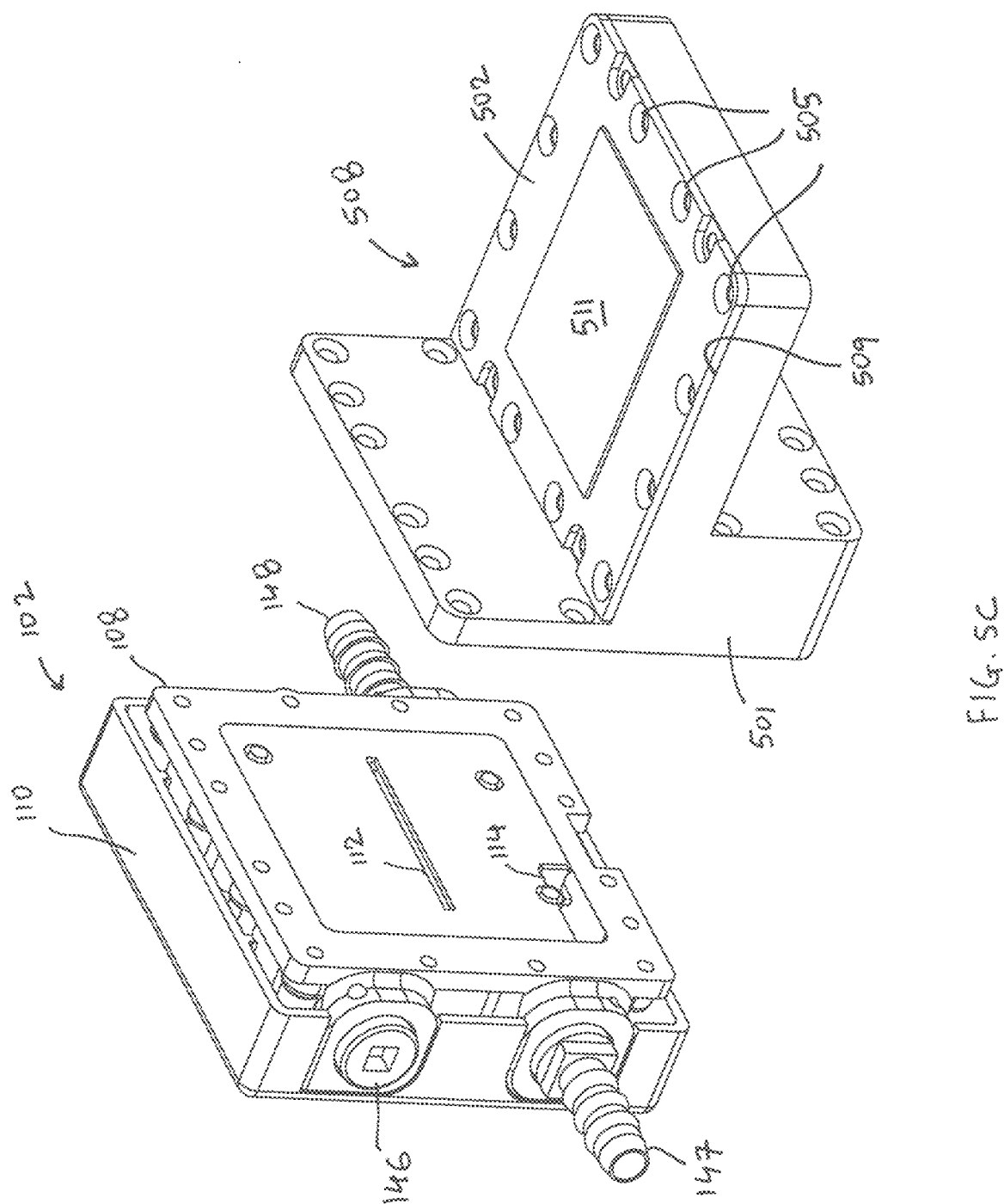

FIG. 5A is a perspective view of another embodiment of a cooling apparatus 500. The cooling apparatus 500 may be similar in some respects to the cooling apparatus 100 in FIG. 1A, and therefore may be best understood with reference thereto where like numerals designate like components not described again in detail. In the assembled state of the cooling apparatus 500 illustrated in FIG. 5A, the pumping unit 102 may be vertically oriented as opposed to a horizontal orientation in the cooling apparatus 100. FIGS. 5B and 5C are different perspective views of the cooling apparatus 500 in a disassembled state.

Referring to FIGS. 5A-5C, the cooling apparatus 500 may include a cooling unit 508 coupled to the pumping unit 102. The cooling unit 508 may have a generally T-shaped body 501 having a first or "vertical" surface 513 and a second or "horizontal" surface 509 perpendicular to the first surface 513. As illustrated in FIG. 5A, the pumping unit 102 may be coupled to the cooling unit 508 via the first surface 513. The cooling unit 508 and the pumping unit 102 are secured to each other using fastening techniques discussed above. The cooling unit 508 may be sized or otherwise configured to receive (or alternatively provide a housing for) a heat sink device 502 that functions as a heat sink to remove heat from an electronic component (e.g., a central processing unit (CPU)) or other heat generating sources coupled thereto. The electronic component or any other heat generating sources may be coupled on the surface 511 of the heat sink device 502 located generally above the fins 124. A heat generating source may be coupled to the surface 511 using a thermally conductive material (e.g., thermal grease) in order to transfer the heat generated from the heat generating source to fins via the base plate 516.

Figure 5E:
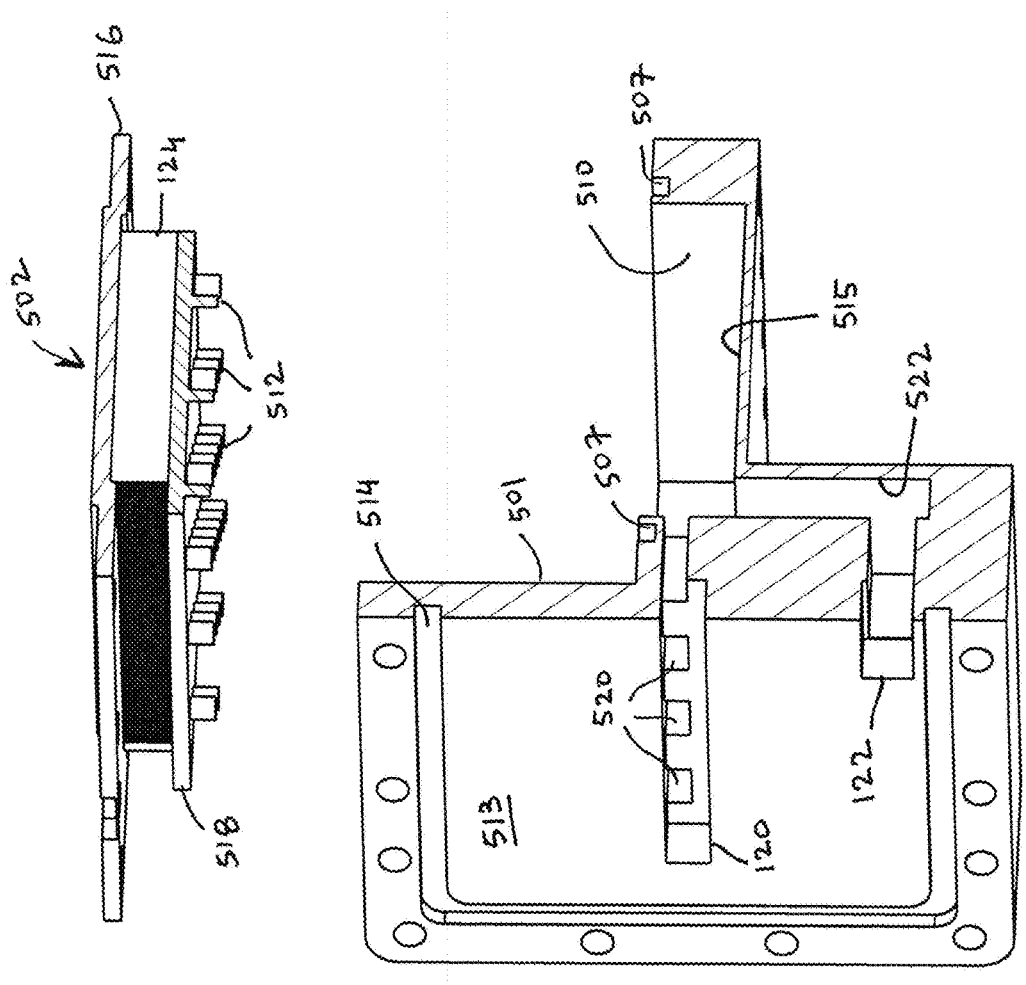
FIG. 5E is a perspective cross-sectional view of the cooling apparatus of FIG. 5B taken along the line 5D-5D.

Referring to FIG. 5B, the cooling unit 508 contains openings 120, 122 on the first surface 513 thereof. Referring to FIG. 5C, the pump housing 108 of the pumping unit 102 has openings 112, 114 that correspond to the openings 120, 122, similar to the cooling apparatus 100. FIG. 5D is a cross-sectional view of the cooling apparatus 500 taken along the line 5D-5D in FIG. 5B. FIG. 5E is a perspective cross-sectional view of the cooling apparatus 500 taken along the line 5D-5D in FIG. 5B and with the heat sink device 502 removed from the cooling unit 508. Referring to FIGS. 5D and 5E, the heat sink device 502 includes a base plate 516, a top plate 518, and the array of fins 124 disposed between the base plate 516 and the top plate 518. The body 501 of the cooling unit 508 may contain a cavity 510 in the second surface 509 that is sized or otherwise configured to receive the heat sink device 502. The heat sink device 502 also includes columns or pillars 512 extending from the top plate 518. The columns 512 support the heat sink device 502 by contacting a bottom surface 515 of the cavity 510 when the heat sink device 502 is installed in the cooling unit 508. When installed, body 501 may function similar to a cover that encloses the fins 124 that extend perpendicular to the first surface 513 of the cooling unit 508. Stated otherwise, the fins 124 and the openings 120, 122 may extend to be perpendicular to each other.

The body 501 may contain a plurality of channels 520 near the openings 120. The channels 520 fluidly connect the opening 120 with the cavity 510. The body 501 may also contain a passage 522 extending from the cavity 510 (or more specifically, from the bottom surface 515 thereof) to the opening 122 and thereby fluidly connecting the cavity 510 to the opening 122.

Referring to FIGS. 5A-5E, the heat sink device 502 may contain installation holes 505 and the cooling unit 508 may have installation holes 507 corresponding to the installation holes 505. The installation holes 505, 507 may receive fasteners, such as rivets, screws, nuts, bolts, etc. to secure the heat sink device 502 to the cooling unit 508. Additionally or alternatively, other fastening techniques, such as riveting, screwing, press-fitting, and the like, may be used to secure the heat sink device 502 to the cooling unit 508. As discussed above with reference to cooling apparatuses 100, 300, and 400, in the cooling apparatus 500, the pumping unit 102 and the cooling unit 508 may also be coupled to each other via a sealing element (similar to the sealing element 106) disposed between the pumping unit 102 and the cooling unit 508. The sealing element may be disposed in a recess 514 defined in the surface 513. For the sake of clarity of illustration, the sealing element is not illustrated in FIGS. 5B and 5C.

Figure 5F:
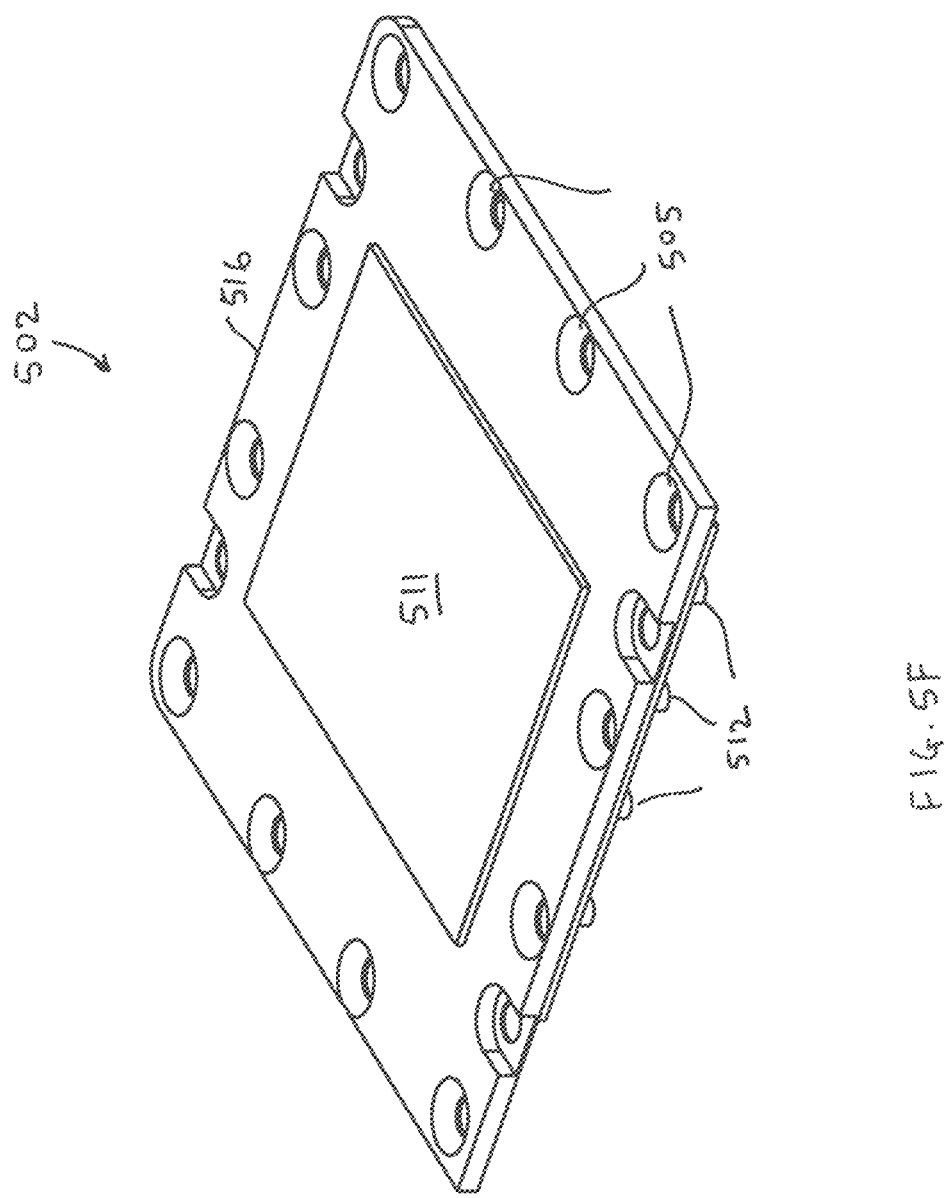

FIGS. 5F and 5G are top and bottom perspective views illustrating features of the heat sink device 502, according to embodiments disclosed herein. Referring to FIGS. 5A-5D, during operation, relatively cooler fluid from the external heat dissipating device (e.g., a radiator or similar device) may enter the pumping unit 102 via the inlet 148. The cooler fluid may then enter the cooling unit 508 via the opening 120. The fluid may flow through the channels 520 and into the cavity 510. In the cavity 510, the heat from the base plate 516 and the fins 124 is transferred to the cooler fluid and the temperature of the cooler fluid increases.

The heated fluid then flows from underneath the fins 124, through the columns 512, and into the passage 522. The heated fluid may then exit the cooling unit 508 via the opening 122 and enter the pumping unit 102 via the opening 114. The heated fluid then may exit the pumping unit 102 via the outlet 147. The heated fluid flows to an external heat dissipating device(s) that cools the fluid using a cooling device, such as a fan. The cooler fluid is then provided to the inlet 148 for recirculation. The flow path of the fluid into and out of the cooling unit 508 is indicted by the arrow M in FIG. 5D. As seen, the flow path is generally U-shaped. The cooling apparatus 500 provides space savings that can be used in a space restricted environment.

Figure 6A:
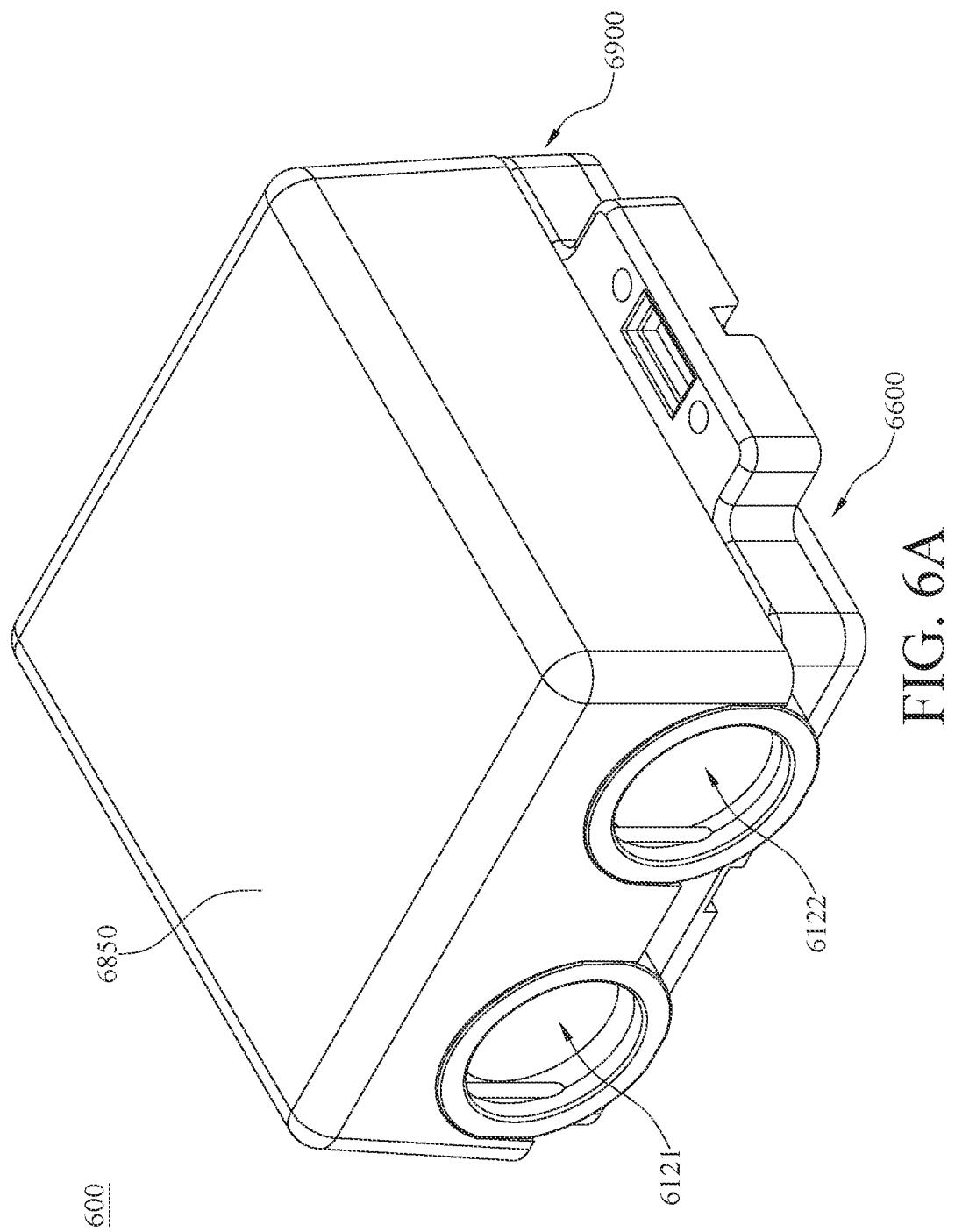
FIG. 6A is a perspective view of a cooling apparatus, according to disclosed embodiments.

FIG. 6A is a perspective view of a cooling apparatus 600, according to embodiments of the disclosure. As illustrated, the cooling apparatus 600 includes a casing 6850, a pumping unit 6900, and a heat exchange unit 6600. The casing 6850 is positioned on the pumping unit 6900 and the pumping unit 6900 is disposed on the heat exchange unit 6600. The casing 6850 may be sized or otherwise configured to receive the pumping unit 6900 therein. The pumping unit 6900 includes an inlet 6121 via which fluid enters the pumping unit 6900 and an outlet 6122 via which the fluid exits the pumping unit 6900.

Figure 6B:
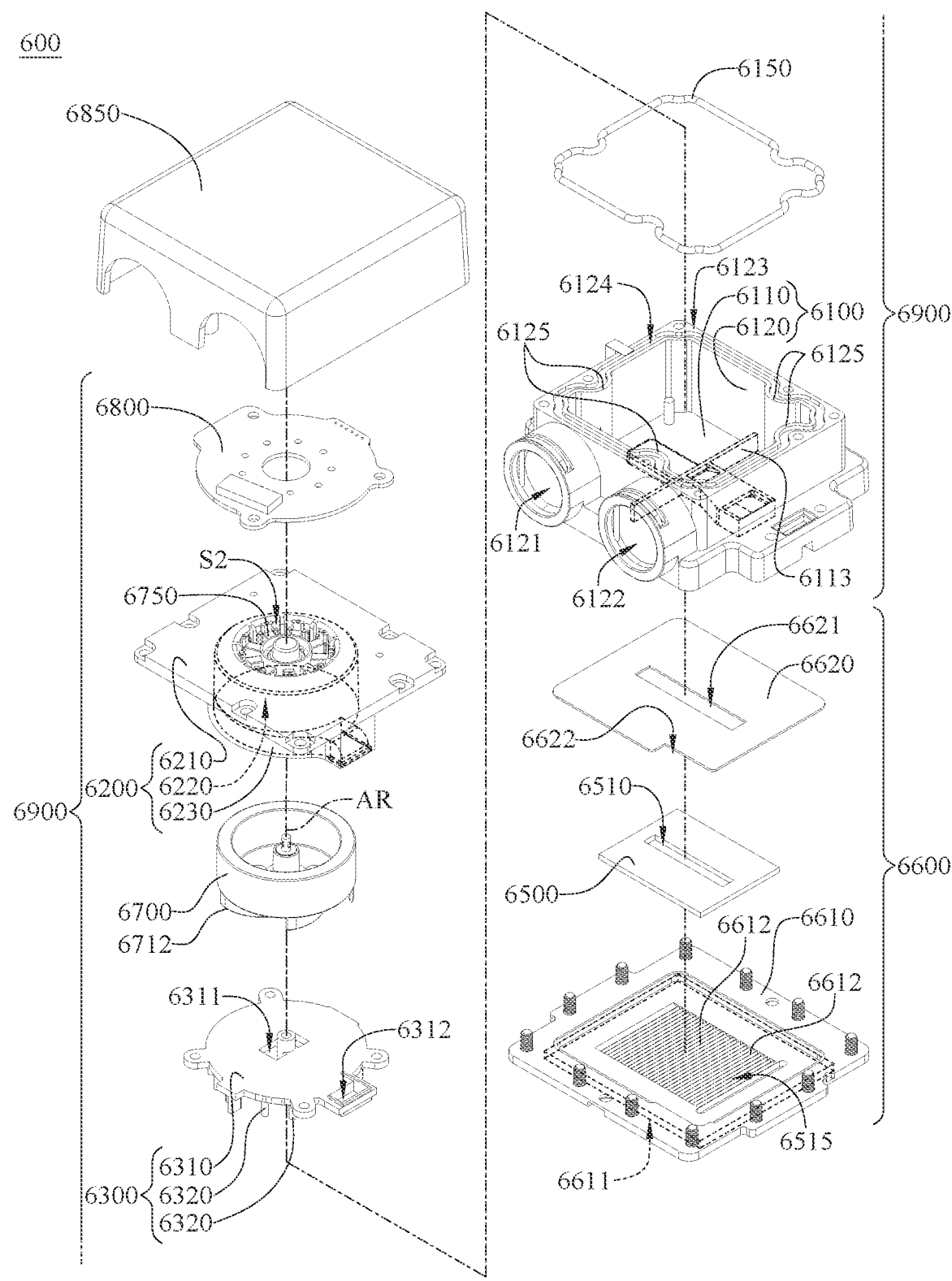
FIG. 6B illustrates an exploded view of the cooling apparatus of FIG. 6A, according to disclosed embodiments.

FIG. 6B is an exploded view of the cooling apparatus 600 of FIG. 6A, according to embodiments of the disclosure. As illustrated, the cooling apparatus 600 includes the casing 6850 positioned on the pumping unit 6900 and pumping unit 6900 disposed on the heat exchange unit 6600. The casing 6850, the pumping unit 6900, and the heat exchange unit 6600 are generally rectangular or square in shape. The casing 6850 includes installation holes disposed along inner sidewalls thereof and the pumping unit 6900 includes installation holes corresponding to the installation holes of the casing 6850 disposed at periphery edges thereof. The pumping unit 6900 contains installation holes at periphery edges thereof opposite the installation holes corresponding to the casing 6850 installation holes and the heat exchange unit 6600 may have installation holes corresponding to the installation holes of the pumping unit 6900. The pumping unit 6900 installation holes receives fasteners to secure the casing 6850 thereto and the heat exchange unit 6600 receives fasteners to secure the pumping unit 6900 thereto. The heat exchange unit 6600 is in fluid communication with the pumping unit 6900.

As illustrated in FIG. 6A, the pumping unit 6900 includes a housing 6100, a body 6200, a rotor cover plate 6300, and a motor control circuit 6800. The motor control circuit 6800 is a generally flat annular disk-shaped circuit board (e.g., printed circuit board (PCB)) that is disposed on the body 6200. The motor control circuit 6800 controls the cooling apparatus 600 and is used to circulate fluid within the heat exchange unit 6600 for cooling heat generating sources attached thereto.

The body 6200 of the pumping unit 6900 includes a pump cover assembly 6210, a stator receiving portion 6220, and a rotor receiving portion 6230. The stator receiving portion 6220 may be generally donut-shaped and define a second cavity S2 that is sized and shaped (or otherwise configured) to receive a stator portion 6750 therein. The pump cover assembly 6210 may be generally planar shaped (e.g., rectangular or square shaped) and the motor control circuit 6800 is disposed on the pump cover assembly 6210 and electrically connected to the stator portion 6750. Referring to FIG. 1B, the pump cover assembly 6210 is disposed on top of the stator receiving portion 6220 and the rotor receiving portion 6230. The stator portion 6750 is received in the second cavity S2 of the stator receiving portion 6220 from a first or top side of the body 6200. The rotor receiving portion 6230 is generally donut-shaped and at least partially defines a third cavity S3 that is sized and shaped (or otherwise configured) to receive a rotor portion 6700. The rotor portion 6700 defines an axis of rotation AR. The rotor portion 6700 is received in the third cavity S3 of the rotor receiving portion 6230 from a second or bottom side of the body 6200.

Figure 8:
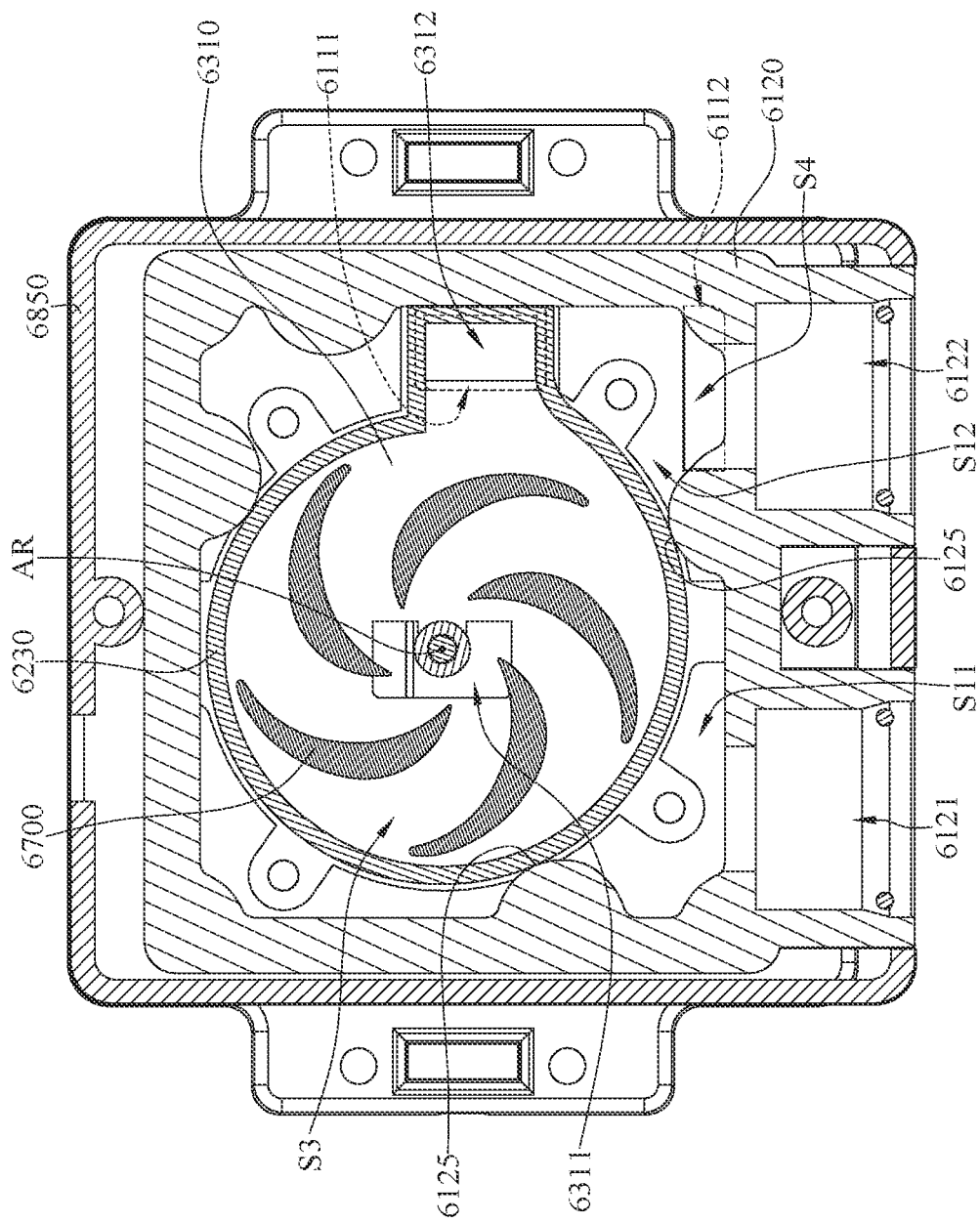
FIG. 8 is a cross-sectional view of the rotor portion of the cooling apparatus of FIG. 6A, according to disclosed embodiments.

The rotor cover plate 6300 includes a cover plate body 6310, a plurality of columns or pillars 6320, a cover plate opening 6311, and a transition flow path 6312. The rotor cover plate 6300 is a generally flat annular disk-shaped structure and disposed on the rotor receiving portion 6230, and covers (at least partially) the third cavity S3. The cover plate opening 6311 is located along the axis of rotation AR and is shaped generally as an elongated slot extending transverse to a first inner side wall 6120 of the housing 6100 that includes the inlet 6121 and outlet 6122. In some embodiments, the cover plate opening 6311 extends perpendicular to the inner side wall 6120. The transition flow path 6312 is located at or adjacent a second inner side wall 6120 adjacent to and connected to the first inner side wall 6120 including the inlet 6121 and outlet 6122. The transition flow path 6312 is shaped generally as an elongated slot that extends parallel to the cover plate opening 6311. The cover plate opening 6311 is in fluid communication with an inlet cavity S11 (see also FIG. 8) and the third cavity S3. The transition flow path 6312 is in fluid communication with the third cavity S3 and a first passage 6111 (FIG. 8). The plurality of columns or pillars 6320 extend from a "bottom" surface of the cover plate body 6310 opposite a "top" surface thereof that faces the third cavity S3. The plurality of columns 6320 support the body 6200 by contacting a bottom surface 6110 of the housing 6100 when the body 6200 is installed in the housing 6100. When installed, the cover plate body 6310 covers the third cavity S3 of the pumping unit 6900.

As illustrated in FIGS. 6A and 6B, the housing 6100 of the pumping unit 6900 includes inlet 6121, outlet 6122, a bottom surface 6110, and four inner side walls 6120 disposed at edges of the bottom surface 6110. The inlet 6121 and the outlet 6122 are both disposed in one of the inner side walls 6120. The inner side walls 6120 and the bottom surface 6110 may at least partially define a generally rectangular or square containment space 6101. The inner side walls 6120 and the bottom surface 6110 may be integrally formed using manufacturing methods such as injection molding or the like. The inlet 6121 and outlet 6122 may generally be cylindrical-shaped and are sized and shaped (or otherwise configured) to receive fittings or the like to exchange fluid between an external heat dissipating device (e.g., CPU. GPU) in fluid communication with the cooling apparatus 600.

The bottom surface 6110 includes a partition wall 6113 that is located in the containment space 6101 and that extends transversely on the bottom surface 110 along the length (or width) of the bottom surface 110. The partition wall 6113 may be positioned generally centrally on the bottom surface 6110. The inner side walls 6120 include inner sidewall protrusions 6125 that extend into the containment space 6101. The inner sidewall protrusions 6125 may be semi-cylindrical shaped and may align the body 6200 by contacting outer sides of the rotor receiving portion 6230 when the body 6200 is installed in the housing 6100. The inner sidewall protrusions 6125 may also, at least partially, define an inlet cavity S11 on one side of the respective inner sidewall protrusions 6125 and the partition wall 6113 and an outlet cavity S12 on an opposing side of the respective inner sidewall protrusions 6125 and the partition wall 6113 when the body 6200 is installed in the housing 6100. An opening of the transition flow path 6312 is located adjacent to an inner side walls 6120 next to the inlet 6121 and outlet 6122 side wall of the housing 6100. A length of the first passage 6111 may extend transversely to a bottom outer surface 6190 (see FIG. 10B) of the housing 6100 and at least partially along the length (or width) of the outer surface 6190 from the opening of the transition flow path 6312. The opening of the transition flow path 6312 is shaped generally as an elongated slot parallel to the inner side walls 6120 and the first passage 6111 may be shaped generally as an elongated channel extending perpendicular to the opening of the transition flow path 6312. A third passage 6112 is located proximate the outlet 6122 and is an elongated slot that is parallel to the inner side wall 6120 including the inlet 6121 and the outlet 6122. The transition flow path 6312 is in fluid communication with the third cavity S3 and the first passage 6111 and the first passage 6111 is in fluid communication with the transition flow path 6312 and heat exchange unit 6600. The third passage 6112 is in fluid communication with the heat exchange unit 6600 and the outlet cavity S12. When installed, the body 6200 covers to enclose the pumping unit 6900 to at least partially define the inlet cavity S11 and the outlet cavity S12.

As illustrated, the heat exchange unit 6600 includes a base plate 6610, a top plate 6500, and a cover 6620. The base plate 6610 may be generally rectangular or square in shape and include a base periphery surface 6611 and a plurality of fins 6612 disposed in a central portion of the base plate 6610. The plurality of fins 6612 may be arranged parallel to each other and extend transversely on the base plate 6610 along the length (or width) thereof. The base plate 6610 may define recesses 6613 adjacent and in fluid communication with the plurality of fins 6612 and on opposite sides thereof. The recesses 6613 may extend parallel to the plurality of fins 6612. The top plate 6500 is generally rectangular or square in shape and includes a second opening 6510. The top plate 6500 may be coupled to the base plate 6510 and define a heat exchange chamber 6515. The cover 6620 is generally rectangular or square in shape and includes a first opening 6622 and a third opening 6621. The cover 6620 is disposed on the top plate 6500 and coupled to an indented periphery of the base plate 6610, and thereby defining a fourth cavity S4. The second opening 6510 and first opening 6621 are shaped generally as elongated slots (e.g., second elongated slot 6510 and first elongated slot 6621) extending perpendicular to the plurality of fins 6612. When assembled, the second opening 6510 coincides with the first opening 6621. The third opening 6622 is shaped generally as an elongated notch (e.g., third elongated notch 6622) disposed generally at a corner of the cover 6620 perpendicular to the plurality of fins 6612. When installed, the pumping unit 6900 functions in a manner similar to a cover that encloses the heat exchange unit 6600, defining the fourth cavity S4 and heat exchange chamber 6515. The first opening 6621 and second opening 6510 are in fluid communication with the first passage 6111 and the heat exchange chamber 6515. The third opening 6622 is in fluid communication with the heat exchange chamber 6515 and the third passage 6112.

Figure 10A:
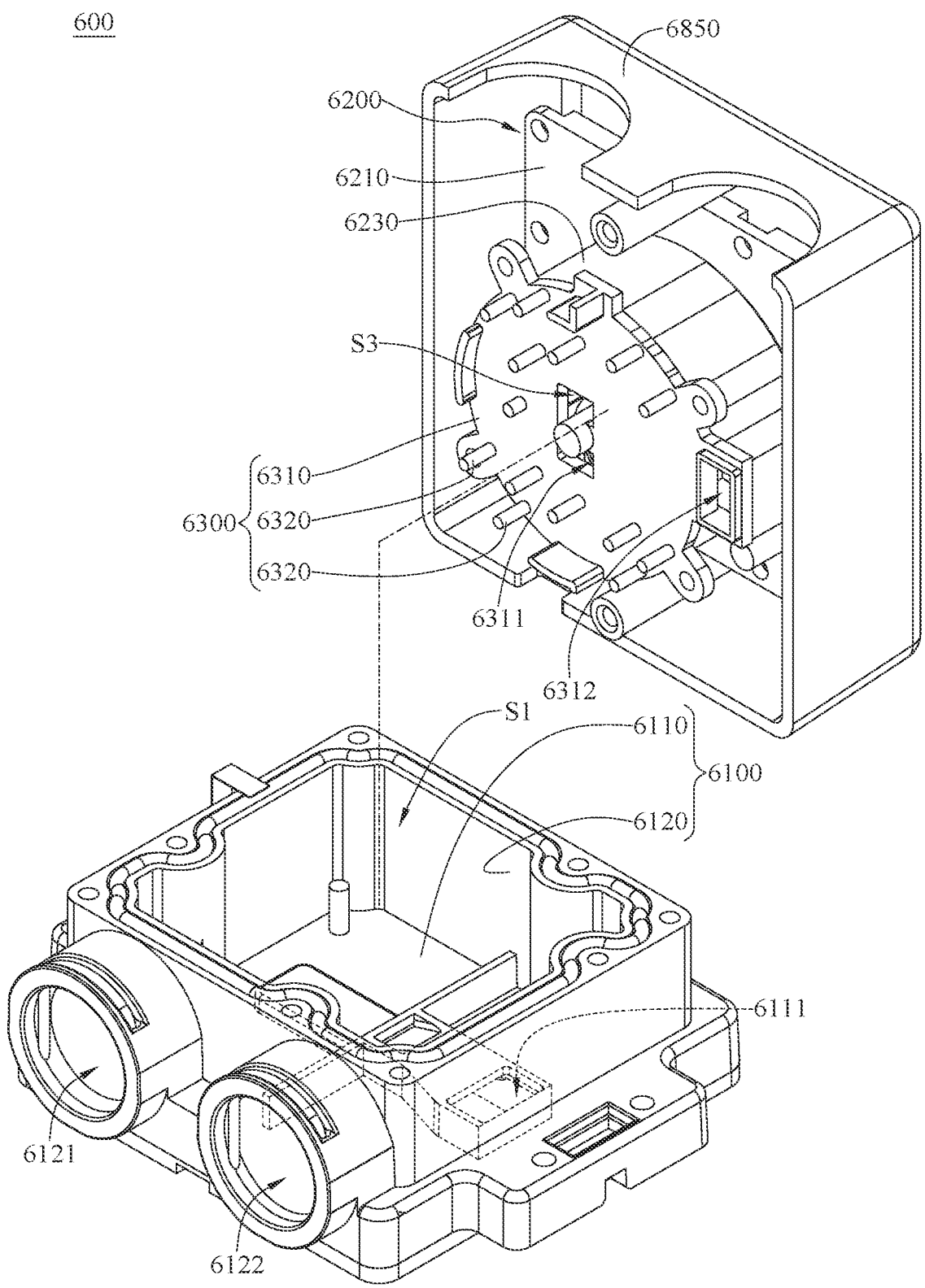
FIGS. 10A and 10B are perspective views of the cooling apparatus of FIG. 6A in a disassembled state.
Figure 10B:
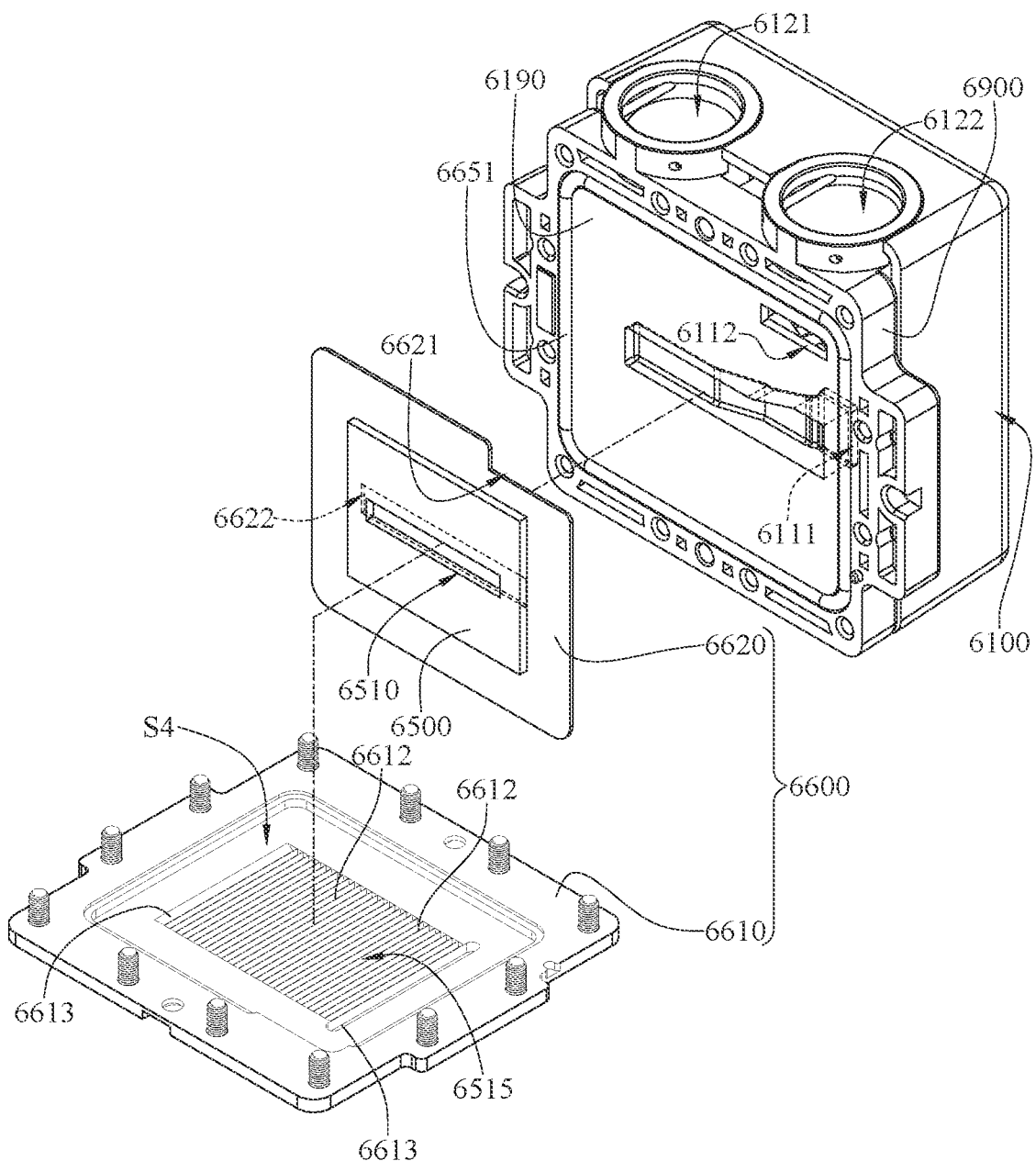

As illustrated in FIG. 10B, sealing elements are disposed in recesses to prevent fluid that flows from leaking out of the cooling apparatus 6000. The inlet and outlet side wall and inner side walls 6120 includes a top periphery surface 6123 having a recess 6124 therein. A sealing element 6150 is disposed between the pump cover assembly 6210 and the periphery surface 6123 of the inlet and outlet side wall and inner side walls 6120 in the recess 6124 to limit fluid that flows within the pumping unit 6900 from leaking out of the cooling apparatus 600. An outer surface 6190 of the pumping unit 6900 includes a recess at a periphery thereof. A heat sink sealing element 6651 is disposed between the pumping unit 6900 and the heat exchange unit 6600 in the recess to limit fluid that flows within the heat exchange unit 6600 from leaking out of the cooling apparatus 600.

When assembled, cooler fluid from an external heat dissipating device may enter the inlet cavity S11 of the pumping unit 6900 via the inlet 6121. Inside the inlet cavity S11, the cooler fluid may enter the third cavity S3 via the cover plate opening 6311 and contact the plurality of blades 6712 of the rotor portion 6700. The cooler fluid flows to the transition flow path 6312 and then enter the heat exchange chamber 6515 via the first passage 6111. The cooler fluid may then enter the heat exchange chamber 6515 via the first opening 6621 and second opening 6510, and contact the plurality of fins 6612. After the heat from the base plate 6610 and the plurality of fins 6612 is transferred to the cooler fluid and the temperature of the cooler fluid increases, the heated fluid from the plurality of fins 6612, then flows through the fourth cavity S4, and then enter the outlet cavity S12 of the pumping unit 6900 via the third opening 6622 and third passage 6112. The heated fluid then exits the pumping unit 6900 via the outlet 6122. The heated fluid then flows to the external heat dissipating device that cools the fluid using a cooling device, such as a radiator and/or one or more fans. The cooler fluid is then provided to the inlet 6121 for recirculation into the heat exchange unit 6600.

Figure 7:
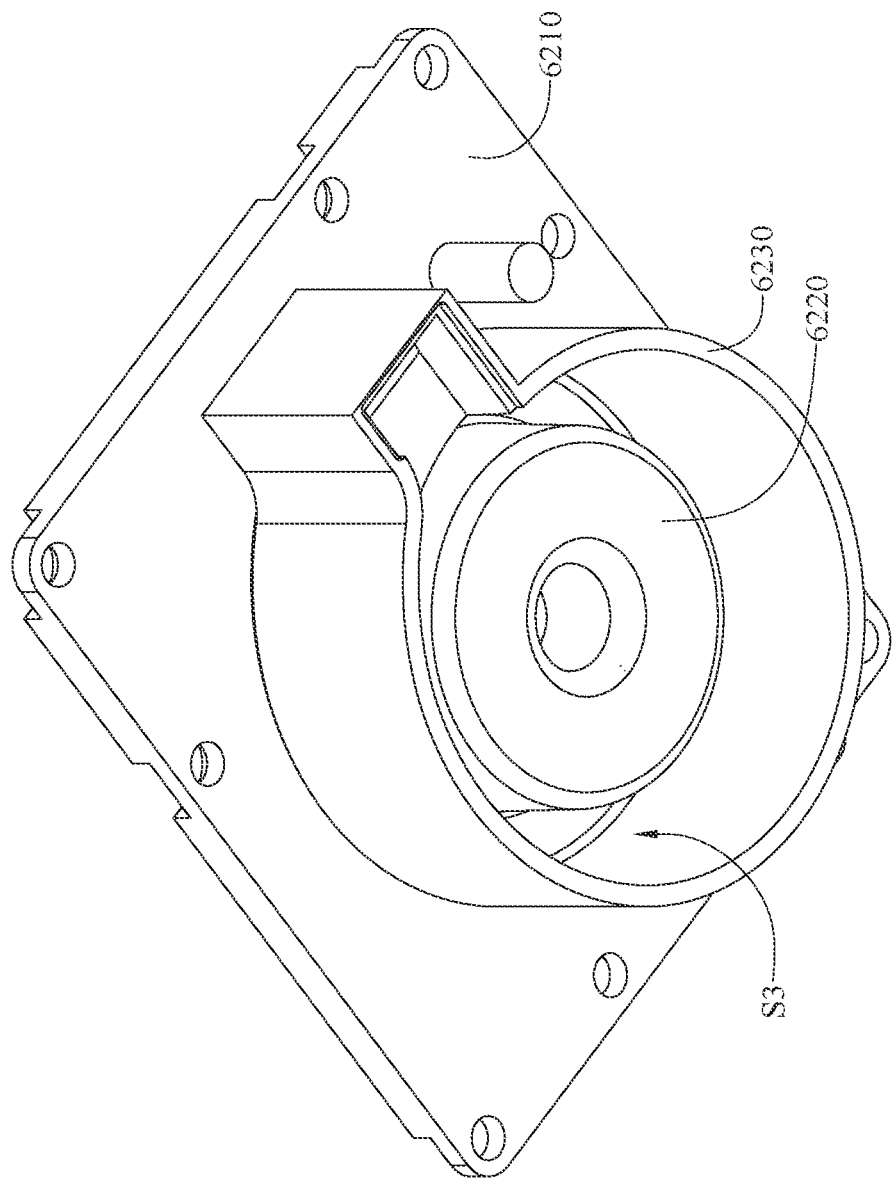
FIG. 7 is a perspective view of the body of the cooling apparatus of FIG. 6A, according to disclosed embodiments.

FIG. 7 is a perspective view illustrating features of the body 6200 of the cooling apparatus 600, according to embodiments of the disclosure. Referring to FIG. 7, as illustrated, the body 6200 includes the pump cover assembly 6210, stator receiving portion 6220, and rotor receiving portion 6230. The stator receiving portion 6220 is shaped and sized (or otherwise configured) to receive the stator portion 6750 therein. The pump cover assembly 6210 is generally flat or planar and the motor control circuit 6800 is disposed thereon and electrically coupled to the stator portion 6750. The rotor receiving portion 6230 is shaped and sized (or otherwise configured) to receive the rotor portion 6700 therein and the cover plate body 6310 thereon, defining the third cavity S3. When installed, the cover plate body 6310 may function in a manner similar to a cover that encloses the third cavity S3 of the pumping unit 6900.

FIG. 8 is a cross-sectional view illustrating features of the rotor portion 6700 of the cooling apparatus 10, according to embodiments of the disclosure. Referring to FIG. 8, as illustrated, the rotor portion 6700 includes a plurality of blades 6712 that impart motion to the fluid in the cooling apparatus 600, rotating around the axis of rotation AR. The plurality of blades 6712 extends from the flat circular surface of the rotor portion 6700 and are generally curve shaped. During operation, the cooler fluid enters the third cavity S3 of the rotor portion 6700 from the inlet cavity S11 via the cover plate opening 6311 and contacts the plurality of blades 6712 of the rotor portion 6700. The cooler fluid flows to the transition flow path 6312 and then enters the heat exchange unit 6600 via the first passage 6111.

Figure 9:
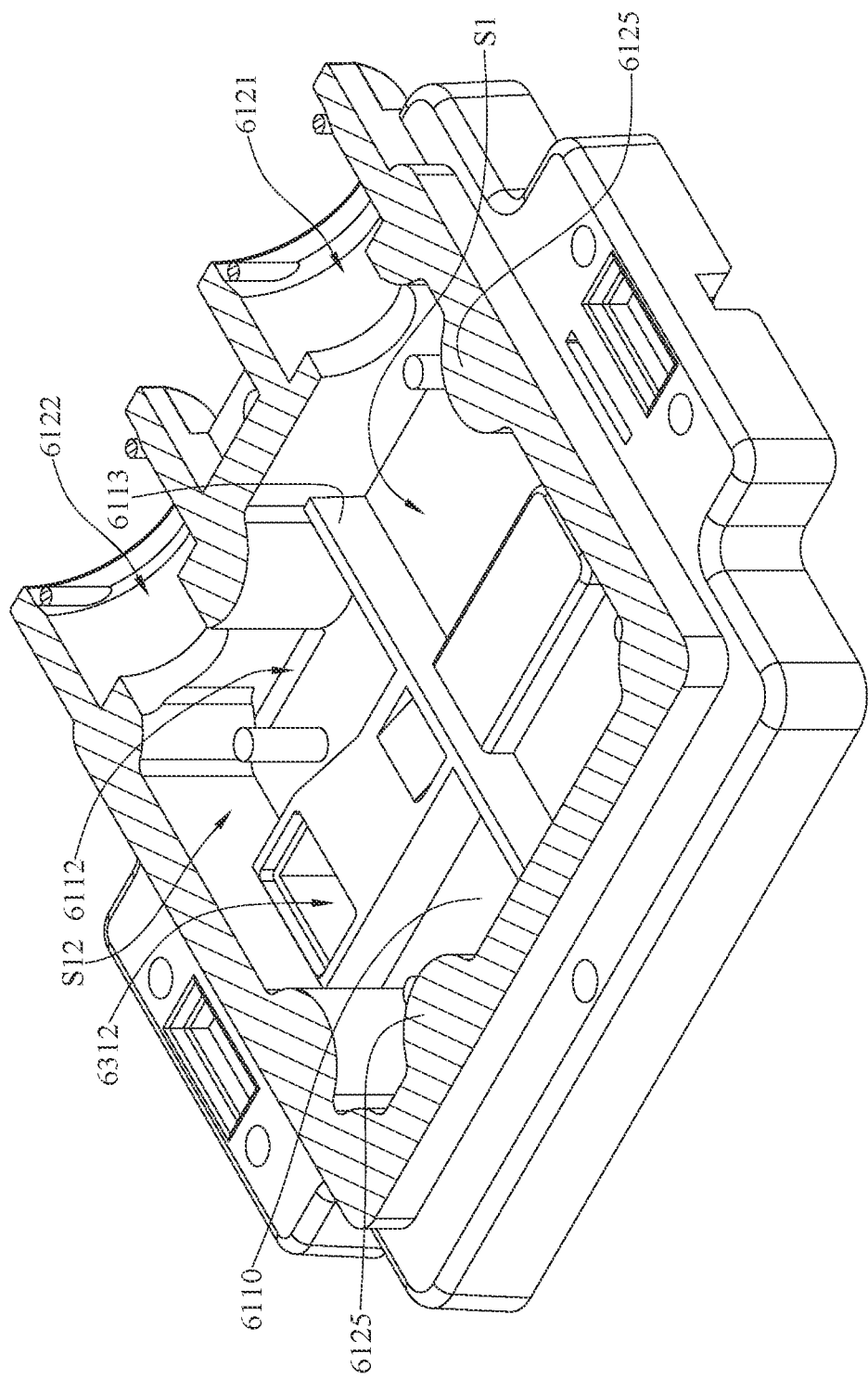
FIG. 9 is a cross-sectional view of the bottom surface of the cooling apparatus of FIG. 6A, according to disclosed embodiments.

FIG. 9 is a cross-sectional view illustrating features of the bottom surface 6110 of the cooling apparatus 600. Referring to FIG. 9, as illustrated, the bottom surface 6110 includes a partition wall 6113 and the inner side walls 6120 include inner sidewall protrusions 125. The partition wall 6113 extends transversely on the bottom surface 6110 along the length (or width) of the bottom surface 6110. The partition wall 6113 is positioned generally centrally on the bottom surface 6110, transverse (e.g., perpendicular, in some embodiments) to the opposing side of the channel on the outer surface 6190 of the pumping unit 6900, at least partially defining the inlet cavity S11 on one side of the partition wall 6113 and the outlet cavity S12 on an opposing side of the partition wall 6113. The inner sidewall protrusions 6125 align the body 6200 by contacting outer sides of the rotor receiving portion 6230 when the body 6200 is installed in the housing 6100. The inner sidewall protrusions 6125 also, at least partially, define the inlet cavity S11 on one side thereof and the outlet cavity S12 on an opposing side thereof when the body 6200 is installed in the housing 6100. When installed, the body 6200 functions similar to a cover that encloses the inlet cavity S11 and the outlet cavity S12 of the pumping unit 6900, defining the inlet cavity S11 and the outlet cavity S12 and forming gaps SG therein for directed flow of fluid.

FIG. 10A is a perspective view of the cooling apparatus 602, according to embodiments of the disclosure. The cooling apparatus 602 may be similar to the cooling apparatus 600 in FIGS. 6A and 6B, and therefore may be best understood with reference thereto where like numerals designate like components not described again in detail.

Referring to FIG. 10A, as illustrated, the casing 6850 receives the pumping unit 6900 therein. The casing 6850 is positioned on the pumping unit 6900 and at least partially encloses the pumping unit 6900. The pumping unit 6900 includes an inlet 6121 via which fluid enters the pumping unit 6900 and an outlet 6122 via which the fluid exits the pumping unit 6900. The casing 6850 includes installation holes and the pumping unit 6900 includes installation holes corresponding to the installation holes of the casing 6850. The pumping unit 6900 installation holes receive fasteners, such as rivets, screws, nuts, bolts, etc. to secure the casing 6850 positioned on the pumping unit 6900. Additionally or alternatively, other fastening techniques, such as riveting, screwing, press-fitting, and the like, may be used to secure the casing 6850 to the pumping unit 6900.

The periphery of the pump cover assembly 6210 includes installation holes and the periphery surface 6123 of the inner side walls 6120 of the housing 6100 includes installation holes corresponding to the installation holes of the pump cover assembly 6210. The pump cover assembly 6210 installation holes may receive fasteners, such as rivets, screws, nuts, bolts, etc. to secure the pump cover assembly 6210 disposed on housing 6100. Additionally or alternatively, other fastening techniques, such as riveting, screwing, press-fitting, and the like, may be used to secure the pump cover assembly 6210 to the housing 6100. The pump cover assembly 6210 and the periphery surface 6123 of the inner side walls 6120 are coupled to each other via a sealing element 6150 (e.g., a gasket, an O-ring, a washer, and the like) disposed between the pump cover assembly 6210 and the periphery surface 6123 of the inner side walls 6120 to limit fluid that flows within the pumping unit 6900 from leaking out of the cooling apparatus 602. The sealing element 6150 is disposed in a recess defined in the periphery surface 6190 of the periphery surface 6123 of the inner side walls 6120.

Continuing to refer to FIG. 10A, as illustrated, the cover plate body 6310 includes a plurality of columns or pillars 6320 extending from the cover plate body 6310 and the rotor cover plate 6300 includes installation holes and the bottom surface 6110 of the housing 6100 includes installation columns corresponding to the installation holes of the rotor cover plate 6300. The rotor cover plate 6300 installation holes receive fasteners, such as rivets, screws, nuts, bolts, etc. to secure the rotor cover plate 6300 disposed on the installation columns having holes sized or otherwise configured to receive the fasteners therein. Additionally or alternatively, other fastening techniques, such as riveting, screwing, press-fitting, and the like, may be used to secure the rotor cover plate 6300 to the installation columns. The plurality of columns 6320 support the body 6200 by contacting a bottom surface 6110 of the housing 6100 when the body 6200 is installed in the housing 6100. When installed, the body 6200 functions similar to a cover that encloses the inlet cavity S11 and the outlet cavity S12 of the pumping unit 6900, defining the inlet cavity S11 and the outlet cavity S12 and forming gaps SG therein for directed flow of fluid. When assembled, the cooler fluid from the external heat dissipating device enters the inlet cavity S11 of the pumping unit 6900 via the inlet 6121. Inside the inlet cavity S11, the cooler fluid enters the third cavity S3 via the cover plate opening 6311 and contacts the plurality of blades 6712 of the rotor portion 6700. The cooler fluid flows along the transition flow path 6312 and then enters the heat exchange unit 6600 via the first passage 6111.

FIG. 10B is a perspective view of the cooling apparatus 602, according to embodiments of the disclosure. Referring to FIG. 10B, as illustrated, the pumping unit 6900 is disposed on the heat exchange unit 6600. The top plate 6500 is coupled to the base plate 6610, defining the heat exchange chamber 6515 and the cover 6620 is disposed on the top plate 6500 and coupled to the indented periphery of the base plate 6610, defining the fourth cavity S4. The cover 6620 is welded to the base plate 6610 to secure the cover 6620 and top plate 6500 to the base plate 6610. The welding is not limited to any specific type of welding and the cover 6620 is welded to the base plate 6610 using any suitable type of welding, without departing from the scope of the disclosure. Other fastening techniques, such as adhesion, press-fitting, and the like, are used to secure the cover 6620 and top plate 6500 to the base plate 6610. The cover 6620 and the top plate 6500 are individually formed or integrally formed, in other instances. The pumping unit 6900 includes installation holes and the heat exchange unit 6600 includes installation holes corresponding to the installation holes of the pumping unit 6900. The heat exchange unit 6600 installation holes receive fasteners, such as rivets, screws, nuts, bolts, etc. to secure the pumping unit 6900 disposed on the heat exchange unit 6600. Additionally or alternatively, other fastening techniques, such as riveting, screwing, press-fitting, and the like, are used to secure the pumping unit 6900 to the heat exchange unit 6600. The pumping unit 6900 and the heat exchange unit 6600 are coupled to each other via a heat sink sealing element 6651 (e.g., a gasket, an O-ring, a washer, and the like) disposed between the pumping unit 6900 and the heat exchange unit 6600 to prevent fluid that flows between the pumping unit 6900 and the heat exchange unit 6600 from leaking out of the cooling apparatus 602. The heat sink sealing element 6651 is disposed in a recess 6124 defined in the outer surface 6190 of the pumping unit 6900.

Continuing to refer to FIG. 5B, as illustrated, the outer surface 6190 of the pumping unit 6900 includes a channel extending from the transition flow path 6312, defining the first passage 6111. The length of the first passage 6111, defined by the channel, may be longer than the first opening 6621 and second opening 6510. The heat sink sealing element 6651, positioned in the recess defined in the periphery of the outer surface 6190, may be shaped and sized (or otherwise configured) to receive the cover 6620 therewith. The base plate 6610 may define recesses 6613 adjacent and in fluid communication with the plurality of fins 6612 and on opposite sides thereof. As illustrated, the recesses 6613 may extend perpendicular to the plurality of fins 6612. The recesses 6613 may collect and/or guide the fluid along the plurality of fins 6612. When assembled, the cooler fluid from the third cavity S3 enters the heat exchange unit 602 via the first passage 6111. The cooler fluid may then enter the heat exchange chamber 6515 via the first opening 6621 and second opening 6510, and contact the plurality of fins 6612. After the heat from the base plate 6610 and the plurality of fins 6612 is transferred to the cooler fluid and the temperature of the cooler fluid increases, the heated fluid from the plurality of fins 6612, may then flow through the fourth cavity S4, and then enter the outlet cavity S12 of the pumping unit 6900 via the third opening 6622 and third passage 6112. The third opening 6621 and third passage 6112 may be positioned near the outlet cavity S12 and outlet 6122 of the pumping unit 6900.

Figure 11:
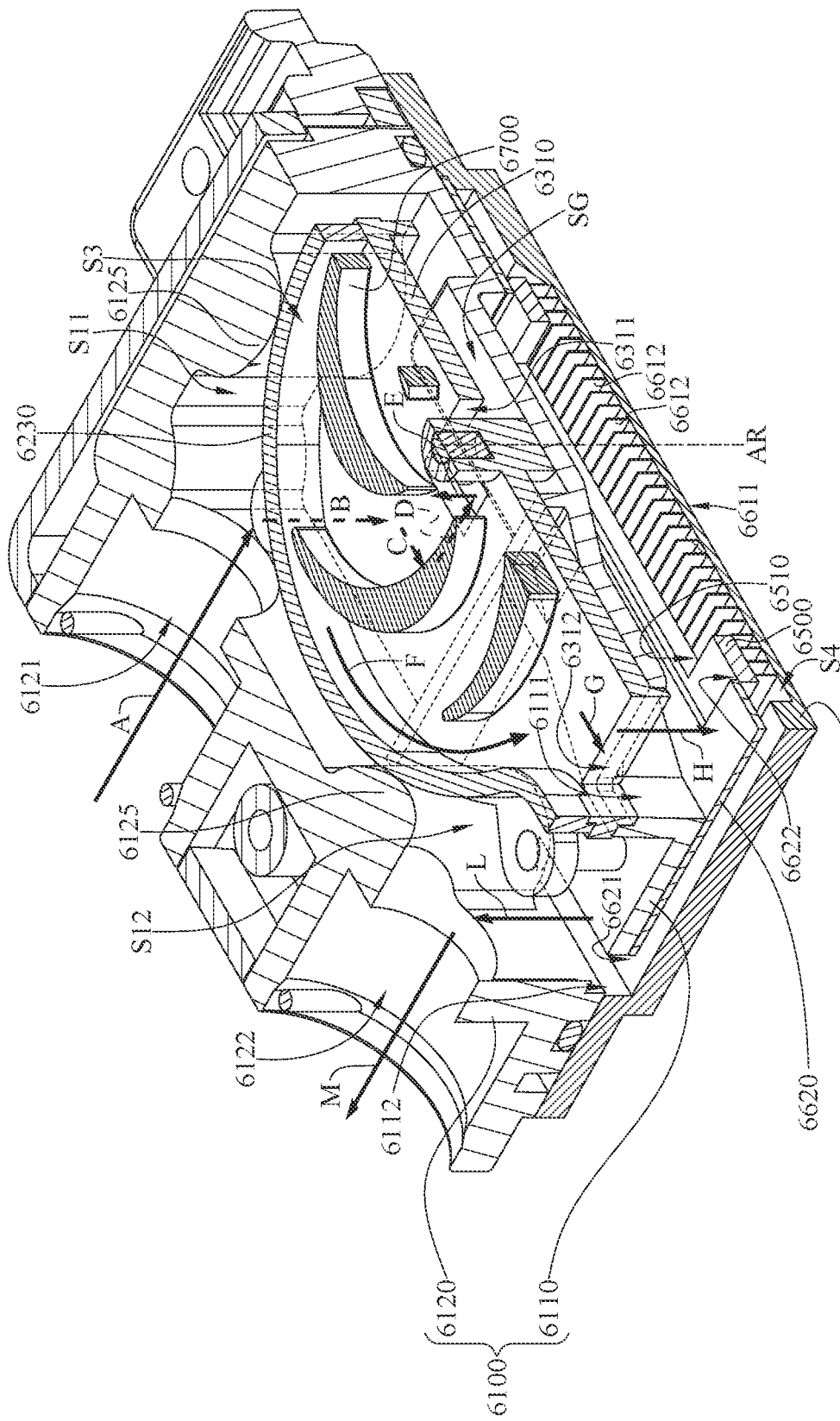
FIG. 11 illustrates a fluid flow in the cooling apparatus of FIG. 6A during operation thereof, according to disclosed embodiments.

FIG. 11 is a cross-section view of the cooling apparatus 602 that illustrates fluid flow in the cooling apparatus 602 during operation thereof, according to embodiments of the disclosure. As illustrated in FIG. 11, relatively cooler fluid from an external heat dissipating device enters the inlet cavity S11 of the pumping unit 6900 via the inlet 6121, as indicated by the arrow A. Inside the inlet cavity S11, the cooler fluid enters the third cavity S3 via the cover plate opening 6311, as indicated by the arrows B, C, D, and E, and contacts the plurality of blades 6712 of the rotor portion 6700, as indicated by the arrows F. The cooler fluid flows to the transition flow path 6312, as indicated by the arrow G, and then enter the heat exchange unit 6600, as indicated by the arrow H via the first passage 6111. An opening of the transition flow path 6312 is near to a side of the pumping unit 6900 and the length of the first passage 6111 may be longer than the first opening 6621 and second opening 6510.

Figure 12:
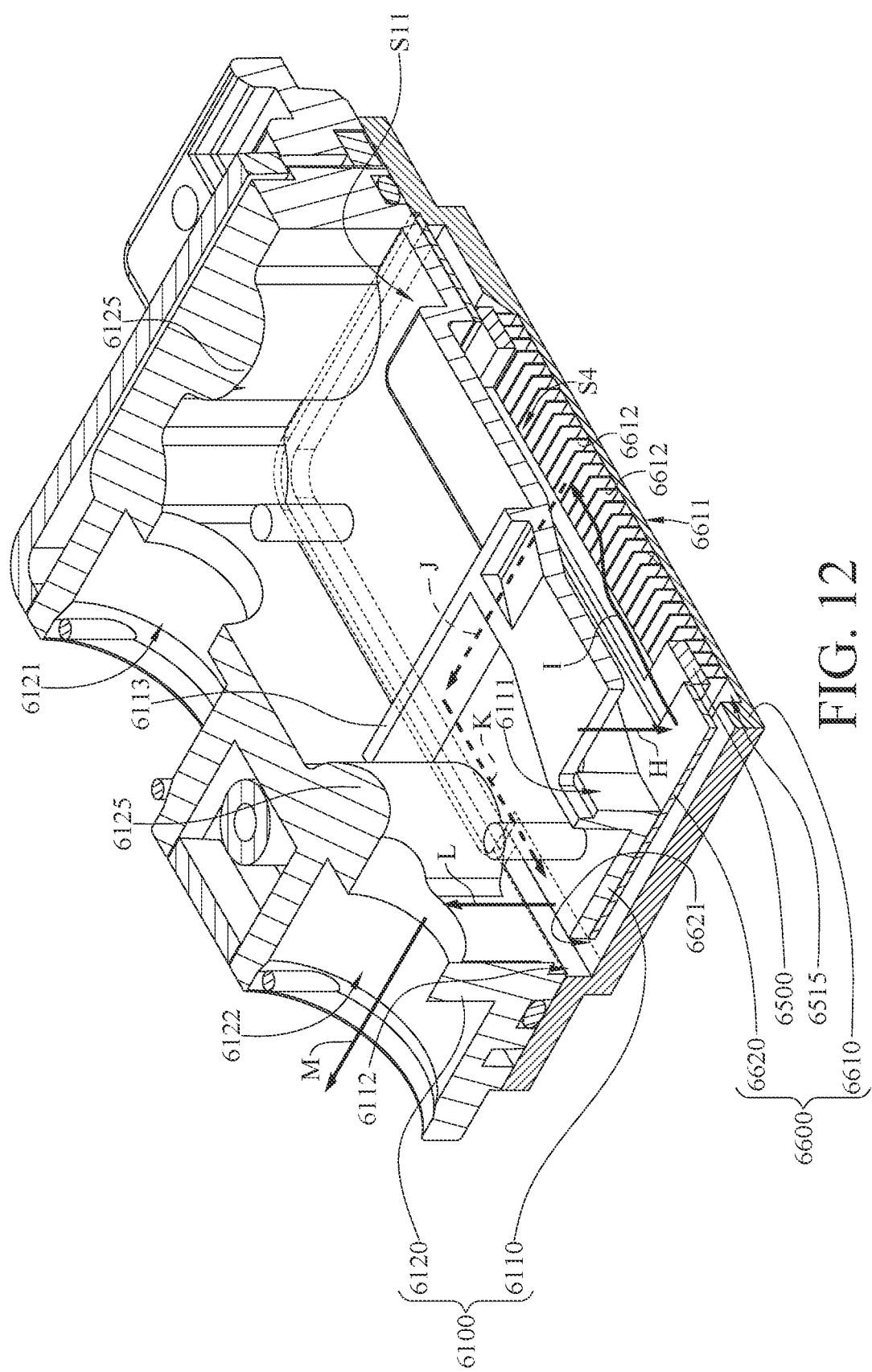
FIG. 12 illustrates a fluid flow in the cooling apparatus of FIG. 6A during operation thereof, according to disclosed embodiments.

FIG. 12 is a cross-sectional view of the cooling apparatus 602 illustrating fluid flow in the cooling apparatus 602 during operation thereof, according to embodiments of the disclosure. As illustrated in FIG. 12, the cooler fluid from the third cavity S3 enters the heat exchange unit 6600 via the first passage 6111, as indicated by the arrow H. The cooler fluid may then enter the heat exchange chamber 6515 via the first opening 6621 and second opening 6510, and contact the plurality of fins 6612, as indicated by the arrow I. The cooler fluid initially flows over the plurality of fins 6612, crossing transversely (e.g., perpendicularly) via the first opening 6621 and second opening 6510, generally, more efficiently dissipating heat from the entire area of the heat exchange chamber 6115b. Inside the heat exchange unit 6600, heat from the base plate 6610 and the plurality of fins 6612 is transferred to the cooler fluid and the temperature of the cooler fluid increases. As indicated by arrow J, heated fluid from the plurality of fins 6612, may then flow through the fourth cavity S4, as indicated by arrow K, and then enter the outlet cavity S12 of the pumping unit 6900 via the third opening 6622 and third passage 6112, as indicated by arrow L. As indicated by arrow M, the heated fluid may then exit the pumping unit 6900 via the outlet 6122. The heated fluid then flows to the external heat dissipating device that cools the fluid using a cooling device, such as a radiator and/or one or more fans. The cooler fluid is then provided to the inlet 6121 for recirculation into the heat exchange unit 6600.

Figure 13:
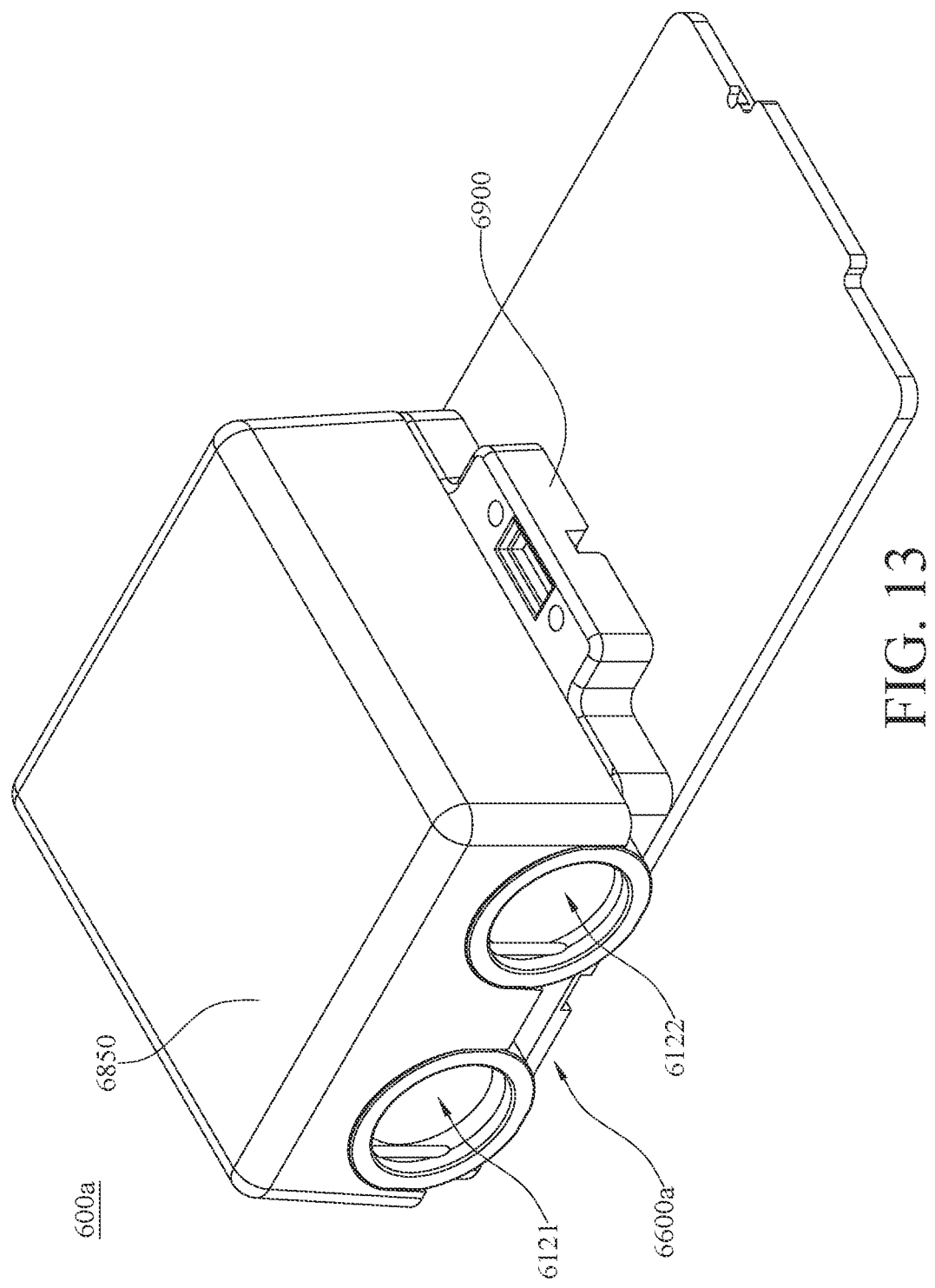
FIG. 13 is a perspective view of a cooling apparatus, according to disclosed embodiments.

FIG. 13 is a perspective view of a cooling apparatus 600a, according to embodiments of the disclosure. The cooling apparatus 600a may be similar in some respects to the cooling apparatus 600 in FIGS. 6A and 6B, and therefore may be best understood with reference thereto where like numerals designate like components not described again in detail.

As illustrated in FIG. 13, the cooling apparatus 600a includes a base plate 6610b that is larger in size than the base plate 6610. The base plate 6610b is generally rectangular in shape. The base plate 6610 and the base plate 6610b have different dimensions and are interchangeable. The pumping unit 6900 is coupled to a heat exchange chamber of the heat exchange unit 6600a such that a transition opening is in fluid communication with the heat exchange chamber through a first passage, a first opening and a second opening.

Although the base plate 6610b illustrated in FIG. 13 is generally rectangular in shape, the base plate 6610 and the base plate 6610b are not limited to having any particular shape, and may be square, circular, polygonal, or of any desired shape and size, based on, for instance, application, design and/or the number and size of the heat generating sources (e.g., a central processing unit (CPU), a graphic processing unit (GPU), and the like) attached to the surface 6611a of the base plate 6610b, without departing from the scope of the disclosure.

The cooler fluid from the third cavity S3 enters the heat exchange unit 6600a via the transition flow path 6312, and the first passage 6111, and then enter the heat exchange chamber 6600a via the first opening 6622 and second opening 6510, and contacts the plurality of fins 6612. Then, heated fluid from the plurality of fins 6612, may then flow through the fourth cavity S4, and then enter the outlet cavity of the pumping unit 900 via the third opening 6622.

FIG. 14A is a perspective view of a cooling apparatus 600*b*, according to embodiments of the disclosure. As illustrated, the cooling apparatus 600*b* includes a casing 6850*b*, a pumping unit 6900*b*, and a heat exchange unit 6600*b*. The casing 6850*b* is positioned on the pumping unit 6900*b* and the pumping unit 6900*b* is disposed on the heat exchange unit 6600*b*. The casing 6850*b* is sized and shaped (or otherwise configured) to receive the pumping unit 6900*b* therein. The pumping unit 6900*b* includes an inlet 6121*b* via which fluid enters the pumping unit 6900*b* and an outlet 6122*b* via which the fluid exits the pumping unit 6900*b*.

Figure 14B:
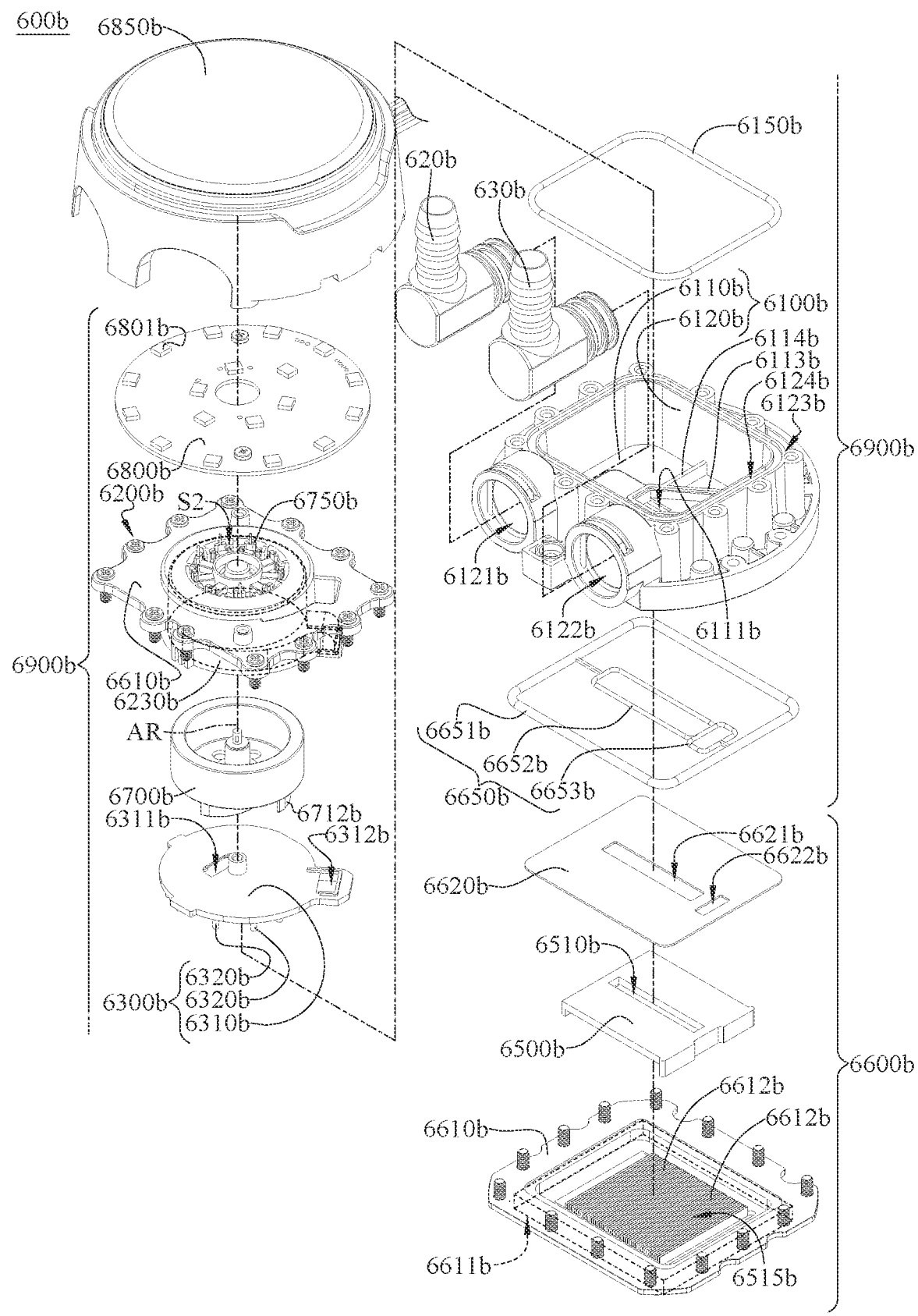
FIG. 14B illustrates an exploded view of the cooling apparatus of FIG. 14A, according to disclosed embodiments.

FIG. 14B is an exploded view of the cooling apparatus 600*b*, according to embodiments of the disclosure. As illustrated, the cooling apparatus 600*b* includes the casing 6850*b* positioned on the pumping unit 6900*b* and pumping unit 6900*b* disposed on the heat exchange unit 6600*b*. The casing 6850*b*, the pumping unit 6900*b*, and the heat exchange unit 6600*b* is generally rectangular or square in shape. The casing 685*b*0 includes installation holes disposed at inner sidewalls thereof and the pumping unit 900*b* has installation holes corresponding to the installation holes of the casing 850*b* disposed at peripheral edges thereof. The pumping unit 6900*b* includes installation holes at peripheral edges thereof opposite the installation holes corresponding to the casing 685*b*0 installation holes and the heat exchange unit 6600*b* may have installation holes corresponding to the installation holes of the pumping unit 6900*b*. The pumping unit 6900*b* installation holes receive fasteners to secure the casing 6850*b* positioned thereon and the heat exchange unit 6600*b* receives fasteners to secure the pumping unit 6900*b* disposed thereon. The heat exchange unit 6600*b* is in fluid communication with the pumping unit 6900*b*.

As illustrated, the pumping unit 6900*b* includes a housing 6100*b*, a body 6200*b*, a rotor cover plate 6300*b*, and a motor control circuit 6800*b*. The motor control circuit 6800*b* is a generally flat annular disk-shaped structure and disposed on the body 6200*b*. Unlike the motor control circuit 6800 of the pumping unit 6900, the motor control circuit 6800*b* includes one or more light sources 6801*b*.

The motor control circuit 6800*b* controls the cooling apparatus 600*b* and is used to circulate fluid within the heat exchange unit 6600*b* for cooling heat generating sources attached thereto. The motor control circuit 6800*b* controls the one or more light sources 6801*b* to turn on and off. The casing 6850*b* is made of, for example, a transparent or translucent material that permits light from the one or more light sources 6801*b* to pass therethrough. In some embodiments, the casing 6850*b* includes decorative features. In other embodiments, the one or more light sources can be switched between on and off at a desired time intervals. Unlike the motor control circuit 6800 of the pumping unit 6900, the motor control circuit 6800*b* includes one or more temperature sensors. The temperature sensors are used to vary the operating speed of the pumping unit 6900*b* when circulating fluid within the heat exchange unit 6600*b*.

As illustrated, the body 6200*b* of the pumping unit 6900*b* may include a pump cover assembly 6210*b*, a stator receiving portion 6220*b*, and a rotor receiving portion 6230*b*. The stator receiving portion 6220*b* may be generally donut-shaped and define a second cavity S2 and receive a stator portion 6750*b* therein. The pump cover assembly 6210*b* may be generally rectangular or square in shape and the motor control circuit 6800*b* may be disposed on the pump cover assembly 6210*b* and electrically coupled to the stator portion 6750*b*. The rotor receiving portion 6230*b* (see FIG. 15) may be generally donut-shaped and at least partially defines a third cavity S3 and receives a rotor portion 6700*b* having an axis of rotation AR.

Figure 16:
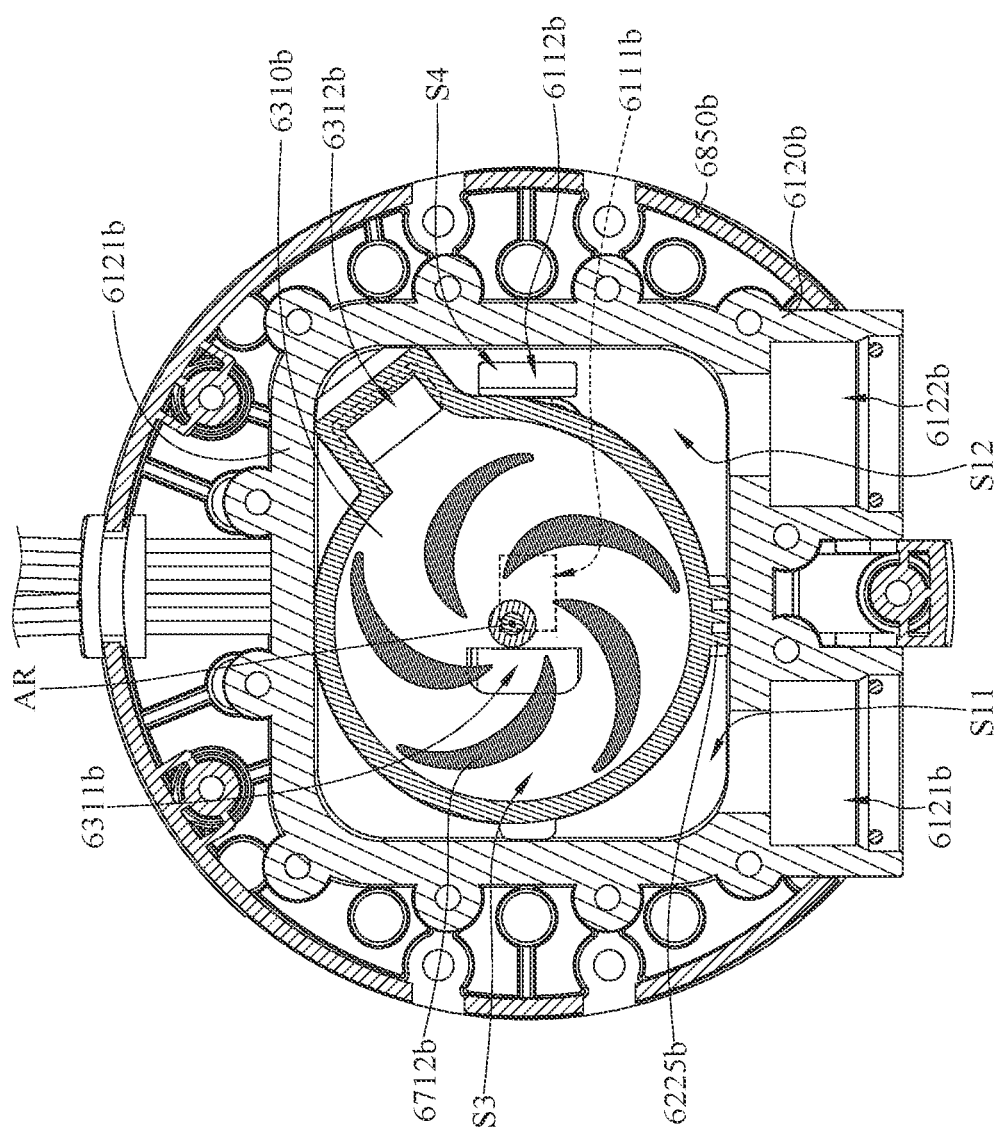
FIG. 16 is a cross-sectional view of the rotor portion of the cooling apparatus of FIG. 14A, according to disclosed embodiments.

The rotor cover plate 6300*b* includes a cover plate body 6310*b*, a plurality of columns or pillars 6320*b*, a cover plate opening 6311*b*, and a transition flow path 6312*b* (FIG. 16). The rotor cover plate 300*b* may be a generally flat annular disk-shaped structure and is disposed on a periphery of the rotor receiving portion 6210*b*, defining the third cavity S3. The cover plate opening 6311*b* located at or adjacent the axis of rotation AR and is shaped as an elongated slot transverse (e.g., perpendicular) to the side walls including the inlet 6121*b* and the outlet 6122*b*. The transition flow path 6312*b* is located at or adjacent an inner side wall 6120*b* that is adjacent (e.g., immediately adjacent) the inner side wall including the inlet 6121*b* and outlet 6122*b* of the housing 6100. The transition flow path 6312*b* is shaped as an elongated slot parallel with the cover plate opening 6211*b*. In some embodiments, the transition flow path 6312*b* is located at or adjacent an intersection of the inner side wall 6120*b* and inner side wall 6121*b* that is opposite the inner side wall including the inlet 6121*b* and outlet 6122*b*.

The cover plate opening 6311*b* is in fluid communication with the inlet cavity S11 and the third cavity S3. The transition flow path 6312*b* is in fluid communication with the third cavity S3 and the first passage 6111*b*. The plurality of columns or pillars 6320*b* extend from the cover plate body 6310*b* opposite the third cavity S3. The plurality of columns 320*b* support the body 200*b* by contacting a bottom surface 6110*b* of the housing 6100*b* when the body 6200*b* is positioned or otherwise installed in the housing 6100*b*. The cover plate body 6310*b* functions similar to a cover that encloses the third cavity S3 of the pumping unit 6900*b*.

As illustrated, the housing 6100*b* of the pumping unit 6900*b* includes the inlet 6121*b*, the outlet 6122*b*, a bottom surface 6110*b* and inner side walls 6120*b* disposed on edges of the bottom surface 6110*b*. The inlet 6121*b* and the outlet 6122*b* are disposed on one side of the bottom surface 6110*b*, and the inner side walls 6120*b* are disposed on the remaining sides of the bottom surface 6110*b*. The side wall including inlet 6121*b* and outlet 6122*b*, the inner side walls 6120*b* and the bottom surface 6110*b* at least partially define a generally rectangular or square containment space. The side wall including the inlet 6121*b* and the outlet 6122*b*, the inner side walls 6120*b* and the bottom surface 6110*b* are integrally formed and manufacturing methods such as injection molding or the like. The inlet 6121*b* and outlet 6122*b* are cylindrical-shaped and sized, shaped or otherwise configured to receive fittings (or the like) to transport and receive fluid to and from an external heat dissipating device in fluid communication with the cooling apparatus 600*b*. The bottom surface 6110*b* includes a partition wall 6113*b*, a transition flow path 6312*b*, a first passage 6111*b*, and a third passage 6112*b*. The partition wall 6113 extends transversely (e.g., perpendicularly) on the bottom surface 6110 along the length (or width) of the bottom surface 6110.

Unlike the inner side walls 6120 of the pumping unit 6900, the inner side walls 6120*b* of the pumping unit 6900*b* do not include inner sidewall protrusions 6125 and the rotor receiving portion 6230*b* includes a partition structure 6225*b*. As illustrated, the bottom surface 6110*b* includes a channel periphery wall 6114*b* surrounding and extending from the first passage 6111*b* to the opening of the transition flow path 6312*b*, at least partially defining the inlet cavity S11 on one side of the partition wall 6113*b* and the outlet cavity S12 on an opposing side of the partition wall 6113*b*. The partition wall 6113*b* is positioned generally centrally on the bottom surface 6110*b*, on an end of the channel periphery wall 6114*b*. The partition structure 6225*b* also, at least partially, defines the inlet cavity S11 on one side thereof and the outlet cavity S12 on an opposite side thereof when the body 6200*b* is installed in the housing 6100*b*. An opening of the transition flow path 6312*b* is at or adjacent an inner side walls 6120 next to the side wall including the inlet 6121*b* and outlet 6122*b* of the housing 6100*b*, and the first passage 6111*b* is adjacent an axis of rotation AR of the pumping unit 6900*b* and shorter in length than the first opening 6621*b* and second opening 6510*b*.

A length of the transition flow path 6312 extends transversely on the bottom surface 6110*b* of the housing 6100*b* at least partially along the length (or width) of the bottom surface 6110*b* from the opening of the transition flow path 6312*b*. The opening of the transition flow path 6312*b* is shaped generally as an elongated slot parallel to an inner side wall 6120*b* that is next to the inner side wall including the inlet 121*b* and the outlet 122*b*, and the first passage 6111*b* is shaped generally as an elongated slot parallel to the inner side wall including the inlet 6121*b* and the outlet 6122*b*. The third passage 6112*b* is shaped generally as an elongated slot disposed adjacent a side of the bottom surface 6110*b* parallel to an inner side wall 6120*b* next to the inner side wall including the inlet 121*b* and the outlet 122*b*. The transition flow path 6312*b* is in fluid communication with the third cavity S3 and the first passage 6111*b*, and the first passage 6111*b* is in fluid communication with the transition flow path 6312*b* and heat exchange unit 6600*b*. The third passage 6112*b* is in fluid communication with the heat exchange unit 6600*b* and the outlet cavity S12. When installed, the body 6200*b* operates similar to a cover that encloses the inlet cavity S11, outlet cavity S12, and transition flow path 6312*b* of the pumping unit 900*b*, thereby defining the inlet cavity S11, outlet cavity S12, and transition flow path 6312*b* and forming gaps SG therein for directed flow of fluid.

The heat exchange unit 600*b* includes a base plate 6610*b*, a top plate 6500*b*, and a cover 6620*b*. The base plate 6610*b* is generally rectangular or square in shape and includes a plurality of fins 6612*b* disposed in a central portion of the base plate 6610*b* and a base periphery surface 6611*b*. The plurality of fins 6612*b* are arranged parallel to each other and extend transversely on the base plate 6610*b* along the length (or width) thereof. The base plate 6610*b* defines recesses adjacent and in fluid communication with the plurality of fins 6612*b* and on opposite sides thereof. The recesses extend parallel to the plurality of fins 6612*b*.

The top plate 6500*b* is generally rectangular or square in shape and includes a second opening 6510*b*. Unlike the top plate 6500*b* of the heat exchange unit 600*b*, the top plate 6500*b* may include protruding walls extending from opposing peripheries of the top plate 6500*b*. The top plate 6500*b* is coupled to the base plate 6610 and defines a heat exchange chamber 6515*b*. The cover 6620*b* is generally rectangular or square in shape and includes a first opening 6622*b* and a third opening 6621*b*. The cover 620*b* is disposed on the top plate 6500*b* and coupled to an indented periphery of the base plate 6610*b*, defining a fourth cavity S4. The recesses receive the protruding walls of the top plate 6500*b*, supporting the top plate 6500*b* and cover 6600*b* by contacting a bottom surface of the recess when the top plate 6500*b* and cover 6600*b* is installed in the base plate 6610. The second opening 6510*b* and first opening 6621*b* is shaped as an elongated slot (e.g., second elongated slot 6510*b* and first elongated slot 6621*b*) extending perpendicular to the plurality of fins 6612*b*. When assembled, the second opening 6510*b* coincides with the first opening 6621*b*. The third opening 6622*b* is shaped as an elongated slot (e.g., third elongated slot 6622*b*) disposed at a side of the cover 6620 between the first opening 6621*b* and edge of the cover 6620*b* parallel to the plurality of fins 6612*b*. When installed, the pumping unit 6900*b* operates similar to a cover that encloses the heat exchange unit 6600*b*, there defining the fourth cavity S4 and heat exchange chamber 6515*b*. The first opening 6621*b* and second opening 6510*b* is in fluid communication with the first passage 6111*b* and the heat exchange chamber 6515*b*. The third opening 6622*b* is in fluid communication with the heat exchange chamber 6515*b* and the third passage 6112*b*.

Sealing elements are disposed in recesses to limit fluid that flows from leaking out of the cooling apparatus 600*b*. The inlet and outlet side wall and inner side walls 6120*b* include a top periphery surface 6123*b* having a recess 6124*b* therein. A sealing element 6150*b* is disposed between the pump cover assembly 6210*b* and the periphery surface 6123*b* of the inlet and outlet side wall and inner side walls 6120*b* in the recess 6124*b* to prevent fluid that flows within the pumping unit 6900*b* from leaking out of the cooling apparatus 600*b*. An outer surface 6190*b* of the pumping unit 6900*b* includes a recess at a periphery thereof. In addition to the recess at the periphery thereof, the outer surface 6190*b* of the pumping unit 6900*b* includes a recess surrounding the first opening 6621*b* and a recess surrounding the third passage 6112*b*. Sealing elements 6650*b* include a heat sink sealing element 6651*b*, and in addition, include a first sealing element 6652*b* and the third sealing element 6653*b*. The sealing elements 6650*b* are disposed between the pumping unit 6900*b* and the heat exchange unit 6600*b* in the respective recesses to limit fluid that flows within the heat exchange unit 6600*b* from leaking out of the cooling apparatus 600*b*. The first sealing element 6652*b* and third sealing element 6653*b* are sized, shaped and configured to encompass the first opening 6621*b* and third opening 6622*b* therein, respectively.

When assembled, and during operation, cooler fluid from an external heat dissipating device enters the inlet cavity S11 of the pumping unit 6900*b* via the inlet 6121*b*. Inside the inlet cavity S11, the cooler fluid enters the third cavity S3 via the cover plate opening 6311*b* and contacts the plurality of blades 6712*b* of the rotor portion 6700*b*. The cooler fluid flows to the transition flow path 6312*b* and then enters the heat exchange chamber 6515*b* via the first passage 6111*b*. The cooler fluid then enters the heat exchange chamber 6515*b* via the first opening 6621*b* and second opening 6510*b*, and contacts the plurality of fins 6612*b*. After the heat from the base plate 6610*b* and the plurality of fins 6612*b* is transferred to the cooler fluid and the temperature of the cooler fluid increases, the heated fluid from the plurality of fins 6612*b*, then flows through the fourth cavity S4, and enters the outlet cavity S12 of the pumping unit 6900*b* via the third opening 6622*b* and third passage 6112*b*. The heated fluid then exits the pumping unit 6900*b* via the outlet 6122*b*. The heated fluid flows to the external heat dissipating device that cools the fluid using a cooling device, such as a radiator and/or one or more fans. The cooler fluid is then provided to the inlet 6121*b* for recirculation into the heat exchange unit 6600*b*.

Figure 15:
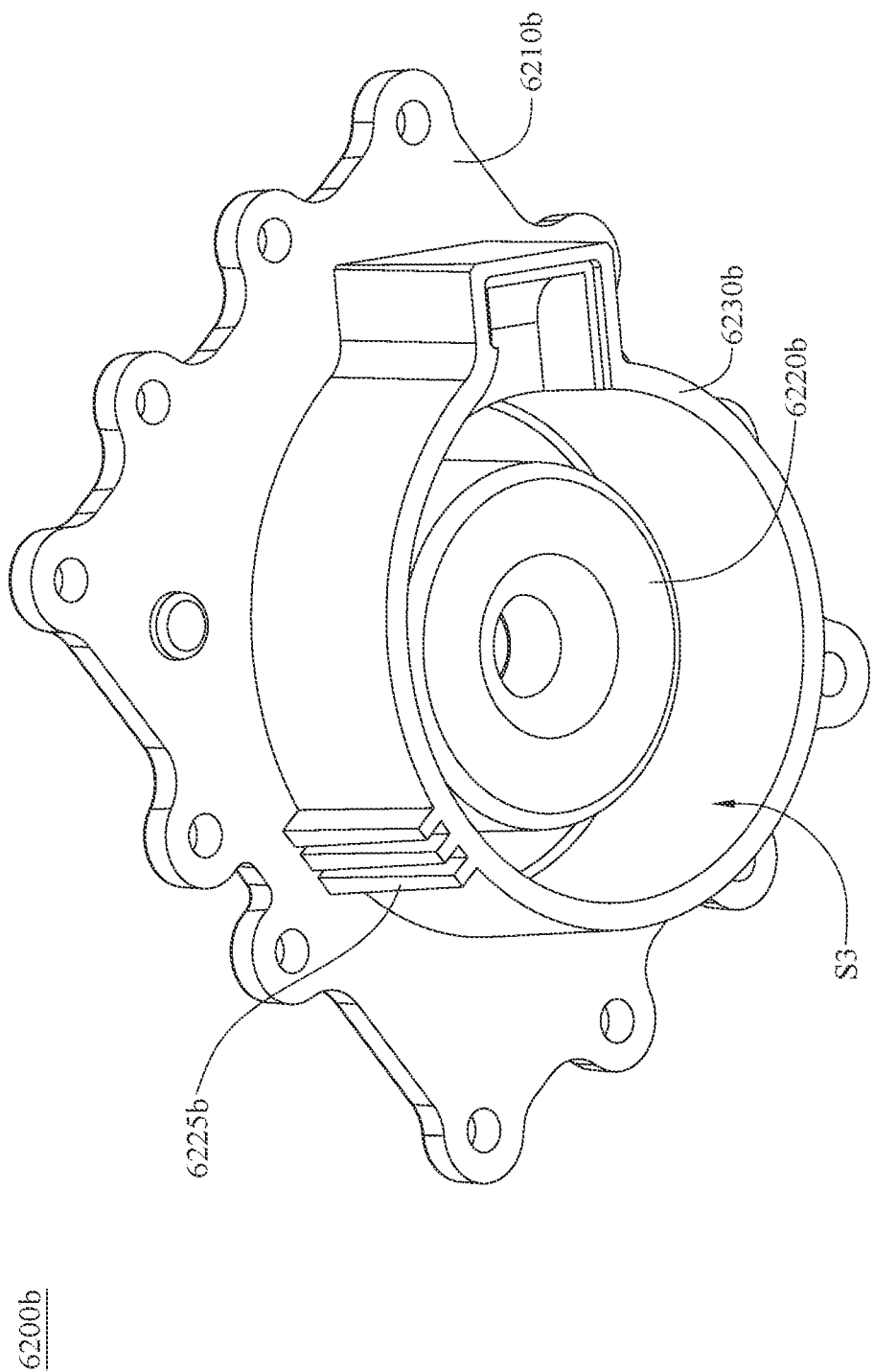
FIG. 15 is a perspective view of the body of the cooling apparatus of FIG. 14A, according to disclosed embodiments.

FIG. 15 is a perspective view illustrating the body 6200*b* of the cooling apparatus 600*b*, according to embodiments of the disclosure. Referring to FIG. 15, as illustrated, the body 6200*b* includes the pump cover assembly 6210*b*, stator receiving portion 6220*b*, and rotor receiving portion 6230*b*. The rotor receiving portion 6230*b* of the body 6200*b* includes a partition structure 6225*b*. The stator receiving portion 6220b is sized, shaped or otherwise configured to receive the stator portion 6750b therein. The pump cover assembly 6210b is generally flat or planar for the motor control circuit 6800b to be disposed thereon and electrically coupled to the stator portion 6750b. The rotor receiving portion 6230b is sized, shaped or otherwise configured to receive the rotor portion 6700b therein and the cover plate body 6310b thereon, defining the third cavity S3. When installed, the cover plate body 6310b may function similar to a cover that encloses the third cavity S3 of the pumping unit 6900b.

FIG. 16 is a cross-sectional view illustrating the rotor portion 6700b of the cooling apparatus 600b, according to embodiments of the disclosure. Referring to FIG. 16, as illustrated, the rotor portion 6700b includes a plurality of blades 6712b, imparting motion to the fluid in the cooling apparatus 600b, rotating around the axis of rotation AR. The plurality of blades 6712b extend from the flat circular surface of the rotor portion 6700b and have an arcuate shape. During operation, the cooler fluid enters the third cavity S3 of the rotor portion 6700b from the inlet cavity S11 via the cover plate opening 6311b and contacts the plurality of blades 6712b of the rotor portion 6700b. The cooler fluid flows into the transition flow path 6312b and then enters the heat exchange unit 6600b via the first passage 6111b.

Figure 17:
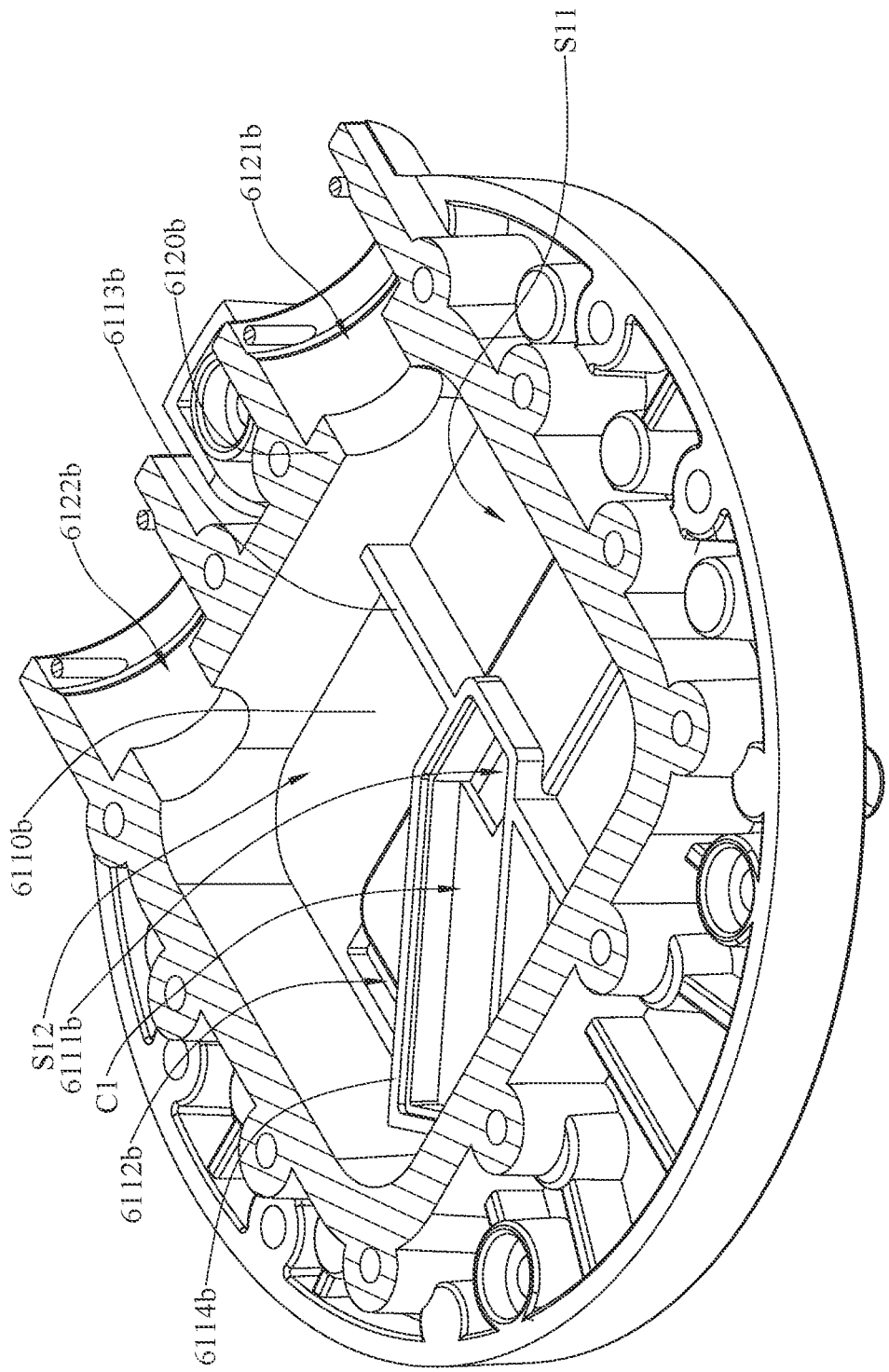
FIG. 17 is a cross-sectional view of the bottom surface of the cooling apparatus of FIG. 14A, according to disclosed embodiments.

FIG. 17 is a cross-sectional view illustrating the bottom surface 6110b of the cooling apparatus 600b, according to embodiments of the disclosure. Referring to FIG. 17, as illustrated, the bottom surface 6110b includes a partition wall 6113b. The partition wall 6113b extends transversely on the bottom surface 6110b along the length (or width) of the bottom surface 6110b. The inner side walls 6120b of the pumping unit 6900b do not include inner sidewall protrusions 6125b, and the rotor receiving portion 6230b includes a partition structure 6225b. As illustrated, the bottom surface 6110b includes a channel periphery wall 6114b surrounding and extending from the first passage 6111b to the opening of the transition flow path 6312b, at least partially defining the inlet cavity S11 on one side of the partition wall 6113b and the outlet cavity S12 on an opposite side of the partition wall 6113b. The partition wall 6113b is positioned in a central portion on the bottom surface 6110b, on an end of the channel periphery wall 6114b. The partition structure 6225b also, at least partially, defines the inlet cavity S11 on one side thereof and the outlet cavity S12 on an opposite side thereof when the body 6200b is installed in the housing 6100b. When installed, the body 6200b operates similar to a cover that encloses the inlet cavity S11, outlet cavity S12, and transition flow path 6312b of the pumping unit 6900b, thereby defining the inlet cavity S11, outlet cavity S12, and transition flow path 6312b and forming gaps SG therein for directed flow of fluid.

Figure 18A:
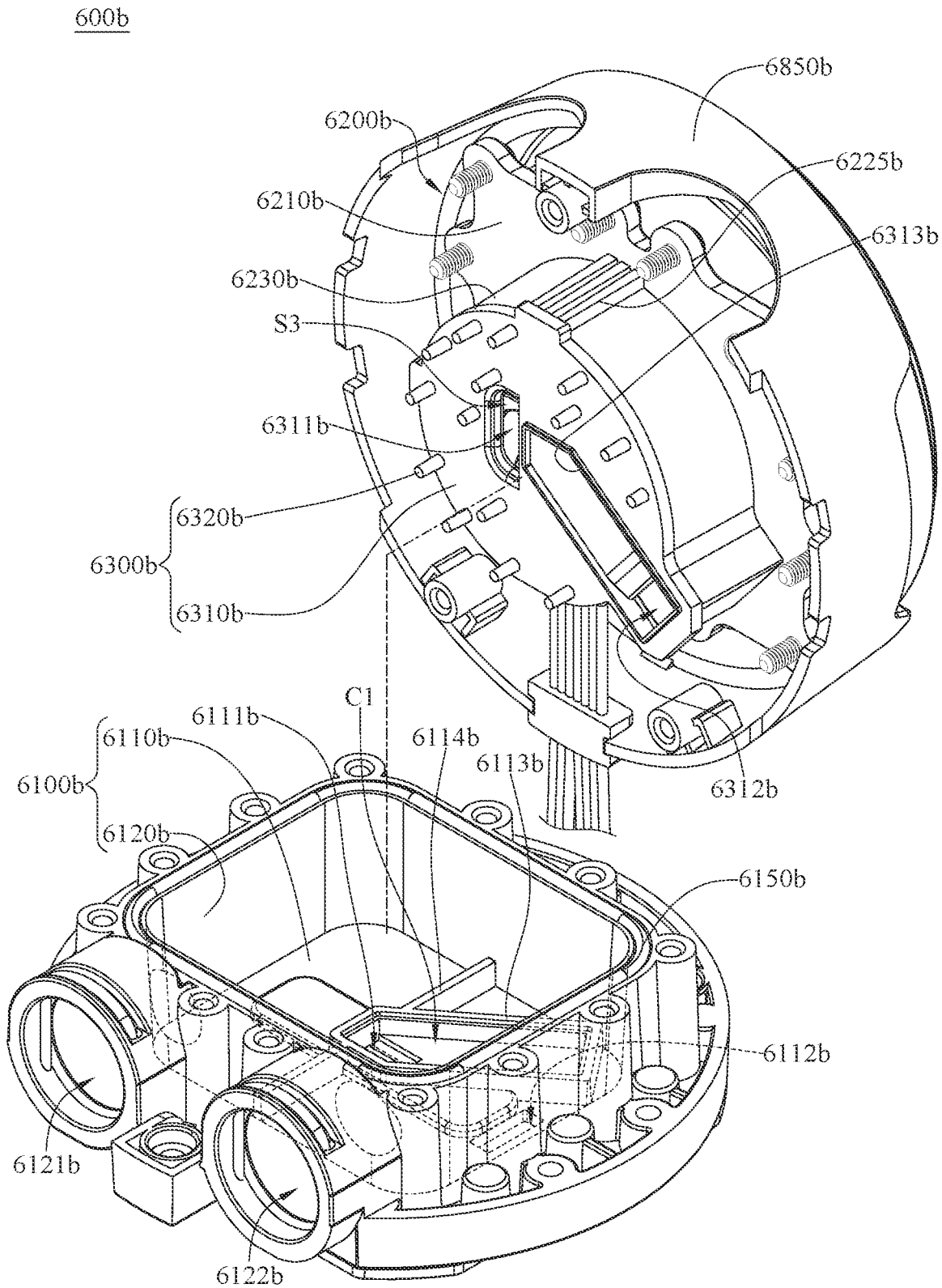
FIGS. 18A and 18B are different perspective views of the cooling apparatus of FIG. 14A in a disassembled state.

FIG. 18A is a perspective view of the cooling apparatus 600b, according to other embodiments of the disclosure. Referring to FIG. 18A, as illustrated, the casing 6850b receives the pumping unit 6900b therein. The casing 6850b is positioned on the pumping unit 6900b and at least partially encloses the pumping unit 6900b. The pumping unit 6900b includes an inlet 6121b via which fluid enters the pumping unit 6900b and an outlet 6122b via which the fluid exits the pumping unit 6900b. The casing 6850b contains installation holes and the pumping unit 6900b includes installation holes corresponding to the installation holes of the casing 6850b. The pumping unit 6900b installation holes receive fasteners, such as rivets, screws, nuts, bolts, etc. to secure the casing 6850b positioned on the pumping unit 6900b. Additionally or alternatively, other fastening techniques, such as riveting, screwing, press-fitting, and the like, are used to secure the casing 6850b to the pumping unit 6900b. The periphery of the pump cover assembly 6210b contains installation holes and the periphery of the inner side walls 6120b of the housing 600b includes installation holes corresponding to the installation holes of the pump cover assembly 6210b. The pump cover assembly 6210b installation holes receives fasteners, such as rivets, screws, nuts, bolts, etc. to secure the pump cover assembly 6210b disposed on housing 6100b. Additionally or alternatively, other fastening techniques, such as riveting, screwing, press-fitting, and the like, are used to secure the pump cover assembly 6210b to the housing 6100b. The pump cover assembly 6210b and the periphery surface of the inner side walls 6120b are also coupled to each other via a sealing element 6150b (e.g., a gasket, an O-ring, a washer, and the like) disposed between the pump cover assembly 6210b and the periphery surface of the inner side walls 6120b to limit fluid that flows within the pumping unit 6900b from leaking out of the cooling apparatus 600b. The sealing element 6150b is disposed in a recess defined in the periphery surface 6190b of the inner side walls 6120b.

The cover plate body 6310b includes a plurality of columns or pillars 6320b extending from the cover plate body 6310b. The rotor cover plate 6300b does not include installation holes and the bottom surface 6110b of the housing 6100b does not include installation columns. The plurality of columns 6320b support the body 6200b by contacting a bottom surface 6110b of the housing 6100b when the body 6200b is installed in the housing 6100b. Also, as illustrated, the cover plate body 6310b includes a channel periphery protrusion 6315b surrounding and extending from an opening of the transition flow path 6312b and the bottom surface 6110b includes a channel periphery wall 6114b surrounding and extending from the first passage 6111b to the opening of the transition flow path 6312b. The channel periphery wall 6114b is sized, shaped, or configured to receive the channel periphery protrusion 6313b on a periphery ledge of the channel periphery wall 6114b, defining the transition flow path 6312b.

When installed, the body 6200b operates similar to a cover that encloses the inlet cavity S11 and the outlet cavity S12 of the pumping unit 6900b, defining the inlet cavity S11 and the outlet cavity S12 and forming gaps SG therein for directed flow of fluid. Also, the channel periphery protrusion 6313b of the cover plate body 6310b operates similar to a cover that encloses the transition flow path 6312b of the pumping unit 6900b via the channel periphery wall 6114b of the bottom surface 6110b, forming the transition flow path 6312b therein for directing flow of fluid. When assembled, the cooler fluid from the external heat dissipating device enters the inlet cavity S11 of the pumping unit 6900b via the inlet 6121b. Inside the inlet cavity S11, the cooler fluid enters the third cavity S3 via the cover plate opening 6311b and contacts the plurality of blades 6712b of the rotor portion 6700b. The cooler fluid may flow to the transition flow path 6312b and then enter the heat exchange unit 600b via the first passage 6111b.

Figure 18B:
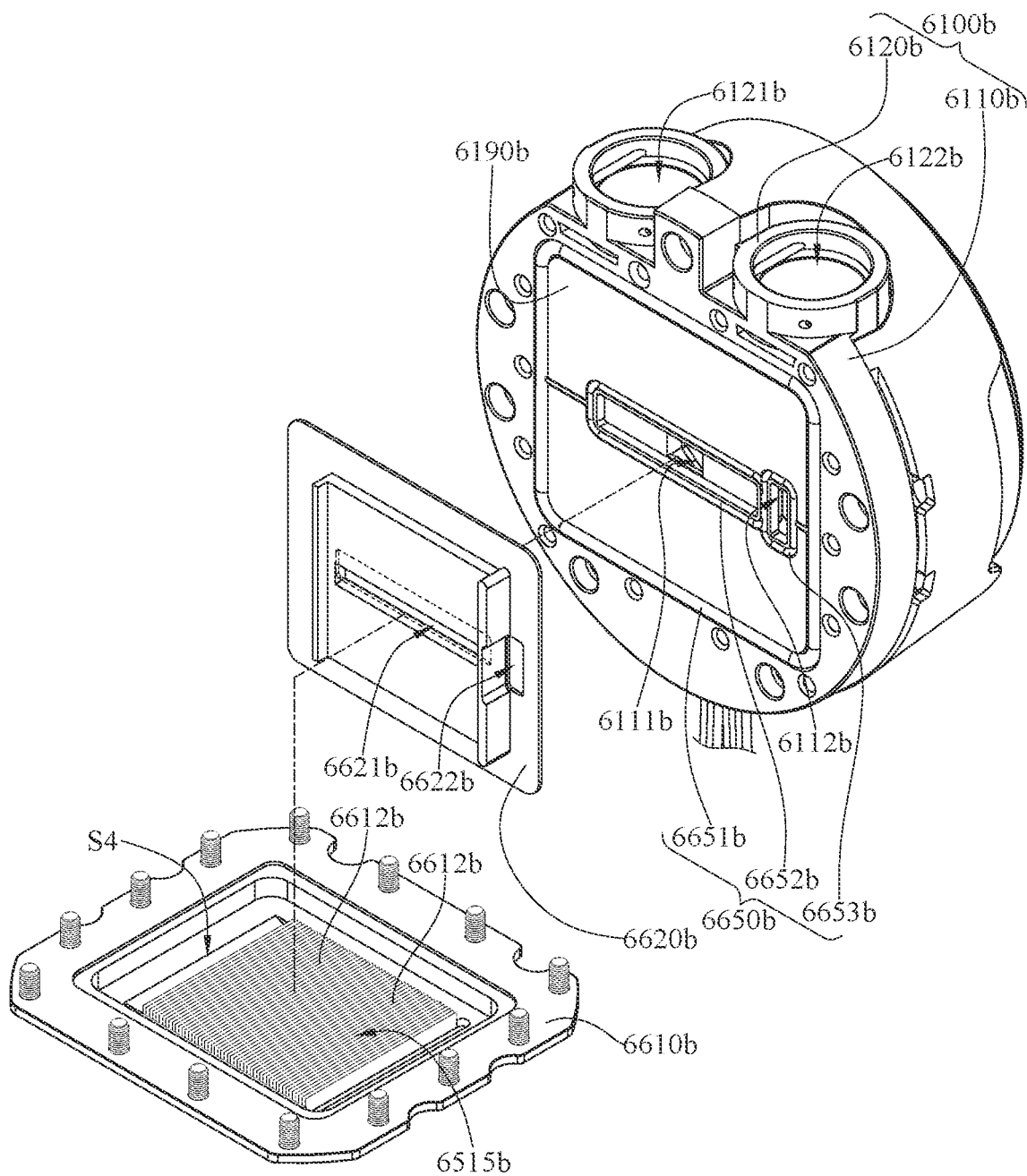

FIG. 18B is a perspective view of the cooling apparatus 600b. As illustrated, the pumping unit 6900b is disposed on the heat exchange unit 6600b. The top plate 6500b is coupled to the base plate 6610b, defining the heat exchange chamber 6515b, and the cover 6620b is disposed on the top plate 6500b and coupled to the indented periphery of the base plate 6610b, defining the fourth cavity S4. The cover 6620b is welded to the base plate 6610b to secure the cover 6620b and top plate 6500b to the base plate 6610b. The welding is not limited to any specific type of welding and the cover 6620b is welded to the base plate 6610b using any suitable type of welding, without departing from the scope of the disclosure. Other fastening techniques, such as adhesion, press-fitting, and the like, can also be used to secure the cover 6620b and top plate 6500b to the base plate 6610b. The cover 6620b and the top plate 6500b are individually formed or integrally formed.

The pumping unit 6900b contains installation holes and the heat exchange unit 6600b includes installation holes corresponding to the installation holes of the pumping unit 6900b. The heat exchange unit 600b installation holes receive fasteners, such as rivets, screws, nuts, bolts, etc. to secure the pumping unit 6900b disposed on the heat exchange unit 6600b. Additionally or alternatively, other fastening techniques, such as riveting, screwing, press-fitting, and the like, are used to secure the pumping unit 6900b to the heat exchange unit 6600b. The pumping unit 6900b and the heat exchange unit 6600b are also coupled to each other via sealing elements 6650b (e.g., gaskets, O-rings, washers, and the like) disposed between the pumping unit 6900b and the heat exchange unit 6600b to prevent fluid that flows between the pumping unit 6900b and the heat exchange unit 6600b from leaking out of the cooling apparatus 600b. The heat sink sealing element 6651b is disposed in a recess defined in the outer surface 6190b of the pumping unit 6900b. The heat sink sealing element 6651b, positioned in the recess defined in the periphery of the outer surface 6190b, is sized, shaped and otherwise configured to receive the cover 6620b. In addition to the heat sink sealing element 6651b, the sealing elements 6650b include the first sealing element 6652b surrounding the first passage 6111b, and the third sealing element 6653b surrounding the first passage 6111b. The first sealing element 6652b and third sealing element 6653b are sized, shaped, and otherwise configured to encircle or encompass the first opening 6621b and third opening 6622b therein, respectively.

The top plate 6500b includes protruding walls extending from opposing peripheries of the top plate 6500b. Thus, in addition to the opposing side recesses collecting and/or guiding the fluid along the plurality of fins 6612b, the recesses receive the protruding walls of the top plate 6500b, supporting the top plate 6500b and cover 6600b by contacting a bottom surface of the recess when the top plate 6500b and cover 6600b are installed on the base plate 6610b. The third opening 6621b and third passage 6112b are positioned at an end of the first opening 6621b and second opening 6510b. When assembled, the cooler fluid from the third cavity S3 enters the heat exchange unit 6600b via the first passage 6111. The cooler fluid then enters the heat exchange chamber 6515b via the first opening 6621b and second opening 6510b, and contacts the plurality of fins 6612b. After the heat from the base plate 6610b and the plurality of fins 6612b is transferred to the cooler fluid and the temperature of the cooler fluid increases, the heated fluid from the plurality of fins 6612b, then flows through the fourth cavity S4, and then enters the outlet cavity S12 of the pumping unit 6900b via the third opening 6622b and third passage 6112b.

Figure 19:
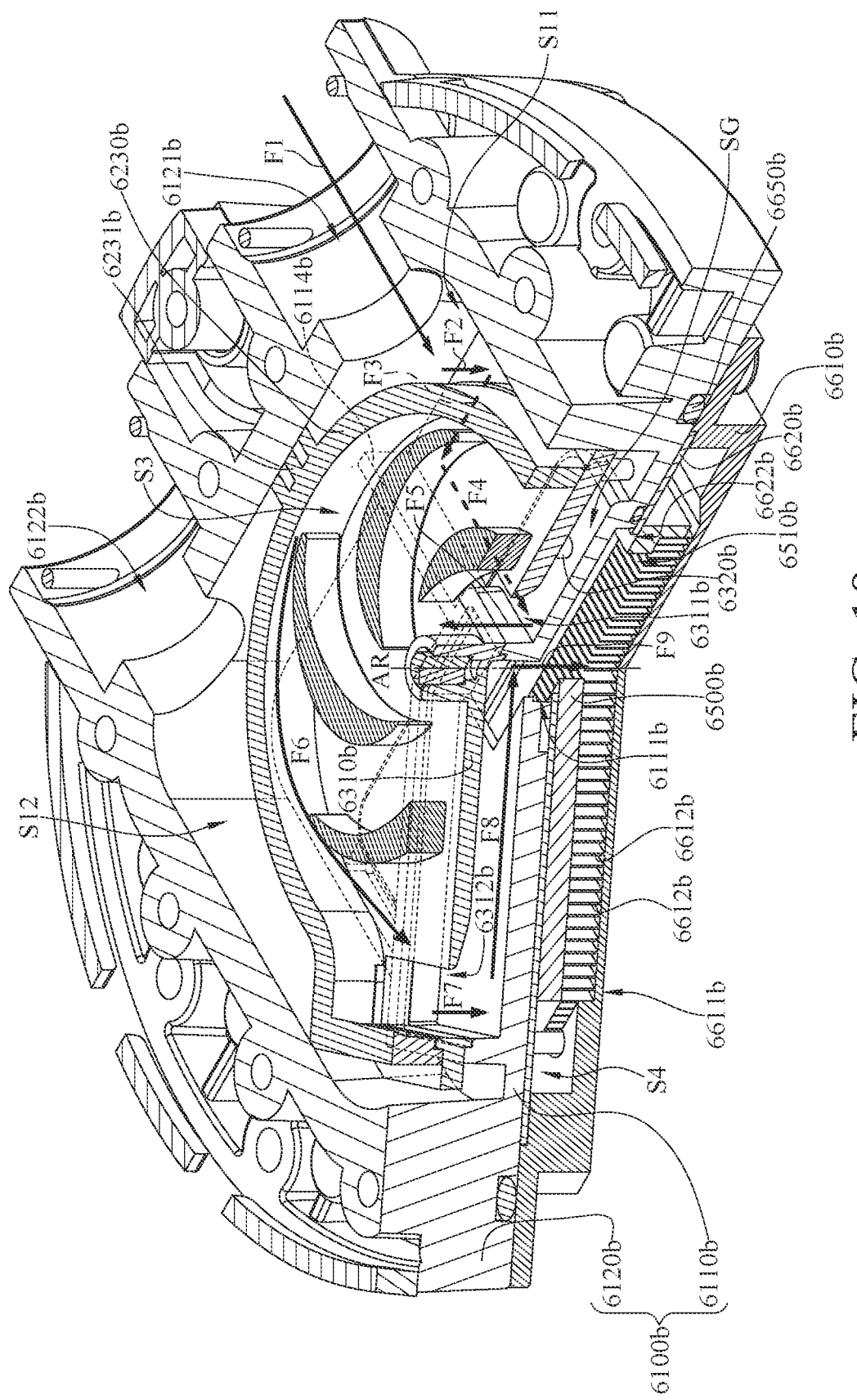
FIG. 19 illustrates a fluid flow in the cooling apparatus of FIG. 14A during operation thereof, according to disclosed embodiments.

FIG. 19 illustrates fluid flow in the cooling apparatus 10b during operation thereof, according to embodiments disclosed herein. As illustrated in FIG. 19, relatively cooler fluid from an external heat dissipating device enters the inlet cavity S11 of the pumping unit 6900b via the inlet 6121b, as indicated by the arrow F1. Inside the inlet cavity S11, the cooler fluid enters the third cavity S3 via the cover plate opening 6311b, as indicated by the arrows F2, F3, F4 and F5, and contacts the plurality of blades 6712b of the rotor portion 6700b, as indicated by the arrow F6. The first passage 6111b is adjacent or proximate to the axis of rotation AR of the pumping unit 6900b and is shorter in length than the first opening 6621 and second opening 6510.

Thus, the cooler fluid enters the transition flow path 6312b, as indicated by the arrow F7, and then flows through the transition flow path 6312b and to the first passage 6111b, as indicated by the arrow F8. The cooler fluid then enters the heat exchange unit 600b, as indicated by the arrow F9 via the first passage 6111b. An opening of the transition flow path 6312b is adjacent or proximate a side of the pumping unit 6900b and the first passage 6111b is spaced away from the opening proximate the axis of rotation AR.

Figure 20:
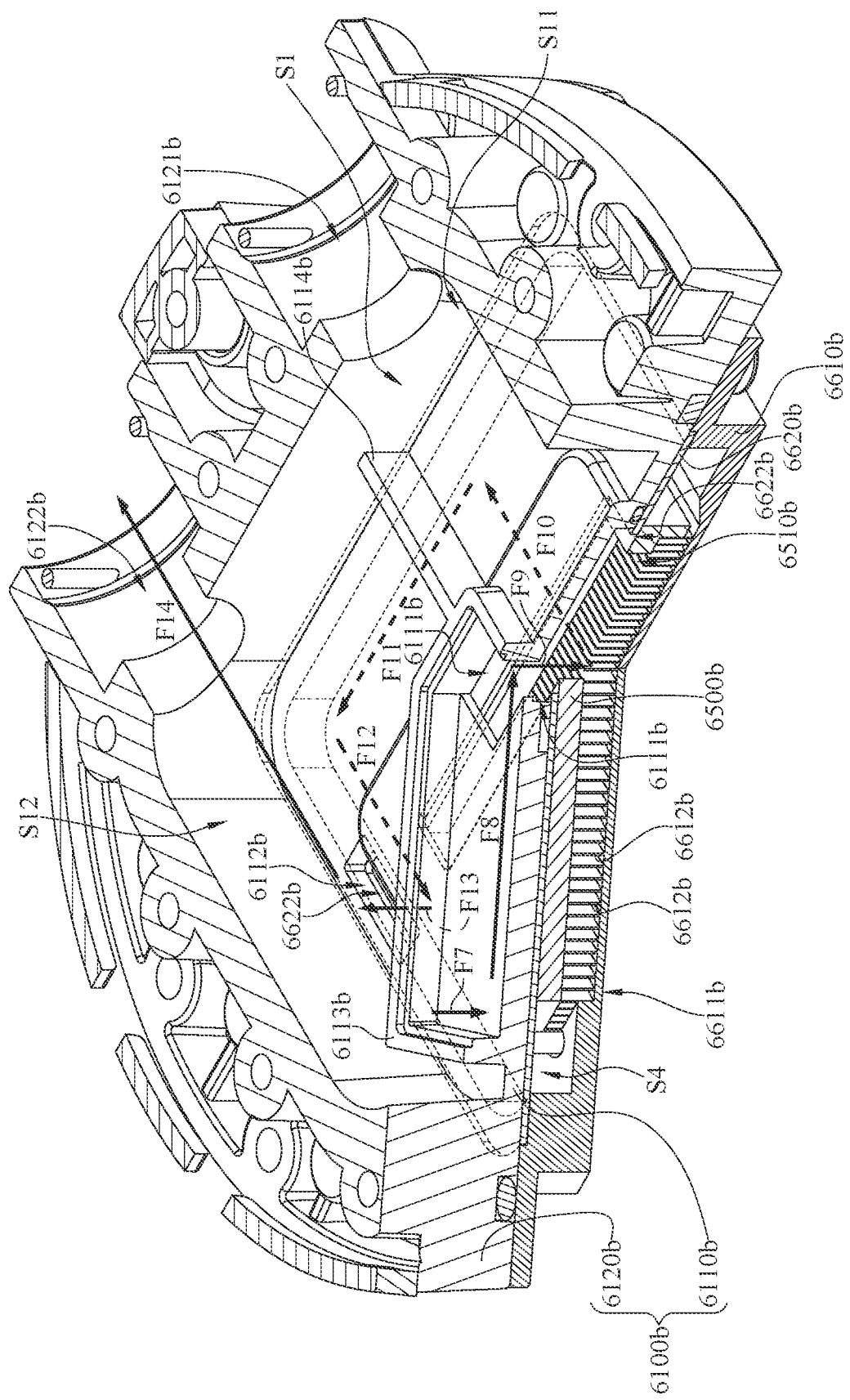
FIG. 20 illustrates a fluid flow in the cooling apparatus of FIG. 14A during operation thereof, according to disclosed embodiments.

FIG. 20 illustrates fluid flow in the cooling apparatus 10b during operation thereof, according to embodiments disclosed herein. As illustrated, the cooler fluid from the third cavity S3 enters the heat exchange unit 6600b via the transition flow path 6312b, as indicated by the arrow F8, and the first passage 6111b, and then enters the heat exchange chamber 6515b via the first opening 6621b and second opening 6510b, and contacts the plurality of fins 6612b, as indicated by the arrow F9. The cooler fluid initially flows centrally downward through the plurality of fins 6612b, spreading outwardly via the first opening 6621b and second opening 6510b, thereby more efficiently dissipating heat concentrated at or proximate a center of the heat exchange chamber 6115b. Inside the heat exchange unit 600b, heat from the base plate 6610b and the plurality of fins 6612b is transferred to the cooler fluid and the temperature of the cooler fluid increases. As indicated by arrow F10, heated fluid from the plurality of fins 6612b, then flows through the fourth cavity S4, as indicated by arrows F11 and F12, and then enters the outlet cavity S12 of the pumping unit 6900b via the third opening 6622b and third passage 6112b, as indicated by arrow F13. As indicated by arrow F14, the heated fluid exits the pumping unit 6900b via the outlet 6122b. The heated fluid then flows to the external heat dissipating device that cools the fluid using a cooling device, such as a radiator and/or one or more fans. The cooler fluid is then provided to the inlet 6121b for recirculation into the heat exchange unit 600b.

The first passage 6111b illustrated in FIG. 19 is located proximate the axis of rotation AR of the pumping unit 900b and is relatively shorter than the first opening 6621b and second opening 6510b. However, the first passage 111b is not limited to being located proximate the axis of rotation AR of the pumping unit 6900b, and can be located anywhere between the side of the pumping unit 6900b and axis of rotation AR, based on, for instance, the number, size, and/or application of heat generating sources attached to the surface 6611b of the base plate 6610b, without departing from the scope of the disclosure.

Figure 21:
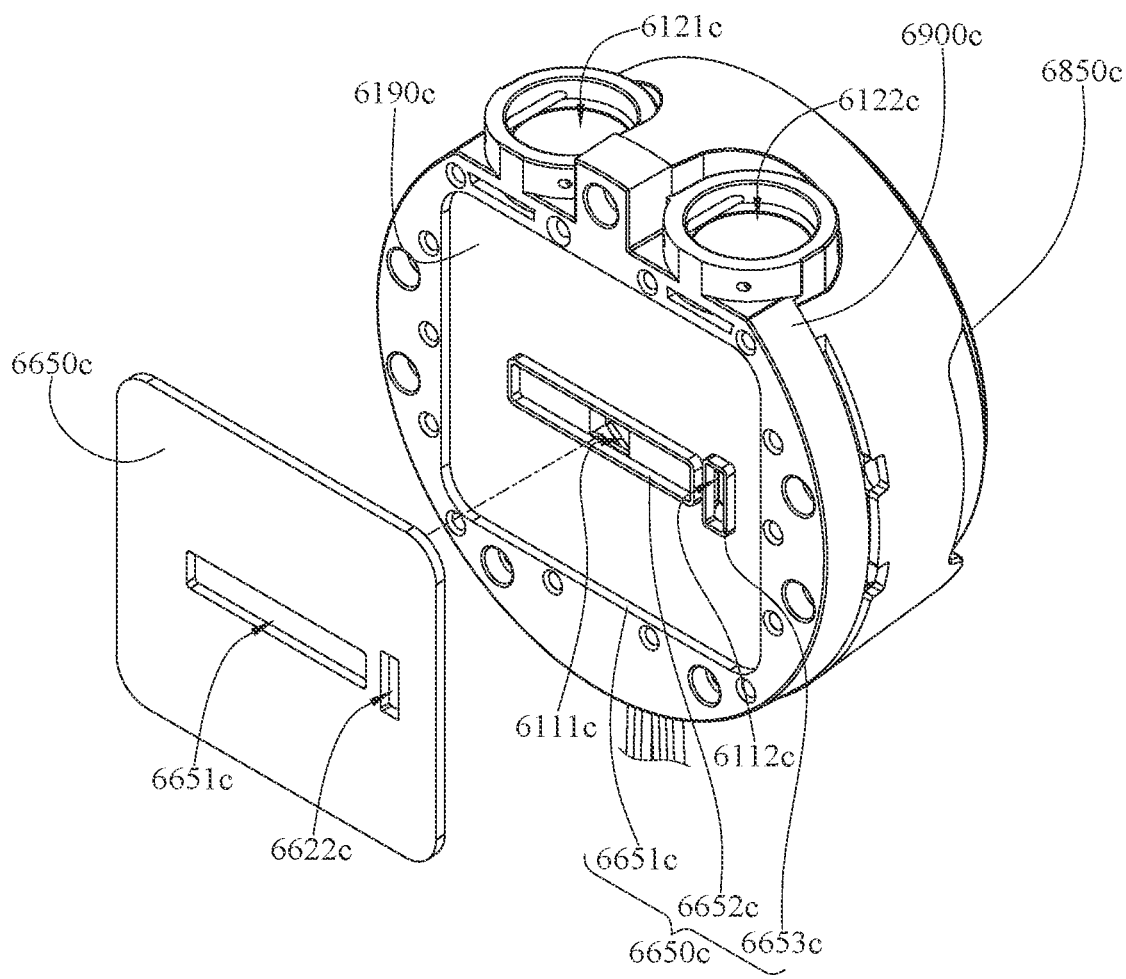
FIG. 21 is a perspective view of a housing of another cooling apparatus, according to disclosed embodiments.

FIG. 21 is a perspective view illustrating features of a housing 6100c of another cooling apparatus 600c, according to embodiments disclosed herein. The cooling apparatus 600c may be similar in some respects to the cooling apparatus 600b in FIGS. 14A and 14B, and therefore may be best understood with reference thereto where like numerals designate like components not described again in detail. For the sake of clarity of illustration, the heat exchange unit is not illustrated in FIG. 21. As illustrated, the cooling apparatus 600c includes a casing 6850c, a pumping unit 6900c, and a heat exchange unit. The casing 6850c is positioned on the pumping unit 6900c and the pumping unit 6900c is disposed on the heat exchange unit. The casing 6850c is sized, shaped or otherwise configured to receive the pumping unit 6900c therein. The casing 6850c is positioned on the pumping unit 6900c and at least partially encloses the pumping unit 6900c. The pumping unit 6900c includes an inlet 6121c via which fluid enters the pumping unit 6900c and an outlet 6122c via which the fluid exits the pumping unit 6900c.

In the illustrated embodiment, the heat sink sealing element 651b, first sealing element 652b, and third sealing element 653b (see FIG. 18B) may be omitted from the interface between the pumping unit 6900c and the heat exchange unit.

The outer surface 6190c of the pumping unit 6900c, as illustrated, includes an indented periphery 6651c, a first periphery surrounding wall 6652c, and a third periphery surrounding wall 6653c. The indented periphery 6651c, the first periphery surrounding wall 6652c, and the third periphery surrounding wall 6653c, are sized, shaped and configured to receive the seal 6650b therein. The thickness of the seal 6650b is similar to the thickness of the indention of the indention periphery 6651c and height of the first periphery surrounding wall 6652c and the third periphery surrounding wall 6653c to limit fluid that flows between the pumping unit 6900c and the heat exchange unit from leaking out of the cooling apparatus. The seal 6650b is a flat, plate-shaped structure and includes opening 6651b that is shaped and sized to receive first periphery surrounding wall 6652c and opening 6622b that is shaped and sized to receive third periphery surrounding wall 6653c.

The cooler fluid from the third cavity enters the heat exchange unit via the transition flow path, and the first passage, and then enters the heat exchange chamber via the first opening 6621c and second opening, and contact the plurality of fins. Then, heated fluid from the plurality of fins, then flows through the fourth cavity, and then enters the outlet cavity of the pumping unit 6900c via the third opening 6622c.

The embodiments of the cooling apparatus provide efficient and easy reassembly of the pumping units to different heat exchange units (e.g. different shapes or sizes) via the first passage and third passage of the pumping units being sized and configured to liquid-tight fit with the second opening and third opening of the heat exchange units, respectively. Fluid that flows between the pumping units and the heat exchange units is limited from leaking out of the cooling apparatus following reassembly. Also, the embodiments of the cooling apparatus provide a less complex pumping unit with fewer assembly parts via the inlet cavity, transition flow path, and outlet cavity of the housings.

Therefore, embodiments disclosed herein are well adapted to attain the ends and advantages mentioned as well as those that are inherent therein. The particular embodiments disclosed above are illustrative only, as the embodiments disclosed may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

What is claimed is:

1. A cooling apparatus, comprising:
    a base plate configured to dissipate heat;
    a top plate coupled to the base plate, the top plate includes a second opening positioned above a heat exchange chamber;
    a cover coupled to the base plate, the cover and the base plate defining the heat exchange chamber, the cover is over the second opening, the cover includes a first opening and a third opening defined adjacent to the first opening, the first opening and the third opening positioned above the heat exchange chamber, the first opening in fluid communication with the heat exchange chamber through the second opening;
    a pumping unit disposed on the base plate, the pumping unit is over the first opening and the third opening, the pumping unit configured to circulate fluid into and out of the heat exchange chamber, wherein
        the pumping unit includes a housing and a motor control circuit, the motor control circuit is disposed on the housing, the motor control circuit controlling the cooling apparatus, the housing includes a bottom surface, the housing at least partially defining an inlet cavity and an outlet cavity separated from the inlet cavity,
        the bottom surface is substantially flat and the bottom surface includes a first passage and a third passage defined adjacent to the first passage, the first passage in fluid communication with the inlet cavity and the third passage in fluid communication with the outlet cavity, and
        the pumping unit is coupled to the heat exchange chamber such that the first passage is in fluid communication with the heat exchange chamber through the first opening and the second opening; and
    a casing positioned on the pumping unit, the casing at least partially enclosing the pumping unit.

2. The cooling apparatus of claim 1, wherein
    the pumping unit further includes a body and a rotor cover plate,
    the body includes a stator portion and a rotor portion, the rotor portion includes a plurality of blades disposed on a flat circular surface of the rotor portion,
    the rotor cover plate is substantially flat and is disposed on the body facing the rotor portion, the rotor cover plate includes a cover plate opening and a transition flow path, the cover plate opening in fluid communication with the inlet cavity and the transition flow path in fluid communication with the cover plate opening,
    the pumping unit is coupled to the heat exchange chamber such that the transition flow path is in fluid communication with the heat exchange chamber through the first passage, the first opening and the second opening.

3. The cooling apparatus of claim 1, wherein
the heat exchange chamber includes a plurality of fins,
the second opening includes a second elongated slot,
the first opening includes a first elongated slot and the third opening includes a third elongated notch parallel to the first elongated slot, the first elongated slot and the third elongated notch having different lengths, the first elongated slot and the second elongated slot having same lengths,
the top plate is coupled to the base plate such that the first elongated slot is perpendicular to the plurality of fins, and
the cover is coupled to the base plate such that the first elongated slot and the third elongated notch is perpendicular to the plurality of fins.

4. The cooling apparatus of claim 1, wherein
the motor control circuit is substantially flat and includes one or more light sources, the motor control circuit controlling the one or more light sources to turn on and off, and
light from the one or more light sources is emitted from the cooling apparatus through the cover.

5. The cooling apparatus of claim 4, wherein
the heat exchange chamber includes a plurality of fins,
the second opening includes a second elongated slot,
the first opening includes a first elongated slot and the third opening includes a third elongated slot perpendicular to the first elongated slot, the first elongated slot and the third elongated slot having different lengths, the first elongated slot and the second elongated slot having same lengths,
the top plate is coupled to the base plate such that the first elongated slot is perpendicular to the plurality of fins, and
the cover is coupled to the base plate such that the first elongated slot is perpendicular to the plurality of fins and the third elongated slot is parallel to the plurality of fins.

6. The cooling apparatus of claim 1, wherein the cooling apparatus further comprises an enlarged base plate, the base plate and enlarged base plate have different dimensions and are interchangeable.

7. The cooling apparatus of claim 2, wherein the body and the housing are coupled together by fasteners.

8. The cooling apparatus of claim 2, further comprising a sealing element disposed between the body and the housing.

9. The cooling apparatus of claim 1, wherein the pumping unit and the base plate are coupled together by fasteners.

10. The cooling apparatus of claim 1, further comprising a sealing element disposed between the pumping unit and the base plate, the sealing element surrounds the first passage, the first opening, the second opening, the third opening, and the third passage.

11. A method of operating a cooling apparatus, the method comprising:
receiving fluid into a pumping unit via a corresponding inlet of the pumping unit, the pumping unit being disposed on a cover coupled to a base plate, a top plate coupled to the base plate, and the base plate, and a casing being positioned on the pumping unit, the casing at least partially enclosing the pumping unit, wherein
the base plate,
the top plate is coupled to the base plate, and the top plate includes a second opening positioned above a heat exchange chamber,
the cover is coupled to the base plate, the cover and the base plate define the heat exchange chamber, the cover includes a first opening and a third opening defined adjacent to the first opening, the first opening and the third opening positioned above the heat exchange chamber,
the pumping unit is disposed on the base plate, the pumping unit is over the first opening and the third opening,
the pumping unit includes a housing and a motor control circuit, the motor control circuit is disposed on the housing, the motor control circuit controlling the cooling apparatus, the housing includes a bottom surface, the housing and the bottom surface at least partially defining an inlet cavity and an outlet cavity separated from the inlet cavity,
the bottom surface is substantially flat and includes a first passage and a third passage defined adjacent to the first passage, the first passage in fluid communication with the inlet cavity and the third passage in fluid communication with the outlet cavity, and
the pumping unit is coupled to the heat exchange chamber such that the first passage is in fluid communication with the first opening;
transferring the fluid into the heat exchange chamber via the first passage, the first opening and the second opening;
transferring the fluid into the pumping unit; and
outputting the fluid from the pumping unit via a corresponding outlet of the pumping unit.

12. The method of claim 11, wherein
the pumping unit further includes a rotor cover plate and a body,
the body includes a stator portion and a rotor portion, the rotor portion includes a plurality of blades disposed on a flat circular surface of the rotor portion,
the rotor cover plate is substantially flat and is disposed on the body facing the rotor portion, the rotor cover plate includes a cover plate opening and a transition flow path, the cover plate opening in fluid communication with the inlet cavity and the transition flow path in fluid communication with the cover plate opening,
the pumping unit is coupled to the heat exchange chamber such that the transition flow path is in fluid communication with the heat exchange chamber through the first passage, the first opening and the second opening.

13. The method of claim 11, wherein
the heat exchange chamber includes a plurality of fins,
the second opening includes a second elongated slot,
the first opening includes a first elongated slot and the third opening includes an elongated notch parallel to the first elongated slot, the first elongated slot and the elongated notch having different lengths, the first elongated slot and the second elongated slot having same lengths,
the top plate is coupled to the base plate such that the first elongated slot is perpendicular to the plurality of fins, and
the cover is coupled to the base plate such that the first elongated slot and the elongated notch is perpendicular to the plurality of fins.

14. The method of claim 11, wherein
the motor control circuit is substantially flat and includes one or more light sources, the motor control circuit controls the one or more light sources to turn on and off, and
light from the one or more light sources is emitted from the cooling apparatus through the cover.

15. The method of claim 14, wherein
the heat exchange chamber includes a plurality of fins,
the second opening includes a second elongated slot,
the first opening includes a first elongated slot and the third opening includes a third elongated slot perpendicular to the first elongated slot, the first elongated slot and the third elongated slot having different lengths, the first elongated slot and the second elongated slot having same lengths,
the top plate is coupled to the base plate such that the first elongated slot is perpendicular to the plurality of fins, and
the cover is coupled to the base plate such that the first elongated slot is perpendicular to the plurality of fins and the third elongated slot is parallel to the plurality of fins.

16. The method of claim 11, wherein the cooling apparatus further comprises an enlarged base plate, the base plate and enlarged base plate have different dimensions and are interchangeable.

17. The method of claim 12, wherein the body and the housing are coupled together by fasteners.

18. The method of claim 12, further comprising a sealing element disposed between the body and the housing.

19. The method of claim 11, wherein the pumping unit and the base plate are coupled together by fasteners.

20. The method of claim 11, further comprising a sealing element disposed between the pumping unit and the base plate, the sealing element surrounds the first passage, the first opening, the second opening, the third opening, and the third passage.

* * * * *

UNITED STATES PATENT AND TRADEMARK OFFICE
CERTIFICATE OF CORRECTION

| | | |
|---|---|---|
| PATENT NO. | : 12,099,385 B2 | Page 1 of 1 |
| APPLICATION NO. | : 17/728639 | |
| DATED | : September 24, 2024 | |
| INVENTOR(S) | : Shui Fa Tsai et al. | |

It is certified that error appears in the above-identified patent and that said Letters Patent is hereby corrected as shown below:

On the Title Page

Column 1, under item (63), insert item (30):
-- (30) Foreign Application Priority Data
May 12, 2021 (TW) ..................... 110117102 --

Signed and Sealed this
Twenty-sixth Day of August, 2025

Coke Morgan Stewart
*Acting Director of the United States Patent and Trademark Office*